US006420196B1

(12) United States Patent

Silverbrook

(10) Patent No.: US 6,420,196 B1

(45) Date of Patent: *Jul. 16, 2002

(54) METHOD OF FORMING AN INKJET PRINTHEAD USING PART OF ACTIVE CIRCUITRY LAYERS TO FORM SACRIFICIAL STRUCTURES

(75) Inventor: Kia Silverbrook, Balmain (AU)

(73) Assignee: Silverbrook Research Pty. Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 09/425,194

(22) Filed: Oct. 19, 1999

(30) Foreign Application Priority Data

Oct. 16, 1998 (AU) .................................................. 6535

(51) Int. Cl.$^{7}$ ................................................ H01L 21/00

(52) U.S. Cl. ............................... 438/21; 347/20; 347/1; 347/47

(58) Field of Search ................................ 438/21; 347/1, 347/20, 23, 26, 56, 9, 12, 32, 40, 47; 216/27

(56) References Cited

U.S. PATENT DOCUMENTS

| | | | | | |
|---|---|---|---|---|---|
| 5,733,433 | A | * | 3/1998 | Lee et al. | 205/665 |
| 5,790,151 | A | * | 8/1998 | Mills | 347/47 |
| 5,847,356 | A | * | 12/1998 | Santhanam | 219/121.64 |
| 6,041,600 | A | * | 3/2000 | Silverbrook | 60/528 |
| 6,044,646 | A | * | 4/2000 | Silverbrook | 60/528 |
| 6,067,797 | A | * | 5/2000 | Silverbrook | 60/528 |

* cited by examiner

*Primary Examiner*—John F. Niebling
*Assistant Examiner*—Christopher Lattin

(57) ABSTRACT

An inkjet printhead is formed on a substrate incorporating drive circuitry for the nozzles of the printhead formed by a CMOS process. One or more of the layers formed by the CMOS process are utilized as a sacrificial material layer in forming the actuators or paddles of the ink ejection nozzles formed by MEMS process.

6 Claims, 76 Drawing Sheets

N-Well mask

Implant N-Well

Active mask

Grow field oxide

Poly mask

Deposit poly n+ mask n+ implant p+ mask p+ implant

Contacts mask

Deposit ILD 1, etch contacts

Metal 1 mask

Deposit Metal 1

Via 1 mask

Deposit ILD 2. etch vias

Metal 2 mask

Deposit metal 2

Via 2 mask

Deposit ILD 3. etch vias

Metal 3 mask

Deposit metal 3

Via 3 / Passivation mask

Deposit passivation oxide & nitride, etch vias

Heater mask

Deposit heater TiN

Actuator / bend compensator mask

Deposit actuator glass and bend compensator TiN, etch together

Nozzle mask

Deposit sacrificial layer, etch nozzles

Chamber mask

Etch chambers in sacrificial layer

No mask

Form self-aligned nozzles using CMP

Back-etch inlet mask

Mount on wafer blank, back-etch inlets

No mask

Detach from wafer blank, etch sacrificial material

No mask

Package, fill with ink, test

A single pod, numbered by firing order

AEnable and BEnable during a Typical Print Cycle

METHOD OF FORMING AN INKJET PRINTHEAD USING PART OF ACTIVE CIRCUITRY LAYERS TO FORM SACRIFICIAL STRUCTURES

FIELD OF THE INVENTION

The present invention relates to the field of construction of micro-electro mechanical systems (MEMS) devices and in particular, to the construction of fluid ejection devices in inkjet printheads.

BACKGROUND OF THE INVENTION

MEMS devices having both mechanical and electrical operation are most often constructed through the utilization of semi-conductor fabrication techniques. Where a mechanical and electrical device is required, the electrical portions can be fabricated utilizing a standard semi-conductor process such as a CMOS (complimentary metal oxide) process or NMOS or BiCMOS process etc. Once the electrical portions are constructed, the mechanical device can then be constructed on top of the CMOS layer through the deposition of a number of layers including sacrificial layers which are utilized together to build up a structure with the sacrificial layer being subsequently etched away so as to release a device for micro-mechanical operation.

The utilization of semi-conductor fabrication techniques can be highly expensive and, where an extremely large number of MEMS devices are to be constructed, it is desirable to limit the expense of construction. The expense of construction is somewhat proportional to the number of independent processing steps which in turn, is often proportional to the number of "masking" steps utilized in the fabrication process. A masking step is the utilization of a mask so as to delineate an area on a wafer which is to receive specialized processing in contrast with surrounding areas. Ideally, the number of mask steps is minimized.

SUMMARY OF THE INVENTION

It is an object of the present invention to provide for the effective utilization of each masking layer in the construction of a micro-electro mechanical system such as an inkjet printhead or the like.

In accordance with a first aspect of the present invention, there is provided a method of forming an inkjet printhead on a substrate said method including:

forming electrical drive circuitry made up of one or more interleaved layers of conductive, semi-conductive and non-conductive materials on a first substrate for the control of said inkjet printhead;

forming on said substrate at least one nozzle chamber having an ink ejection aperture in one wall thereof;

forming a moveable ink ejection paddle within said nozzle chamber, so that the paddle is moveable under the control of an actuator for the ejection of ink out of said ink ejection aperture; and utilizing portions of at least one of said interleaved layers as sacrificial material in the formation of one or more of the group comprising said actuator and said ink ejection paddle.

The sacrificial material can comprise portions of a conductive layer of the electrical drive circuitry. The electrical drive circuitry can comprise a Complementary Metal Oxide (CMOS) process circuitry and the sacrificial material layer can comprise a CMOS metal layer.

The sacrificial material layer can be used when forming the actuator. The actuator can comprise a thermal actuator.

The actuator can be located externally with respect to the nozzle chamber and can be interconnected to the ink ejection paddle through an actuation interconnection aperture formed in a second wall of the nozzle chamber.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

The preferred embodiment is a 1600 dpi modular monolithic print head suitable for incorporation into a wide variety of page width printers and in print-on-demand camera systems. The print head is fabricated by means of Micro-Electro-Mechanical-Systems (MEMS) technology, which refers to mechanical systems built on the micron scale, usually using technologies developed for integrated circuit fabrication.

As more than 50,000 nozzles are required for a 1600 dpi A4 photographic quality page width printer, integration of the drive electronics on the same chip as the print head is essential to achieve low cost. Integration allows the number of external connections to the print head to be reduced from around 50,000 to around 100. To provide the drive electronics, the preferred embodiment integrates CMOS logic and drive transistors on the same wafer as the MEMS nozzles. MEMS has several major advantages over other manufacturing techniques:

- mechanical devices can be built with dimensions and accuracy on the micron scale;
- millions of mechanical devices can be made simultaneously, on the same silicon wafer; and
- the mechanical devices can incorporate electronics.

The term "IJ46 print head" is used herein to identify print heads made according to the preferred embodiment of this invention.

Operating Principle

The preferred embodiment relies on the utilization of a thermally actuated lever arm which is utilized for the ejection of ink. The nozzle chamber from which ink ejection occurs includes a thin nozzle rim around which a surface meniscus is formed. A nozzle rim is formed utilizing a self aligning deposition mechanism. The preferred embodiment also includes the advantageous feature of a flood prevention rim around the ink ejection nozzle.

Figure 1:
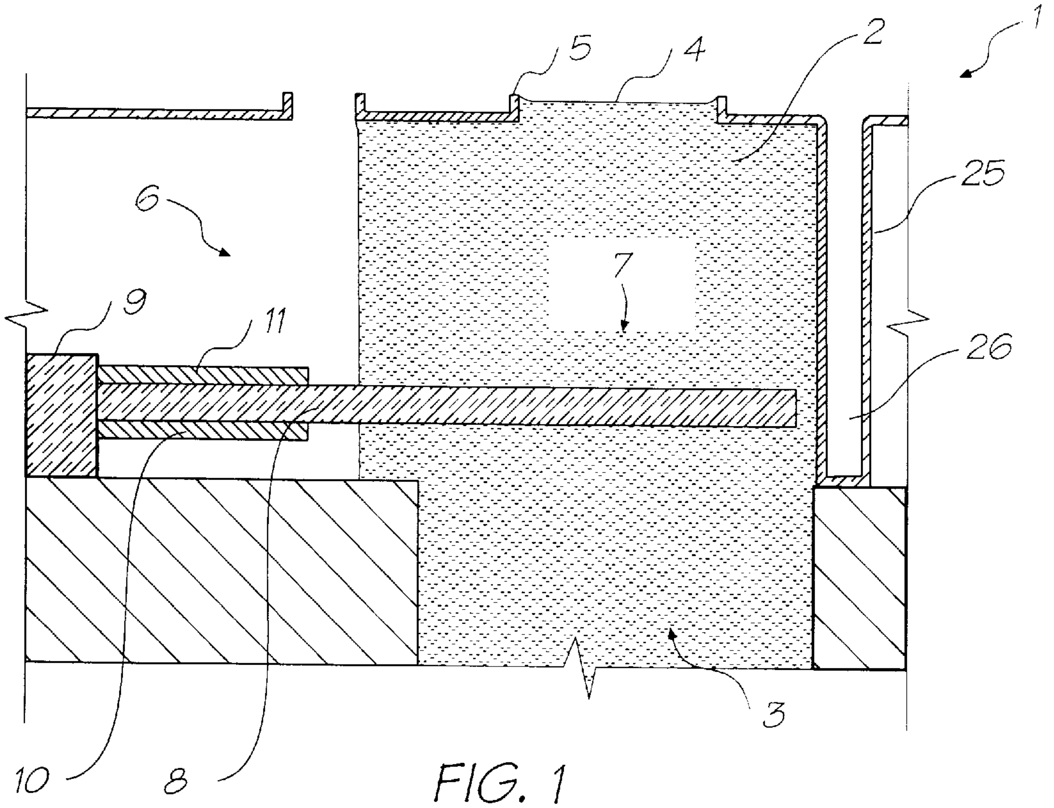
FIG. 1 illustrates schematically a single ink jet nozzle in a quiescent position.
Figure 2:
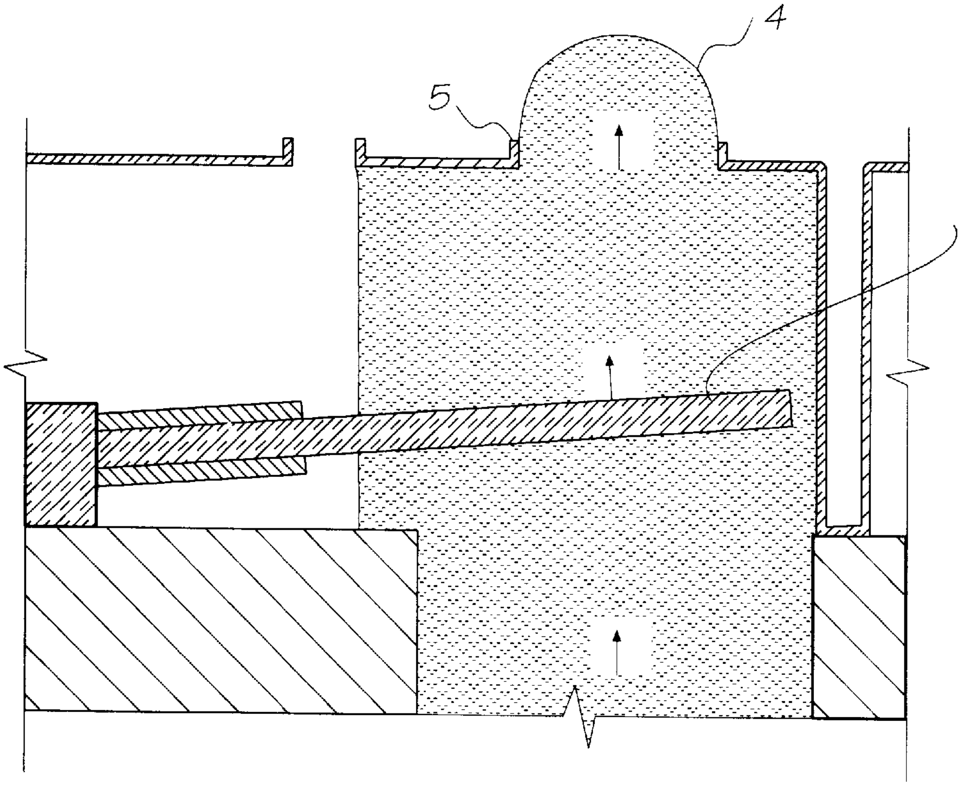
FIG. 2 illustrates schematically a single ink jet nozzle in a firing position.
Figure 3:
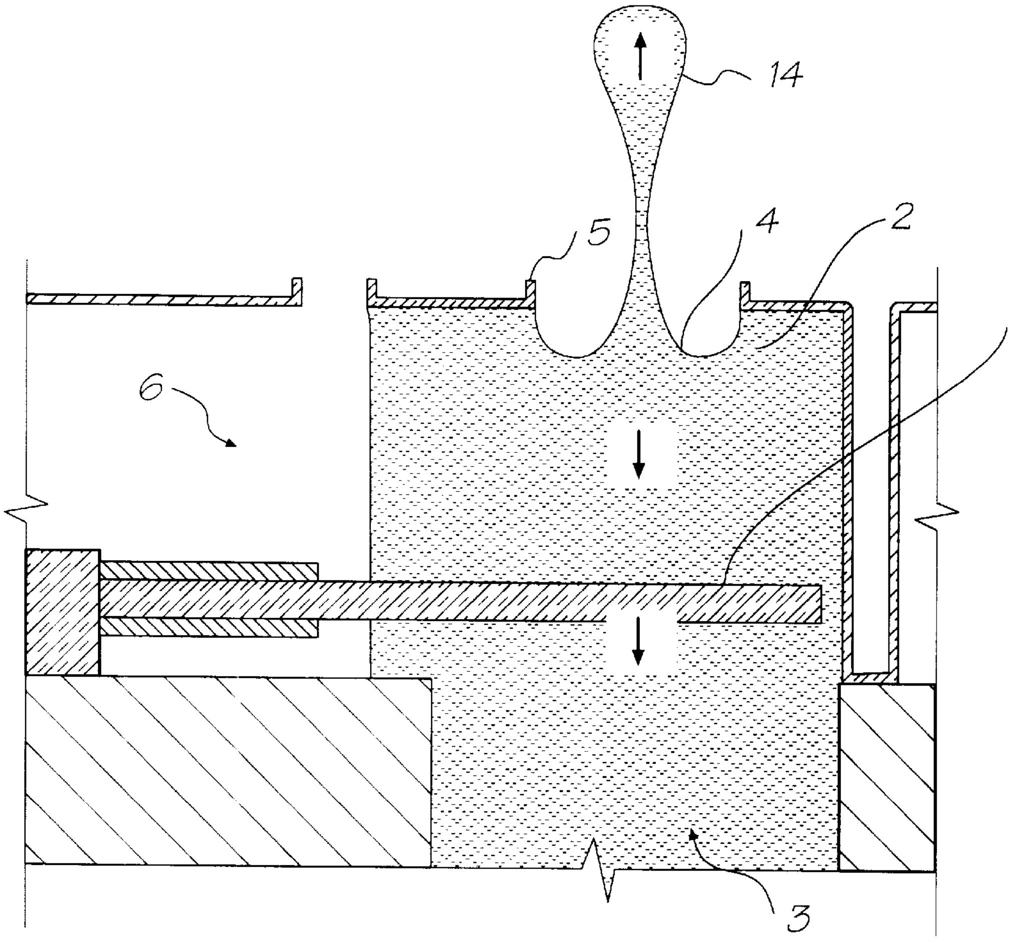
FIG. 3 illustrates schematically a single ink jet nozzle in a refilling position.

Turning initially to FIG. 1 to FIG. 3, there will be now initially explained the operation of principles of the ink jet print head of the preferred embodiment. In FIG. 1, there is illustrated a single nozzle arrangement 1 which includes a nozzle chamber 2 which is supplied via an ink supply channel 3 so as to form a meniscus 4 around a nozzle rim 5. A thermal actuator mechanism 6 is provided and includes an end paddle 7 which can be a circular form. The paddle 7 is attached to an actuator arm 8 which pivots at a post 9. The actuator arm 8 includes two layers 10, 11 which are formed from a conductive material having a high degree of stiffness, such as titanium nitride. A bottom layer 10 forms a conductive circuit interconnected to post 9 and further includes a thinned portion near the post 9. Hence, upon passing a current through the bottom layer 10, the bottom layer is heated in the area adjacent the post 9. Without the heating, the two layers 10, 11 are in thermal balance with one another. The heating of the bottom layer 10 causes the overall actuator mechanism 6 to bend generally upwards and hence the paddle 7 as indicated in FIG. 2 undergoes a rapid upward movement. The rapid upward movement results in an increase in pressure around the rim 5 which results in a general expansion of the meniscus 4 as ink flows outside the chamber. The conduction to the bottom layer 10 is then turned off and the actuator arm 6, as illustrated in FIG. 3 begins to return to its quiescent position. The return results in a movement of the paddle 7 in a downward direction. This in turn results in a general sucking back of the ink around the nozzle 5. The forward momentum of the ink outside the nozzle in addition to the backward momentum of the ink within the nozzle chamber results in a drop 14 being formed as a result of a necking and breaking of the meniscus 4. Subsequently, due to surface tension effects across the meniscus 4, ink is drawn into the nozzle chamber 2 from the ink supply channel 3.

Figure 4:
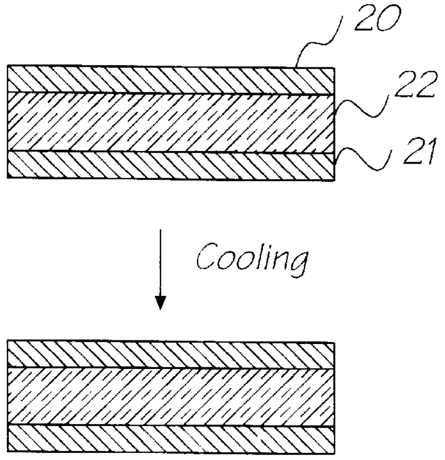
FIG. 4 illustrates a bi-layer cooling process.
Figure 5:
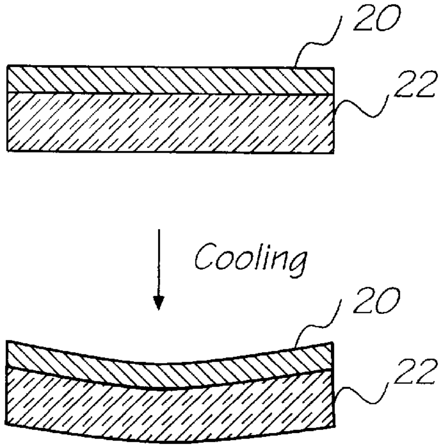
FIG. 5 illustrates a single-layer cooling process.

The operation of the preferred embodiment has a number of significant features. Firstly, there is the aforementioned balancing of the layers 10, 11. The utilization of a second layer 11 allows for more efficient thermal operation of the actuator device 6. Further, the two layer operation ensures thermal stresses are not a problem upon cooling during manufacture, thereby reducing the likelihood of peeling during fabrication. This is illustrated in FIG. 4 and FIG. 5. In FIG. 4, there is shown the process of cooling off a thermal actuator arm having two balanced material layers 20, 21 surrounding a central material layer 22. The cooling process affects each of the conductive layers 20, 21 equally resulting in a stable configuration. In FIG. 5, a thermal actuator arm having only one conductive layer 20 as shown. Upon cooling after manufacture, the upper layer 20 is going to bend with respect to the central layer 22. This is likely to cause problems due to the instability of the final arrangement and variations and thickness of various layers which will result in different degrees of bending.

Figure 11:
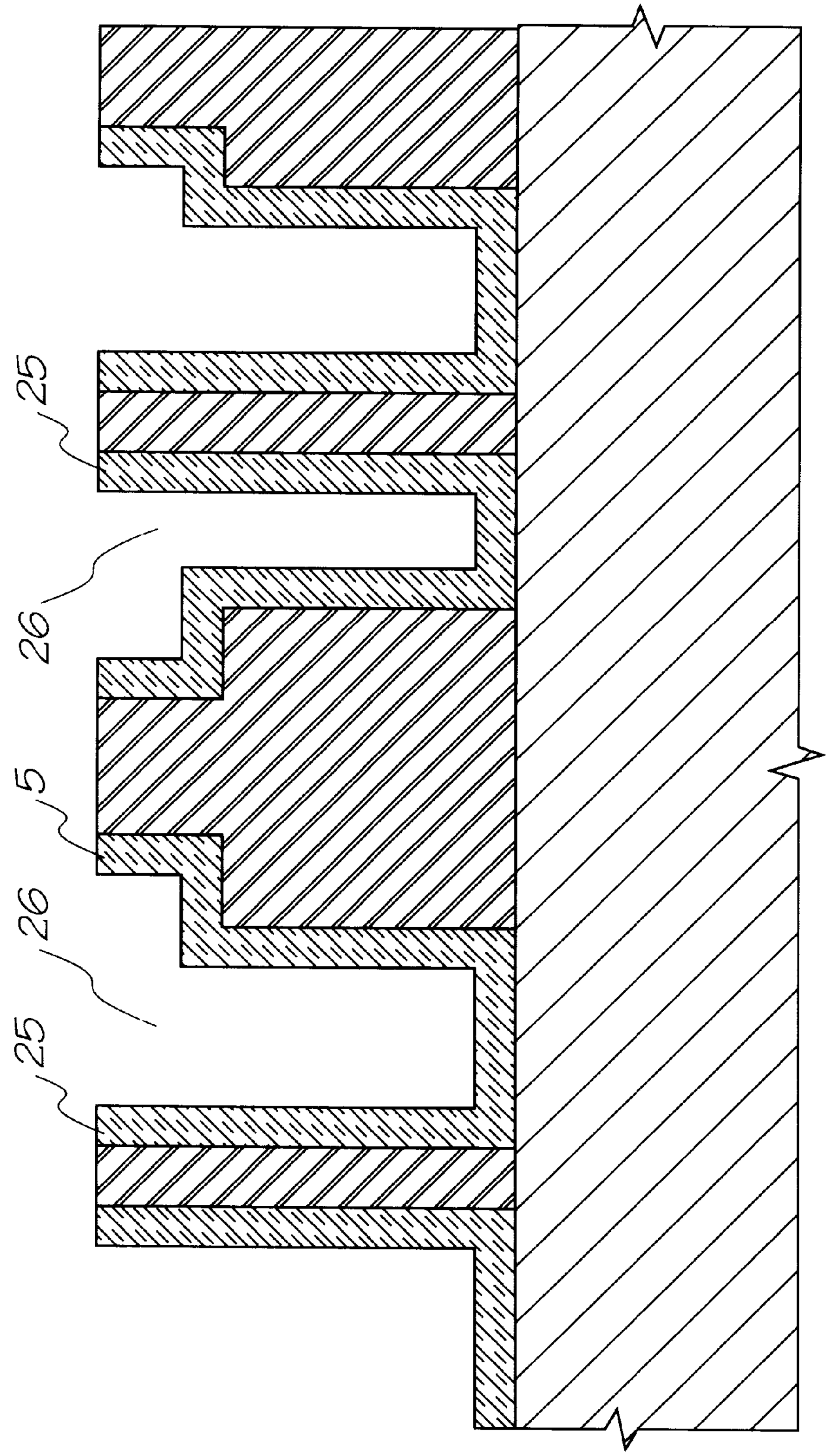
FIG. 11 is a sectional view of showing the process after Chemical Mechanical Planarization.

Further, the arrangement described with reference to FIGS. 1 to 3 includes an ink spreading prevention rim 25 (FIG. 1) which is constructed to define a pit 26 around the nozzle rim 5. Any ink which should flow outside of the nozzle rim 5 is generally caught within the pit 26 around the rim and thereby prevented from flowing across the surface of the ink jet print head and influencing operation. This arrangement can be clearly seen in FIG. 11.

Figure 6:
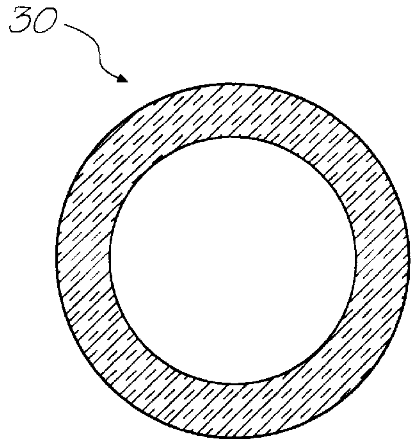
FIG. 6 is a top view of an aligned nozzle.
Figure 7:
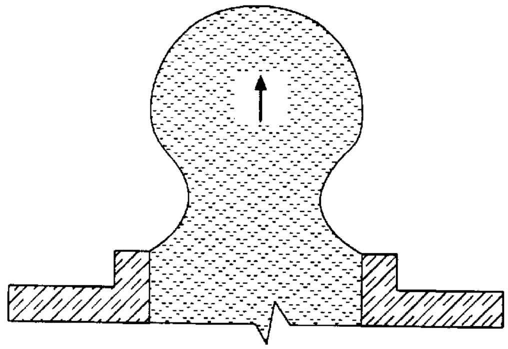
FIG. 7 is a sectional view of an aligned nozzle.
Figure 8:
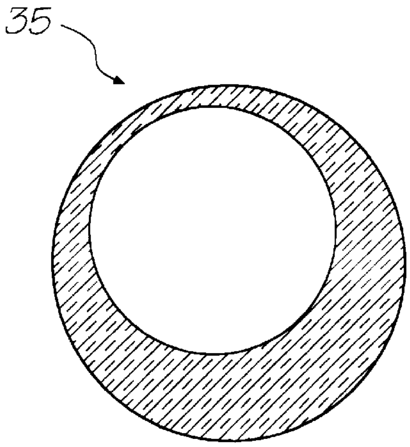
FIG. 8 is a top view of an unsymmetric nozzle.
Figure 9:
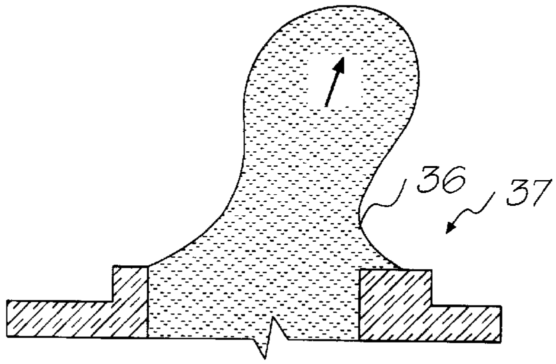
FIG. 9 is a sectional view of the unsymmetric aligned nozzle.

Further, the nozzle rim 5 and ink spread prevention rim 25 are formed via a unique chemical mechanical planarization technique. This arrangement can be understood by reference to FIG. 6 to FIG. 9. Ideally, an ink ejection nozzle rim is highly symmetrical in form as illustrated at 30 in FIG. 6. The utilization of a thin highly regular rim is desirable when it is time to eject ink. For example, in FIG. 7 there is illustrated a drop being ejected from a rim during the necking and breaking process. The necking and breaking process is a high sensitive one, complex chaotic forces being involved. Should standard lithography be utilized to form the nozzle rim, it is likely that the regularity or symmetry of the rim can only be guaranteed to within a certain degree of variation in accordance with the lithographic process utilized. This may result in a variation of the rim as illustrated at 35 in FIG. 8. The rim variation leads to a non-symmetrical rim 35 as illustrated in FIG. 8. This variation is likely to cause problems when forming a droplet. The problem is illustrated in FIG. 9 wherein the meniscus 36 creeps along the surface 37 where the rim is bulging to a greater width. This results in an ejected drop likely to have a higher variance in direction of ejection.

Figure 10:
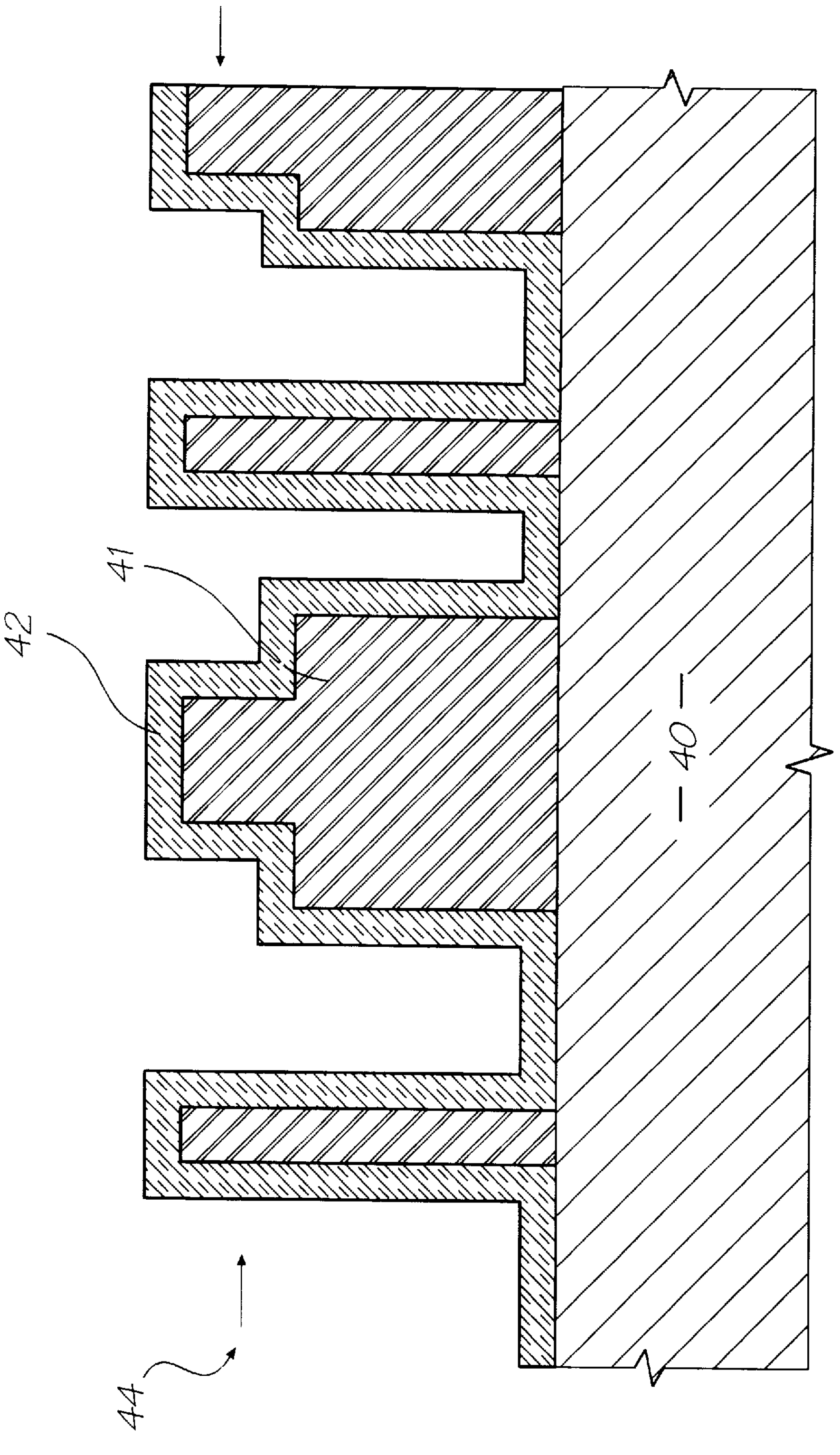
FIG. 10 is a sectional view showing an initial step in a process of constructing an ink jet nozzle.

In the preferred embodiment, to overcome this problem, a self aligning chemical mechanical planarization (CMP) technique is utilized. A simplified illustration of this technique will now be discussed with reference to FIG. 10. In FIG. 10, there is illustrated a silicon substrate 40 upon which is deposited a first sacrificial layer 41 and a thin nozzle layer 42 shown in exaggerated form. The sacrificial layer is first deposited and etched so as to form a "blank" for the nozzle layer 42 which is deposited over all surfaces conformally. In an alternative manufacturing process, a further sacrificial material layer can be deposited on top of the nozzle layer 42.

Next, the critical step is to chemically mechanically planarize the nozzle layer and sacrificial layers down to a first level eg. 44. The chemical mechanical planarization process acts to effectively "chop off" the top layers down to level 44. Through the utilization of conformal deposition, a regular rim is produced. The result, after chemical mechanical planarization, is illustrated schematically in FIG. 11.

The description of the preferred embodiments will now proceed by first describing an ink jet preheating step preferably utilized in the IJ 46 device.

Ink Preheating

Figure 12:
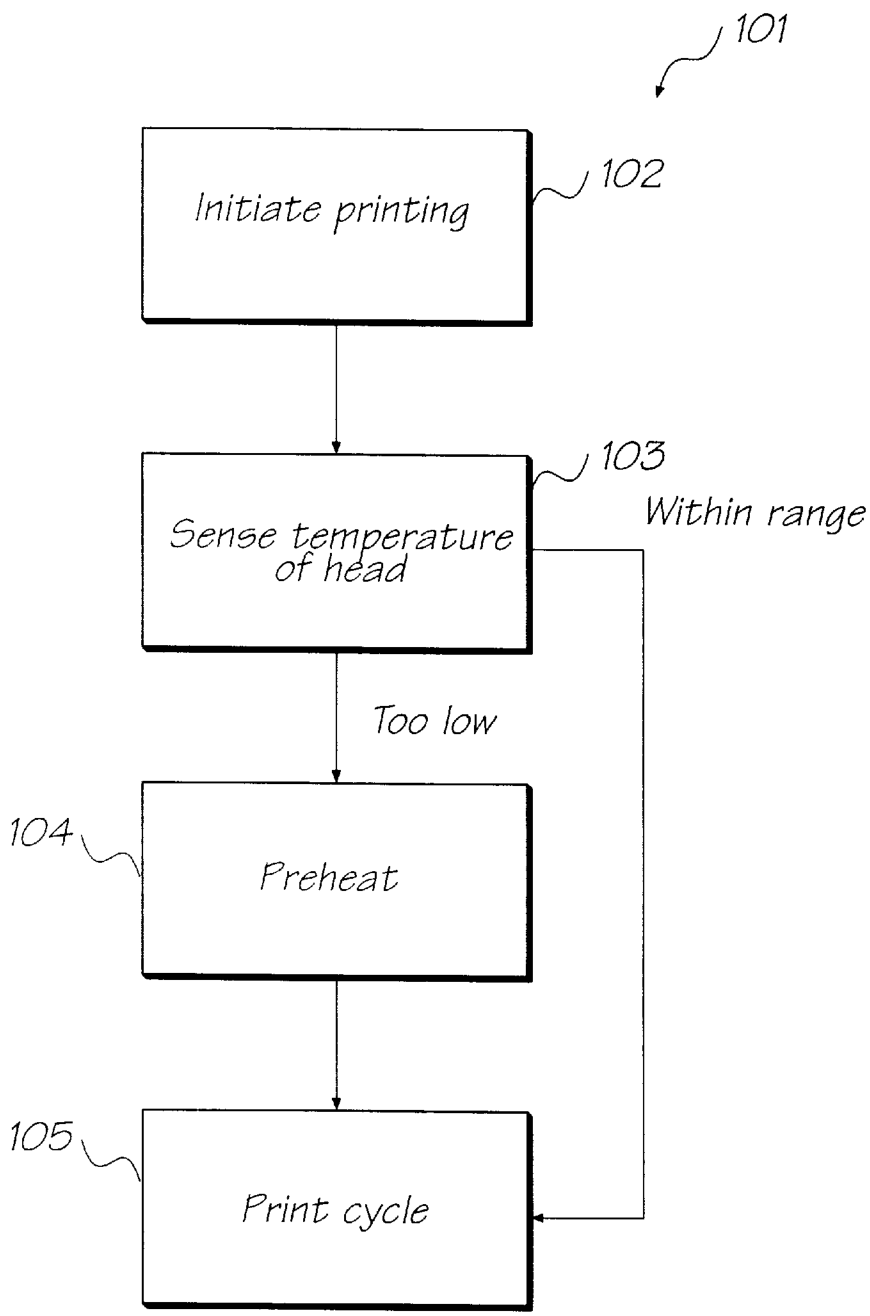
FIG. 12 illustrates the steps involved in the preferred embodiment in preheating the ink.

In the preferred embodiment, an ink preheating step is utilized so as to bring the temperature of the print head arrangement to be within a predetermined bound. The steps utilized are illustrated at 101 in FIG. 12. Initially, the decision to initiate a printing run is made at 102. Before any printing has begun, the current temperature of the print head is sensed to determine whether it is above a predetermined threshold. If the heated temperature is too low, a preheat cycle 104 is applied which heats the print head by means of heating the thermal actuators to be above a predetermined temperature of operation. Once the temperature has achieved a predetermined level, the normal print cycle 105 has begun.

The utilization of the preheating step 104 results in a general reduction in possible variation in factors such as viscosity etc. allowing for a narrower operating range of the device and, the utilization of lower thermal energies in ink ejection.

Figure 13:
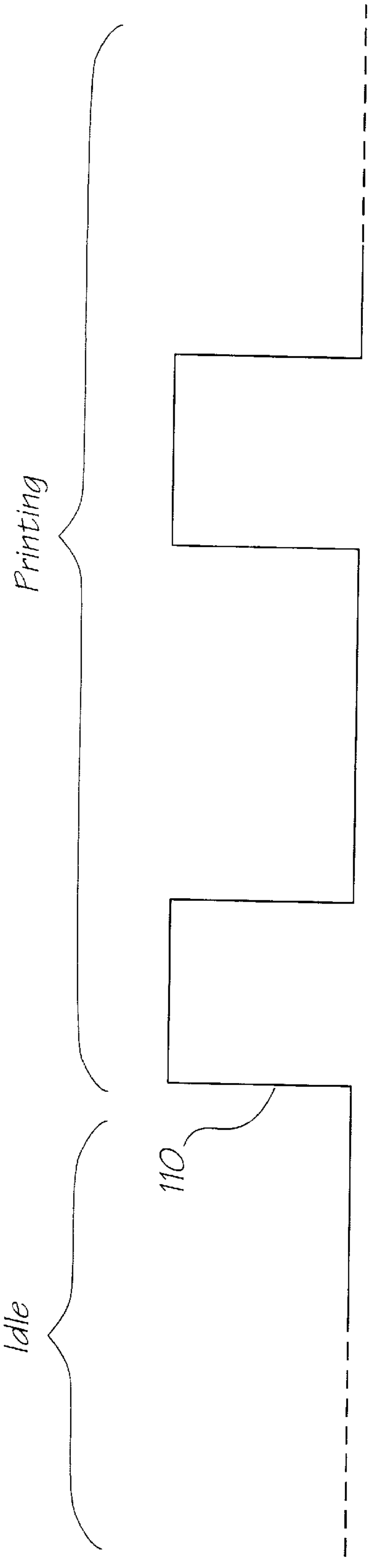
FIG. 13 illustrates a normal printing clocking cycle.

The preheating step can take a number of different forms. Where the ink ejection device is a thermal bend actuator type, it would normally receive a series of clock pulses as illustrated in FIG. 13 with the ejection of ink requiring clock pulses 110 of a predetermined thickness so as to provide enough energy for ejection.

Figure 14:
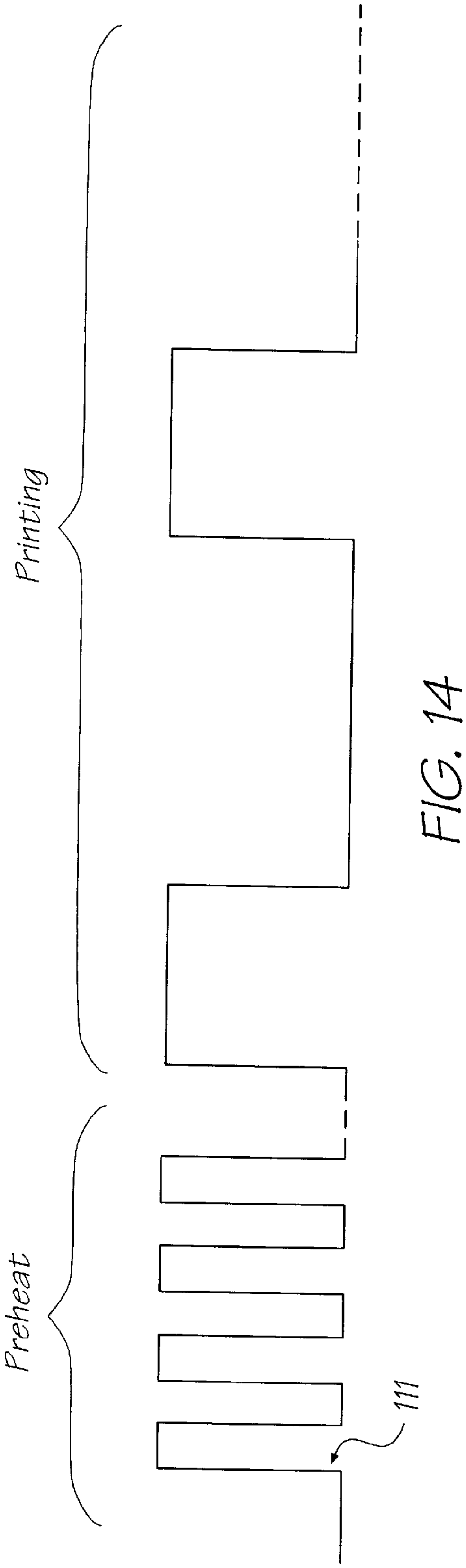
FIG. 14 illustrates the utilization of a preheating cycle before the normal cycle.

As illustrated in FIG. 14, when it is desired to provide for preheating capabilities, these can be provided through the utilization of a series of shorter pulses eg. 111 which whilst providing thermal energy to the print head, fail to cause ejection of the ink from the ink ejection nozzle.

Figure 15:
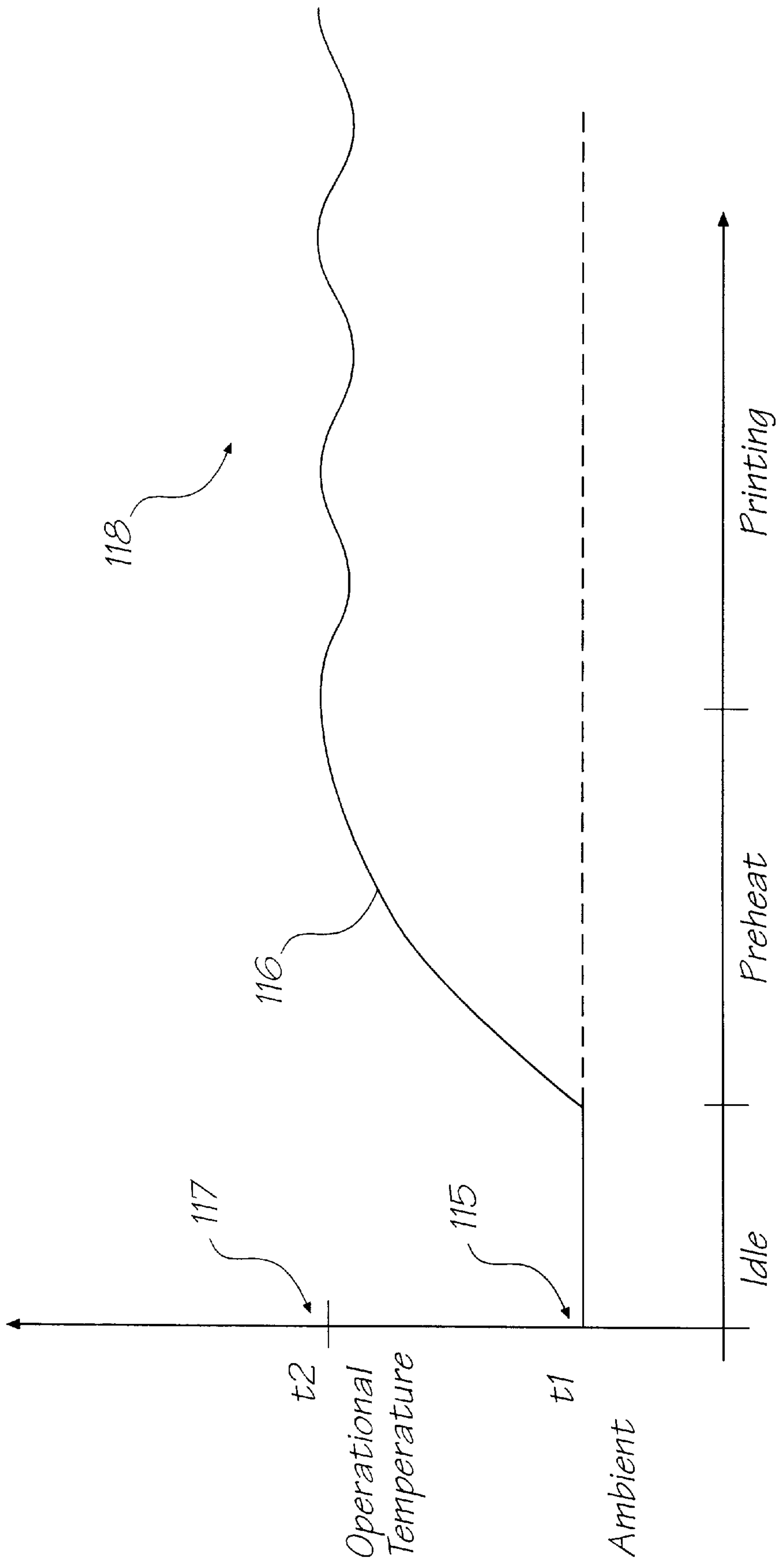
FIG. 15 illustrates a graph of likely print head operation temperature.

FIG. 15 illustrates an example graph of the print head temperature during a printing operation. Assuming the print head has been idle for a substantial period of time, the print head temperature, initially 115, will be the ambient temperature. When it is desired to print, a preheating step (104 of FIG. 12) is executed such that the temperature rises as shown at 116 to an operational temperature T2 at 117, at which point printing can begin and the temperature left to fluctuate in accordance with usage requirements.

Figure 16:
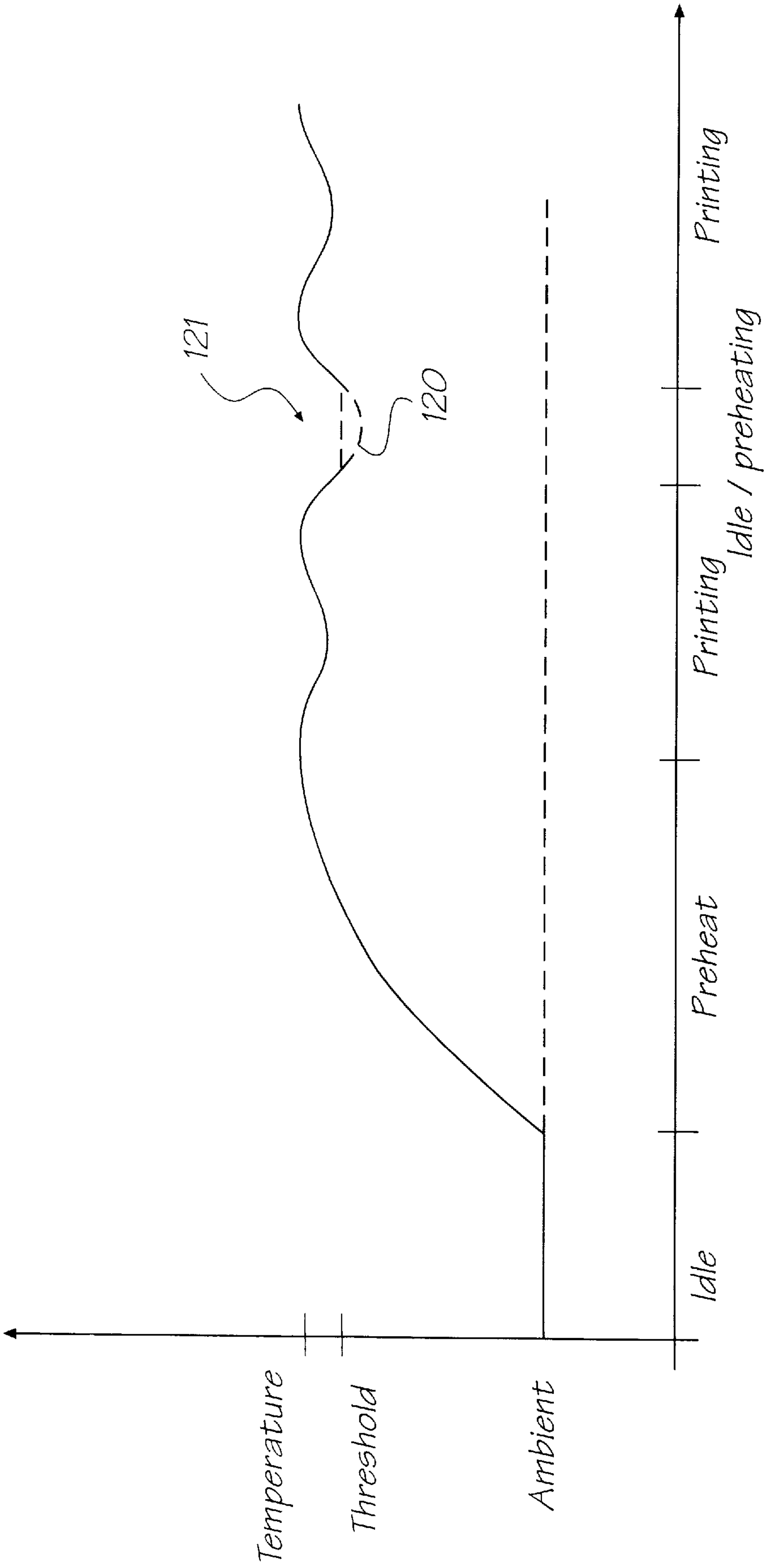
FIG. 16 illustrates a graph of likely print head operation temperature.

Alternately, as illustrated in FIG. 16, the print head temperature can be continuously monitored such that should the temperature fall below a threshold eg. 120, a series of preheating cycles are injected into the printing process so as to increase the temperature to 121, above a predetermined threshold.

Assuming the ink utilized has properties substantially similar to that of water, the utilization of the preheating step can take advantage of the substantial fluctuations in ink viscosity with temperature. Of course, other operational factors may be significant and the stabilisation to a narrower temperature range provides for advantageous effects. As the viscosity changes with changing temperature, it would be readily evident that the degree of preheating required above the ambient temperature will be dependant upon the ambient temperature and the equilibrium temperature of the print head during printing operations. Hence, the degree of preheating may be varied in accordance with the measured ambient temperature so as to provide for optimal results.

Figure 17:
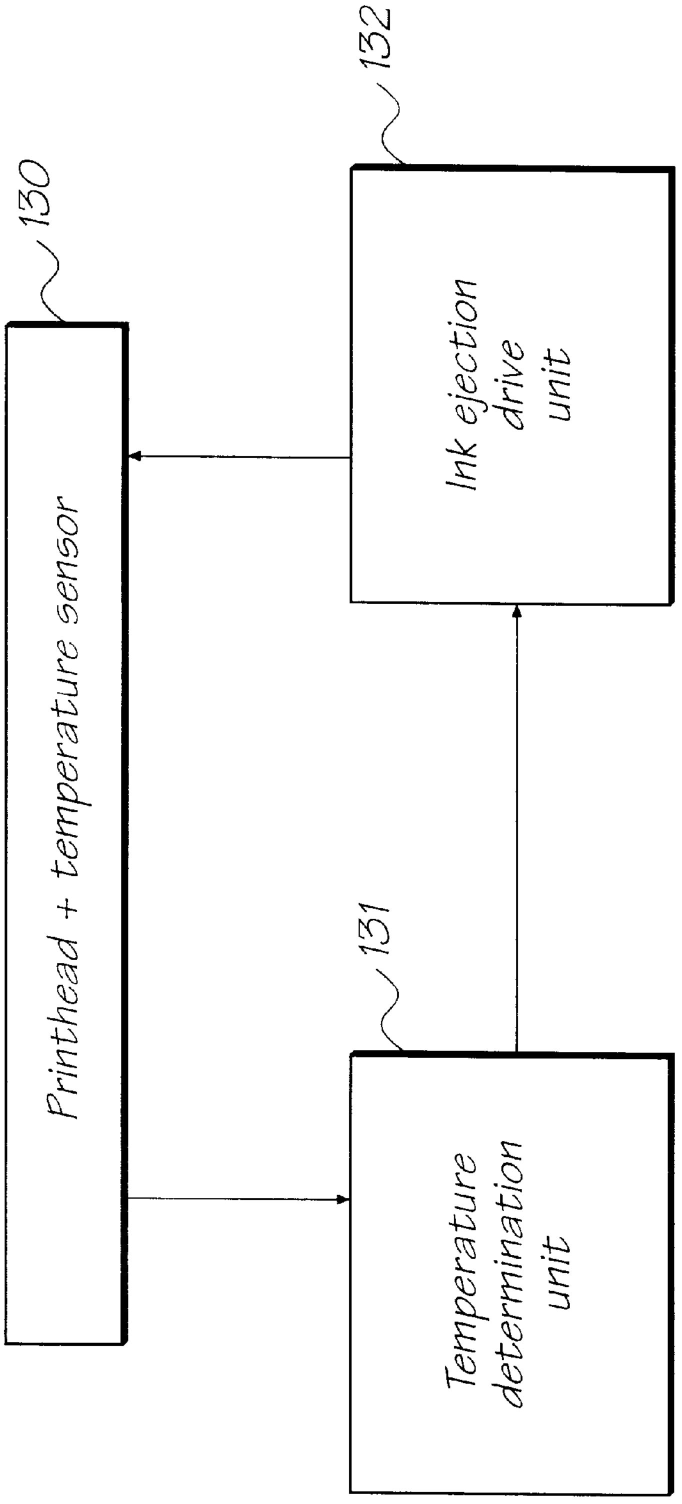
FIG. 17 illustrates one form of driving a print head for preheating

A simple operational schematic is illustrated in FIG. 17 with the print head 130 including an on-board series of temperature sensors which are connected to a temperature determination unit 131 for determining the current temperature which in turn outputs to an ink ejection drive unit 132 which determines whether preheating is required at any particular stage. The on-chip (print head) temperature sensors can be simple MEMS temperature sensors, the construction of which is well known to those skilled in the art.

Manufacturing Process

IJ46 device manufacture can be constructed from a combination of standard CMOS processing, and MEMS post-processing. Ideally, no materials should be used in the MEMS portion of the processing which are not already in common use for CMOS processing. In the preferred embodiment, the only MEMS materials are PECVD glass, sputtered TN, and a sacrificial material (which may be polyimide, PSG, BPSG, aluminum, or other materials). Ideally, to fit corresponding drive circuits between the nozzles without increasing chip area, the minimum process is a 0.5 micron, one poly, 3 metal CMOS process with aluminum metalization. However, any more advanced process can be used instead. Alternatively, NMOS, bipolar, BiCMOS, or other processes may be used. CMOS is recommended only due to its prevalence in the industry, and the availability of large amounts of CMOS fab capacity.

For a 100 mm photographic print head using the CMY process color model, the CMOS process implements a simple circuit consisting of 19,200 stages of shift register, 19,200 bits of transfer register, 19,200 enable gates, and 19,200 drive transistors. There are also some clock buffers and enable decoders. The clock speed of a photo print head is only 3.8 MHz, and a 30 ppm A4 print head is only 14 MHz, so the CMOS performance is not critical. The CMOS process is fully completed, including passivation and opening of bond pads before the MEMS processing begins. This allows the CMOS processing to be completed in a standard CMOS fab, with the MEMS processing being performed in a separate facility.

Reasons for Process Choices

It will be understood from those skilled in the art of manufacture of MEMS devices that there are many possible process sequences for the manufacture of an IJ46 print head. The process sequence described here is based on a 'generic' 0.5 micron (drawn) n-well CMOS process with 1 poly and three metal layers. This table outlines the reasons for some of the choices of this 'nominal' process, to make it easier to determine the effect of any alternative process choices.

| Nominal Process | Reason |
|---|---|
| CMOS | Wide availability |
| 0.5 micron or less | 0.5 micron is required to fit drive electronics under the actuators |
| 0.5 micron or more | Fully amortized fabs, low cost |
| N-well | Performance of n-channel is more important that p-channel transistors |
| 6" wafers | Minimum practical for 4" monolithic print heads |
| 1 polysilicon layer | 2 poly layers are not required, as there is little low current connectivity |
| 3 metal layers | To supply high currents, most of metal 3 also provides sacrificial structures |
| Aluminum metalization | Low cost, standard for 0.5 micron processes (copper may be more efficient |

| Mask # | Mask | Notes | Type | Pattern | Align to | CD |
|---|---|---|---|---|---|---|
| 1 | N-well | | CMOS 1 | Light | Flat | 4 μm |
| 2 | Active | Includes nozzle chamber | CMOS 2 | Dark | N-Well | 1 μm |
| 3 | Poly | | CMOS 3 | Dark | Active | 0.5 μm |
| 4 | N+ | | CMOS 4 | Dark | Poly | 4 μm |
| 5 | P+ | | CMOS 4 | Light | Poly | 4 μm |
| 6 | Contact | Includes nozzle chamber | CMOS 5 | Light | Poly | 0.5 μm |
| 7 | Metal 1 | | CMOS 6 | Dark | Contact | 0.6 μm |
| 8 | Via 1 | Includes nozzle chamber | CMOS 7 | Light | Metal 1 | 0.6 μm |
| 9 | Metal 2 | Includes sacrificial al. | CMOS 8 | Dark | Via 1 | 0.6 μm |
| 10 | Via 2 | Includes nozzle chamber | CMOS 9 | Light | Metal 2 | 0.6 μm |
| 11 | Metal 3 | Includes sacrificial al. | CMOS 10 | Dark | Poly | 1 μm |
| 12 | Via 3 | Overcoat, but 0.6 μm CD | CMOS 11 | Light | Poly | 0.6 μm |
| 13 | Heater | | MEMS 1 | Dark | Poly | 0.6 μm |
| 14 | Actuator | | MEMS 2 | Dark | Heater | 1 μm |
| 15 | Nozzle | For CMP control | MEMS 3 | Dark | Poly | 2 μm |
| 16 | Chamber | | MEMS 4 | Dark | Nozzle | 2 μm |
| 17 | Inlet | Backside deep silicon etch | MEMS 5 | Light | Poly | 4 μm |

Example Process Sequence (Including CMOS Steps)

Although many different CMOS and other processes can be used, this process description is combined with an example CMOS process to show where MEMS features are integrated in the CMOS masks, and show where the CMOS process may be simplified due to the low CMOS performance requirements.

Process steps described below are part of the example 'generic' 1P3M0.5 micron CMOS process.

Figure 18:
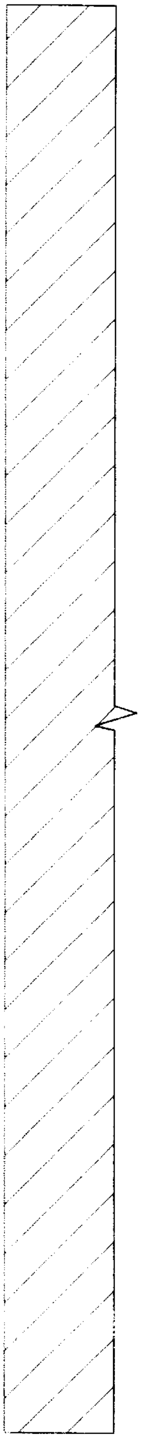
FIG. 18 illustrates a sectional view of a portion of an initial wafer on which an ink jet nozzle structure is to be formed.
Figure 19:
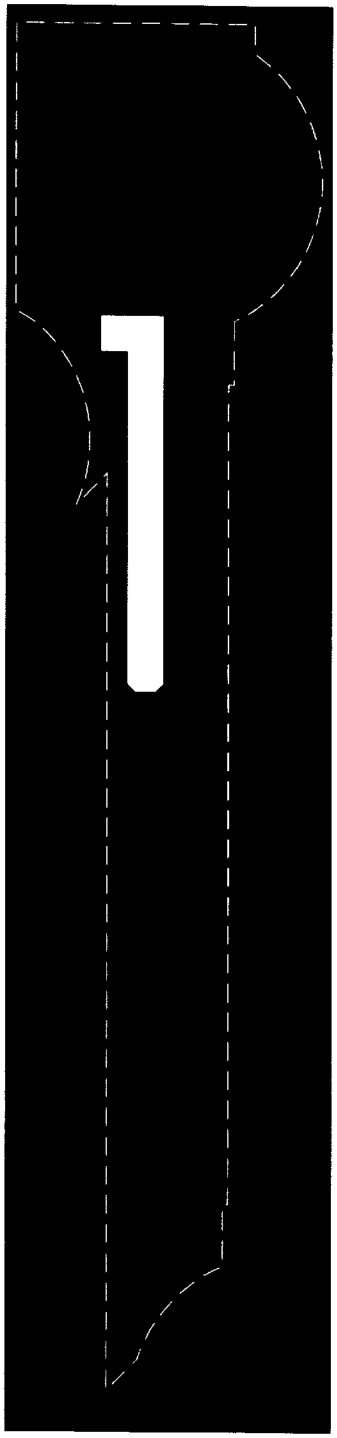
FIG. 19 illustrates the mask for N-well processing.
Figure 20:
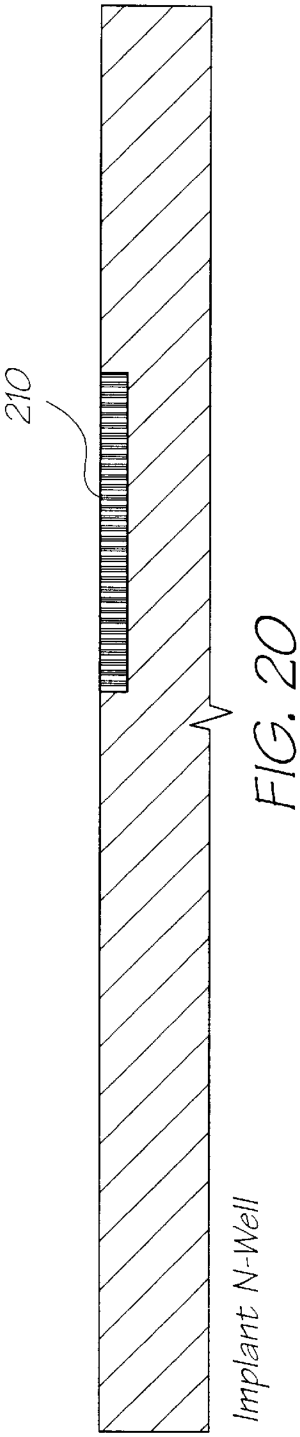
FIG. 20 illustrates a sectional view of a portion of the wafer after N-well processing.
Figure 21:
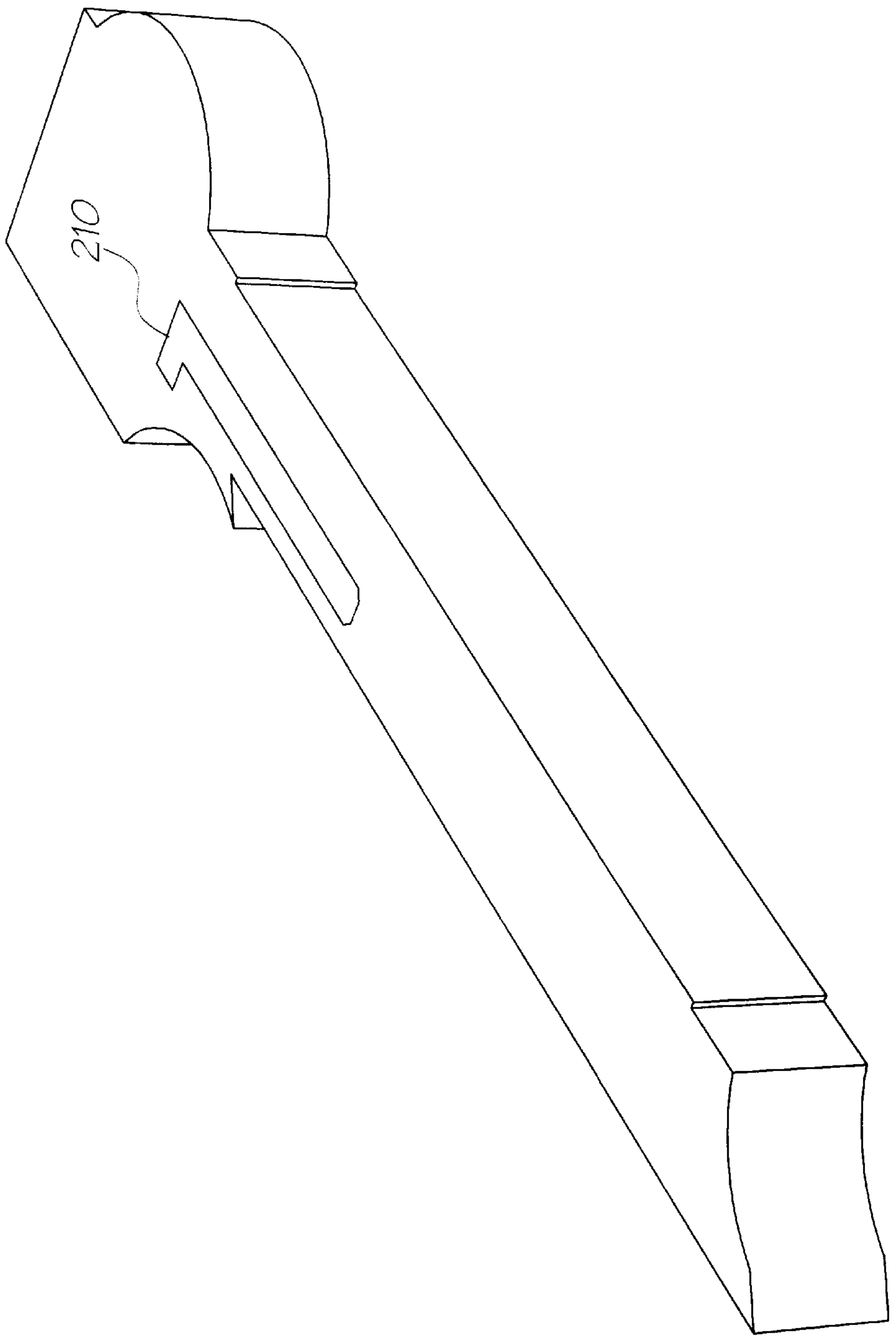
FIG. 21 illustrates a side perspective view partly in section of a single nozzle after N-well processing.
Figure 22:
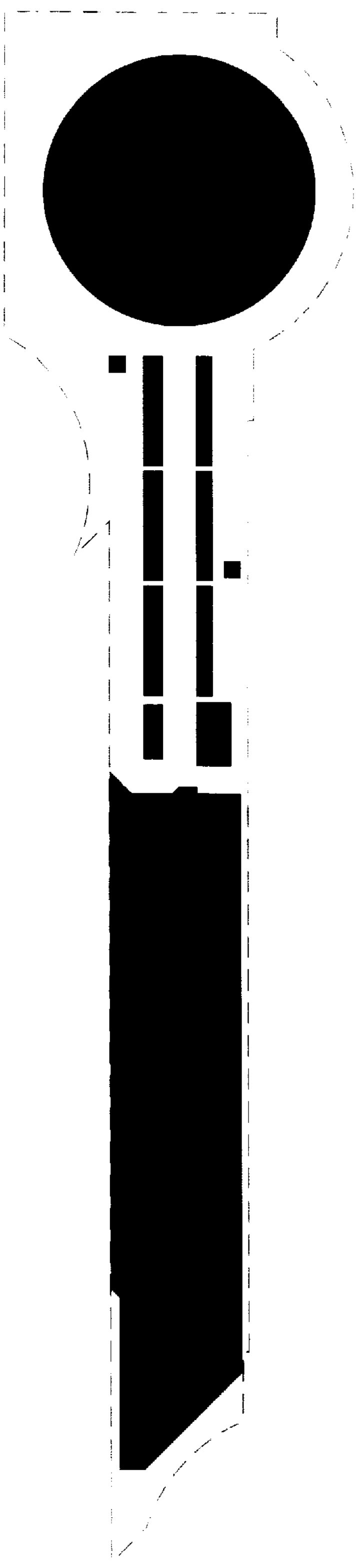
FIG. 22 illustrates the active channel mask.
Figure 23:
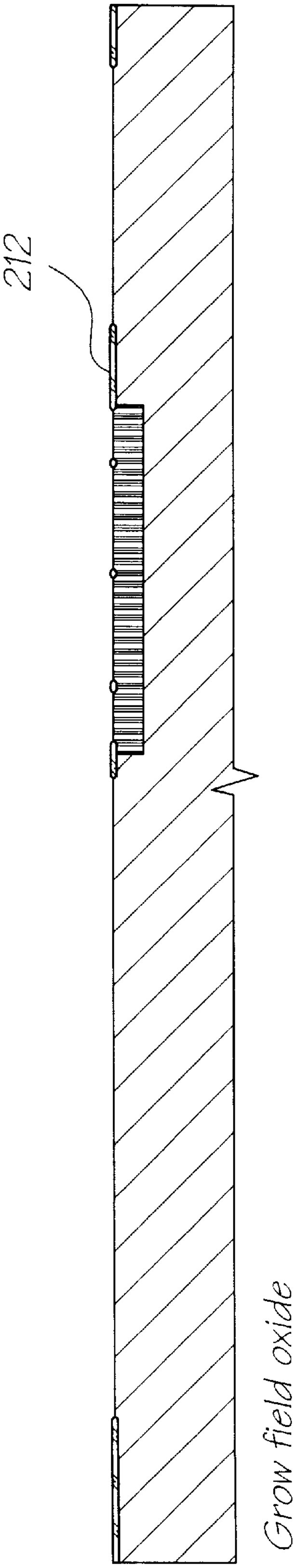
FIG. 23 illustrates a sectional view of a field oxide.
Figure 24:
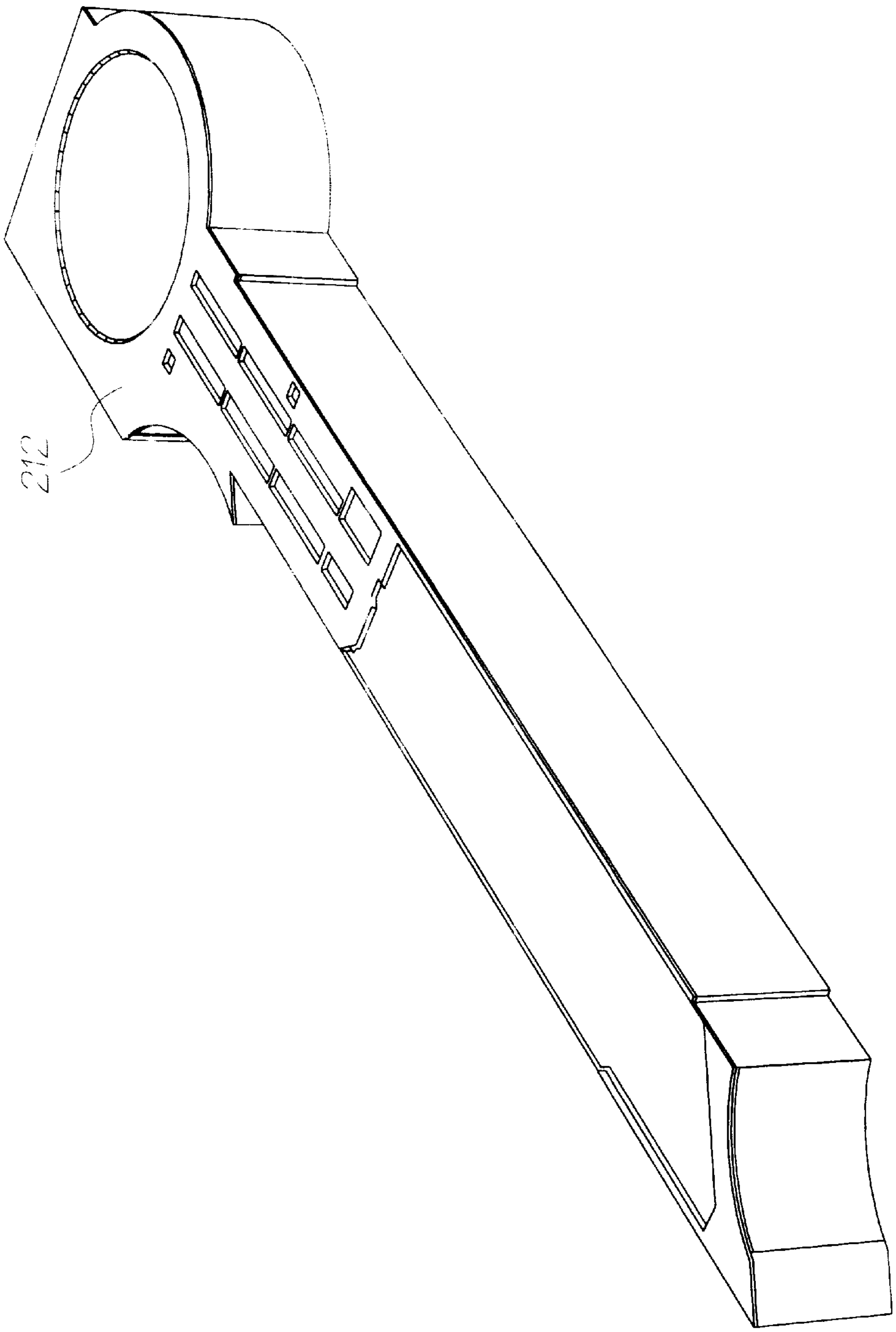
FIG. 24 illustrates a side perspective view partly in section of a single nozzle after field oxide deposition.
Figure 25:
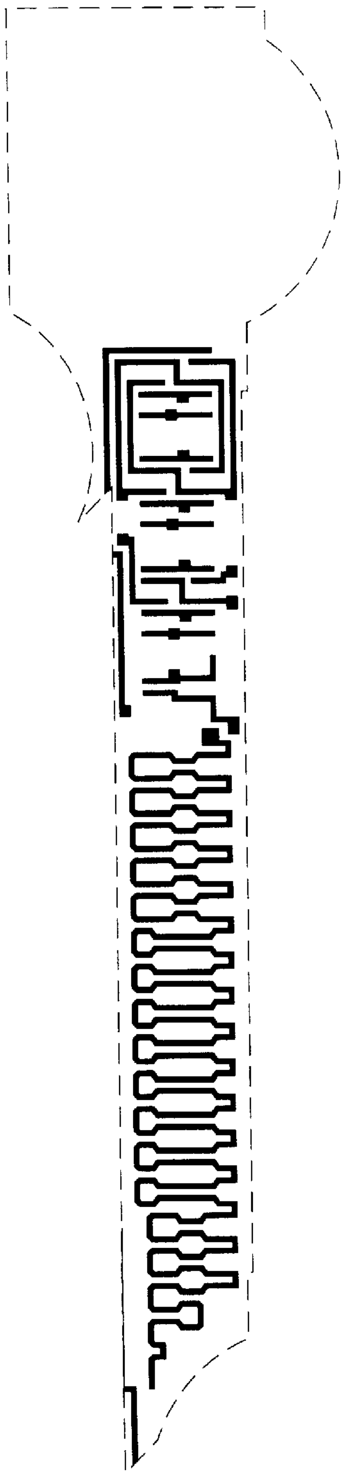
FIG. 25 illustrates a poly mask.
Figure 26:
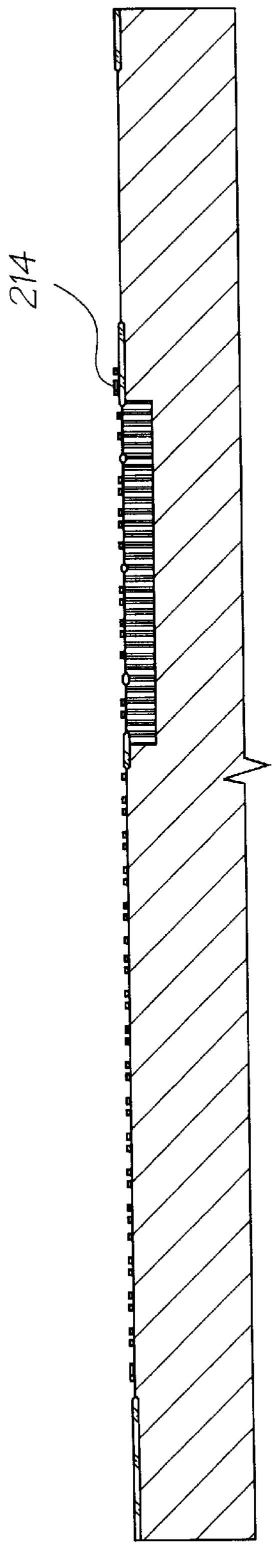
FIG. 26 illustrates a sectional view of the deposited poly.
Figure 27:
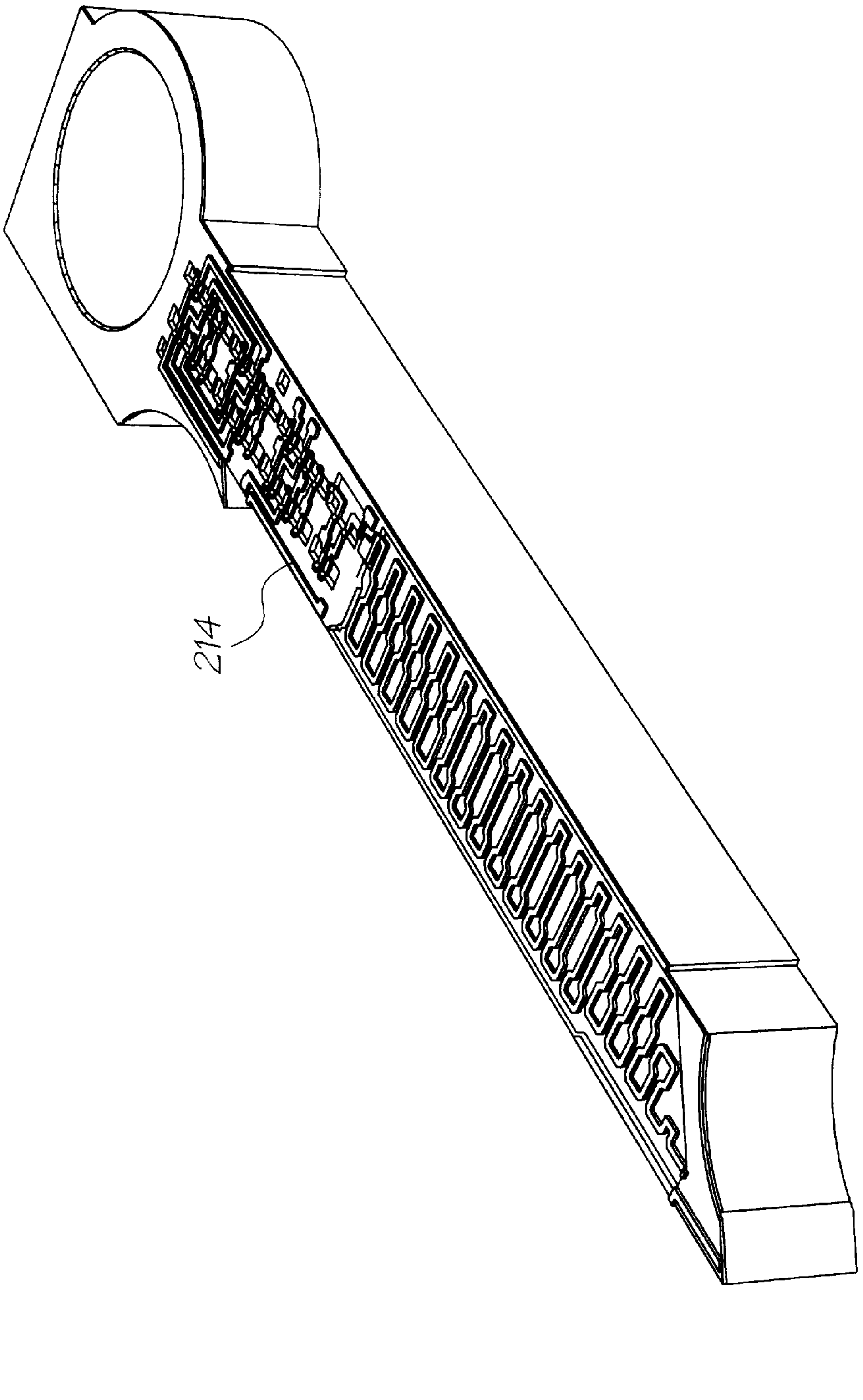
FIG. 27 illustrates a side perspective view partly in section of a single nozzle after poly deposition.
Figure 28:
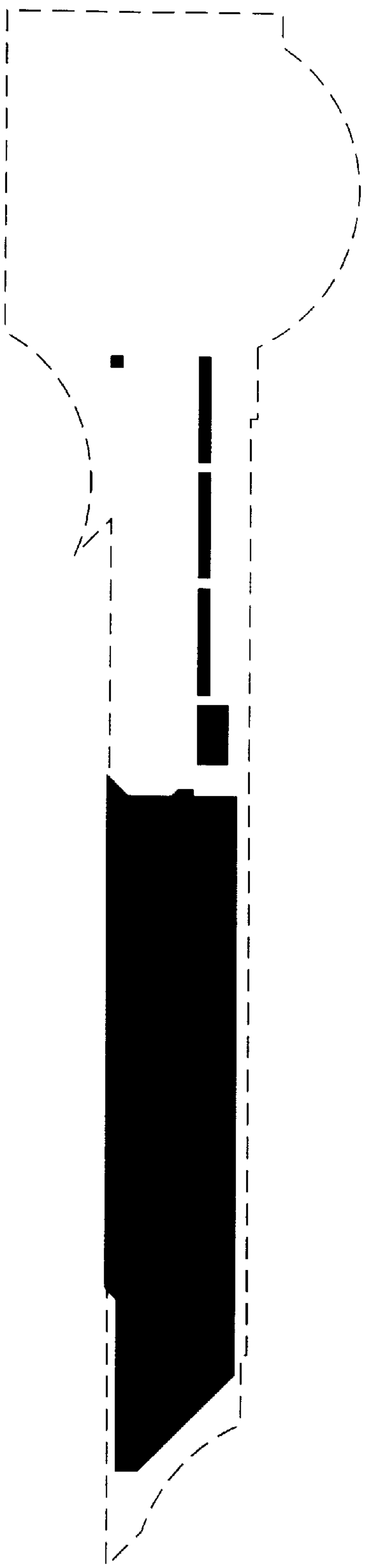
FIG. 28 illustrates an n+ mask.
Figure 29:
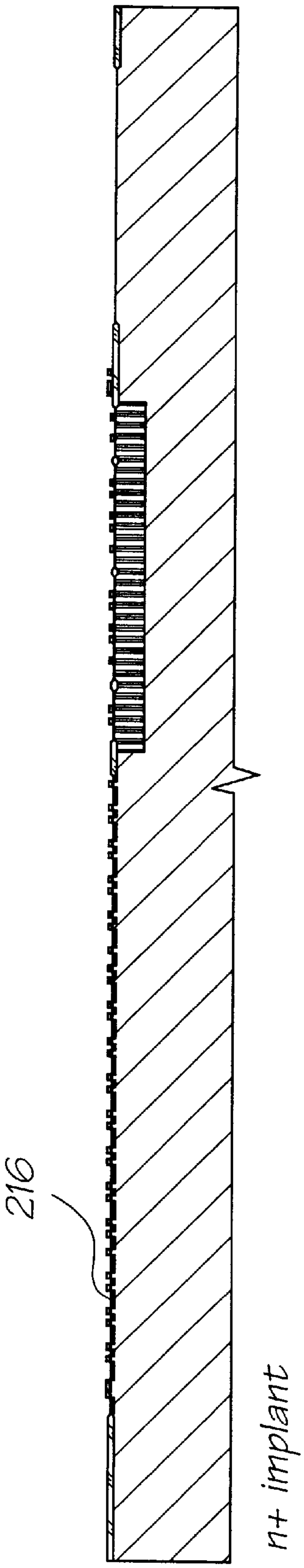
FIG. 29 illustrates a sectional view of an n+ implant.
Figure 30:
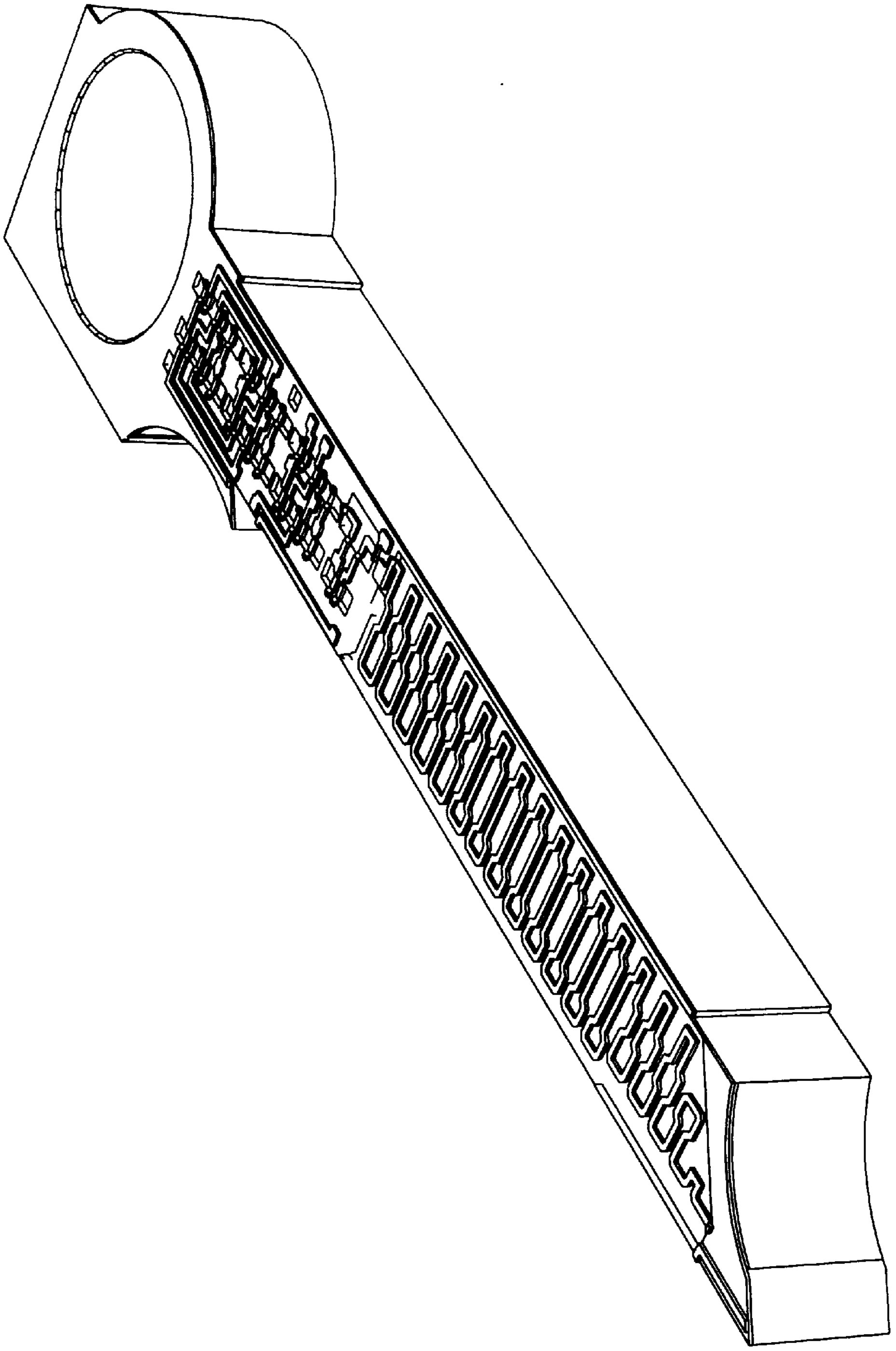
FIG. 30 illustrates a side perspective view partly in section of a single nozzle after n+ implant.
Figure 31:
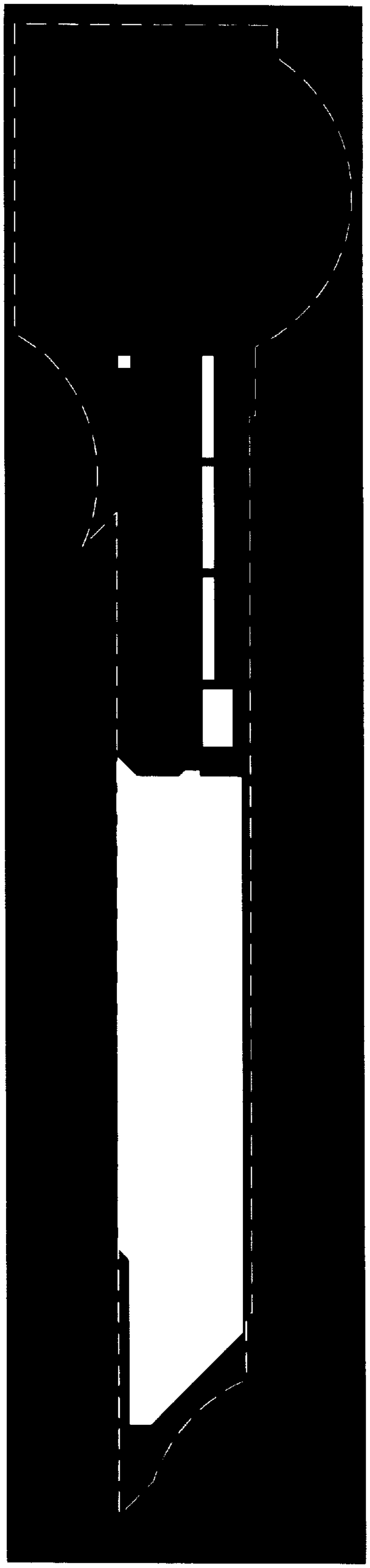
FIG. 31 illustrates a p+ mask.
Figure 32:
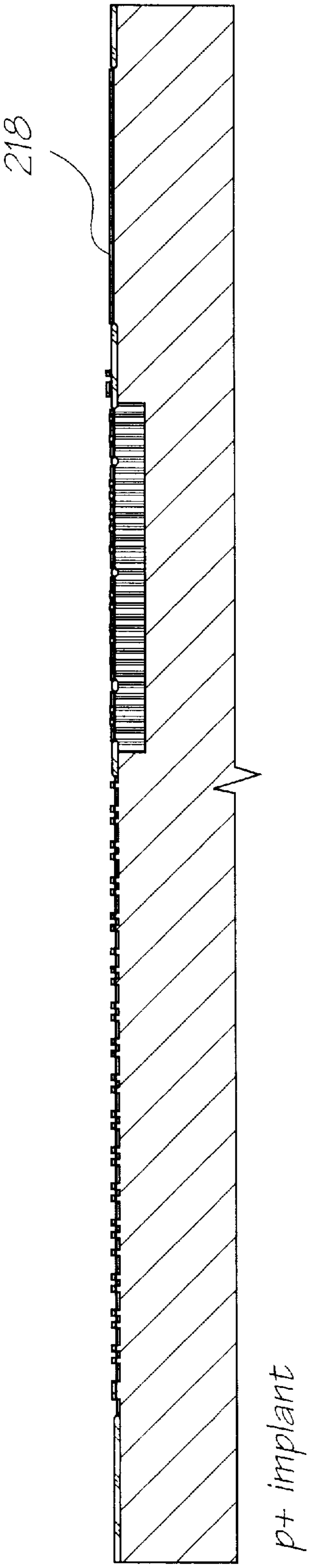
FIG. 32 illustrates a sectional view showing the effect of a p+ implant.
Figure 33:
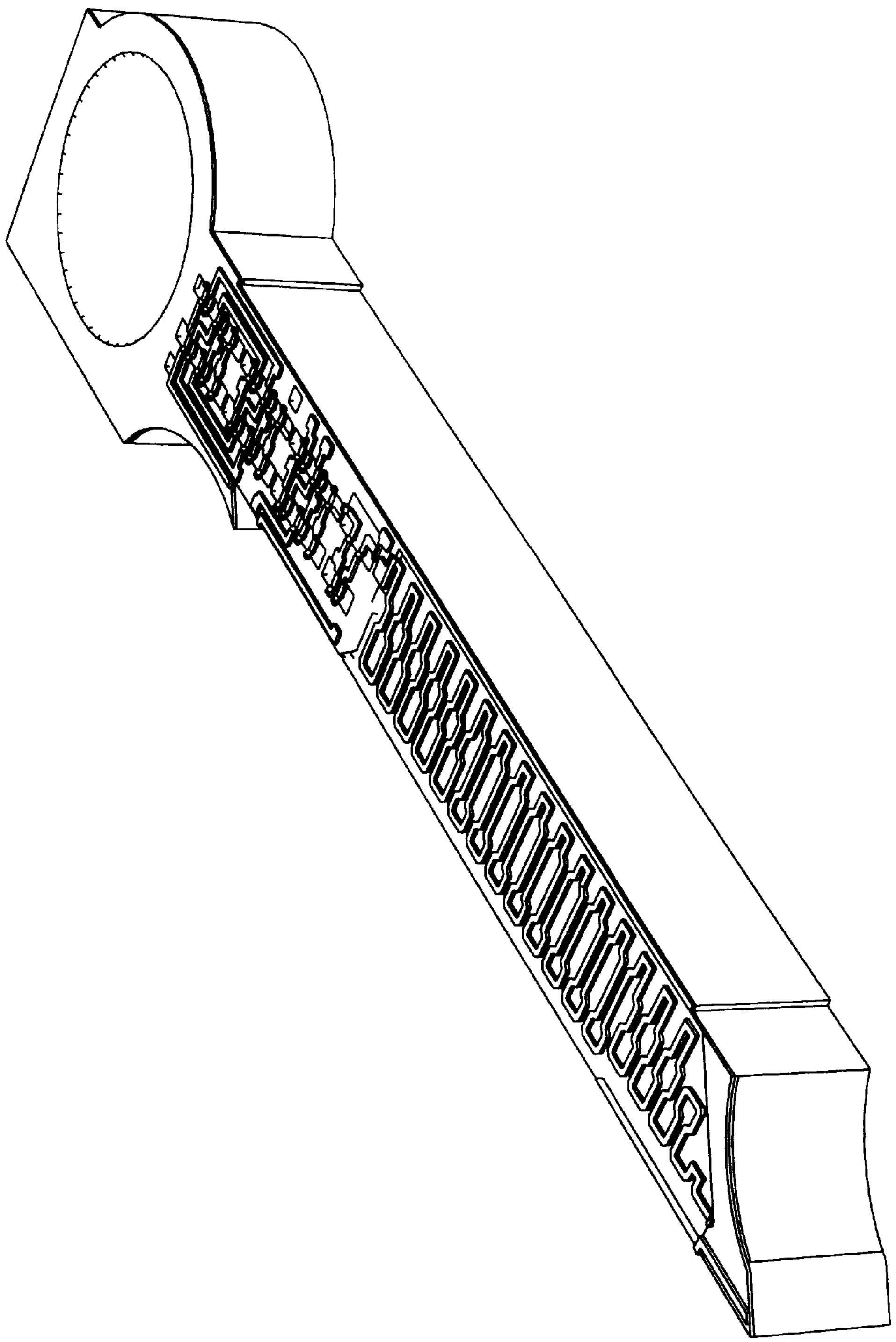
FIG. 33 illustrates a side perspective view partly in section of a single nozzle after p+ implant.
Figure 34:
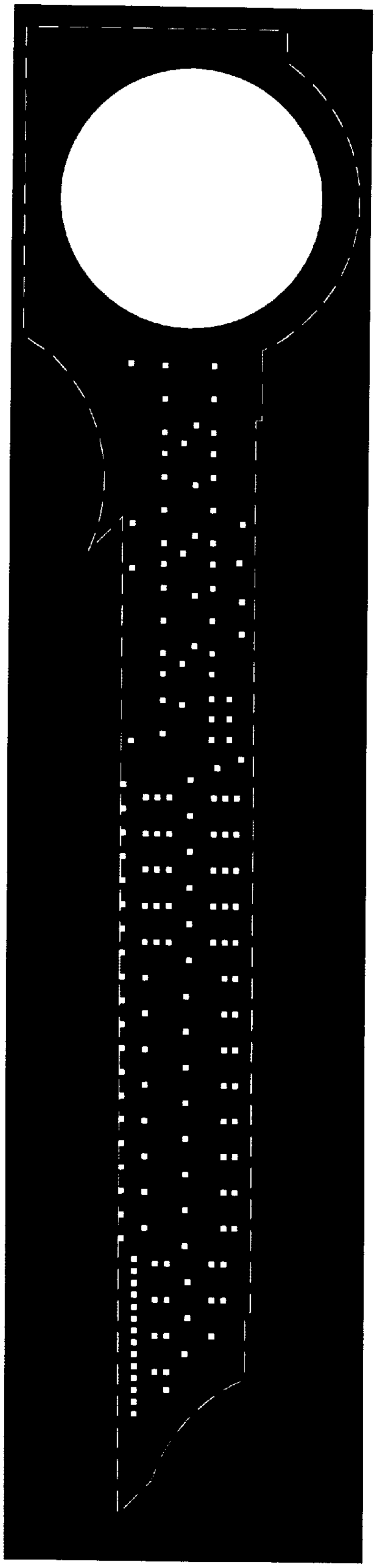
FIG. 34 illustrates a contacts mask.
Figure 35:
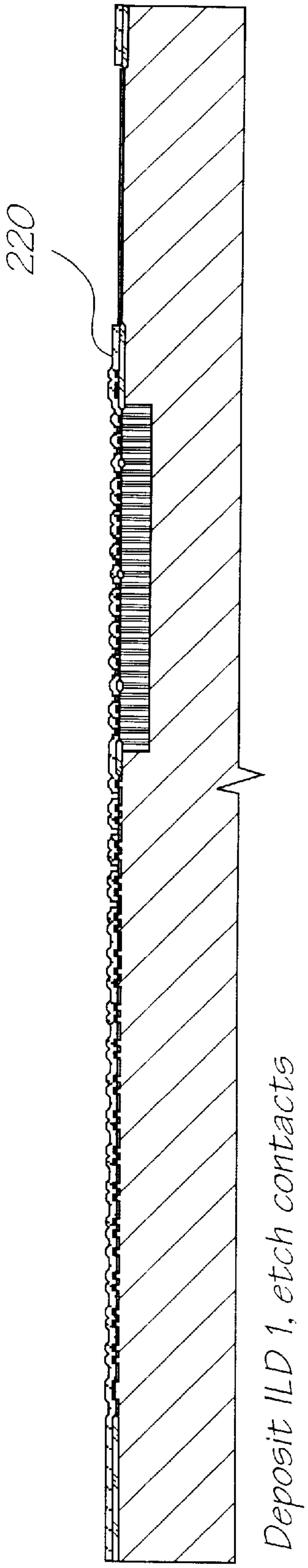
FIG. 35 illustrates a sectional view showing the effects of depositing ILD 1 and etching contact vias.
Figure 36:
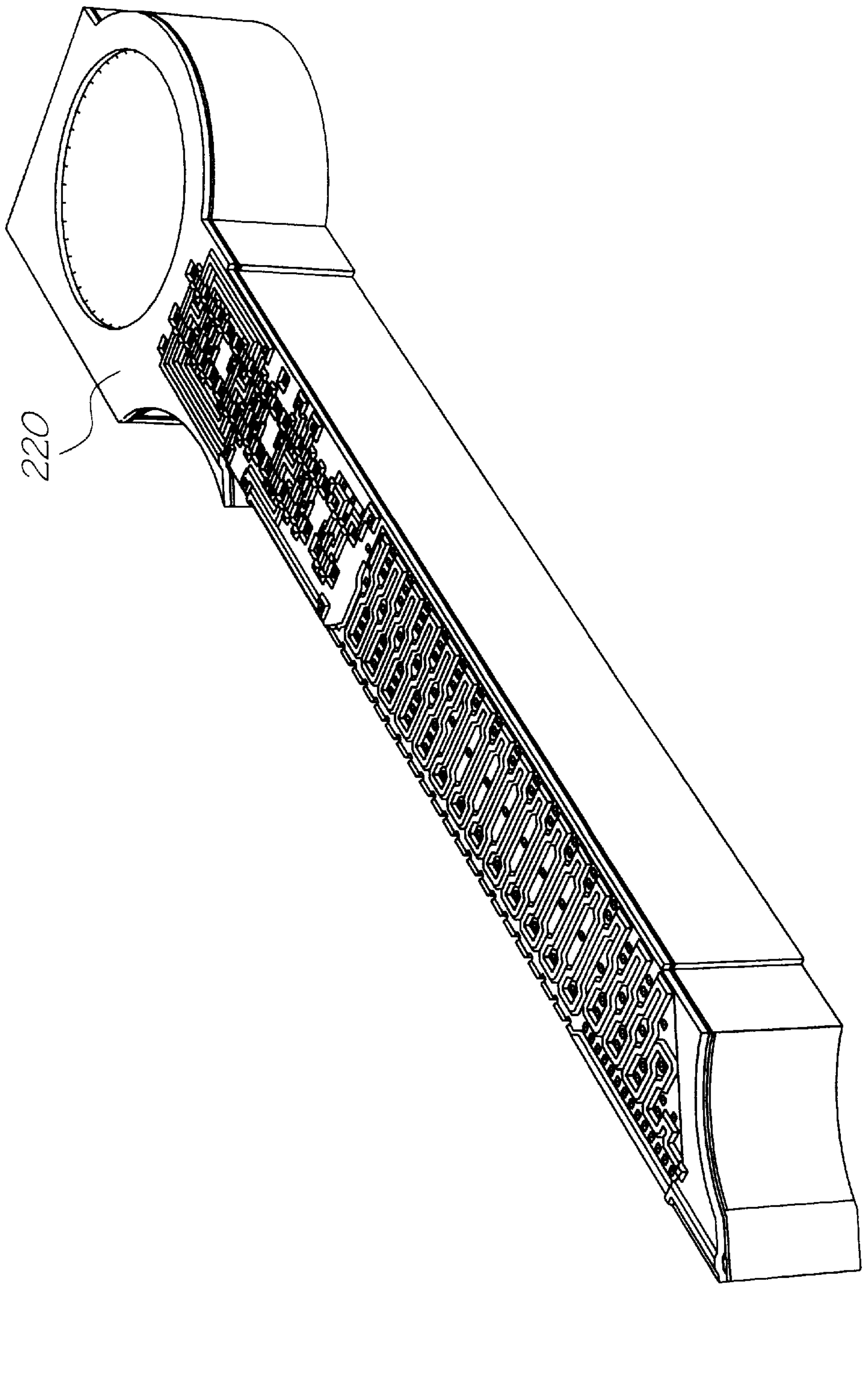
FIG. 36 illustrates a side perspective view partly in section of a single nozzle after depositing ILD 1 and etching contact vias.
Figure 37:
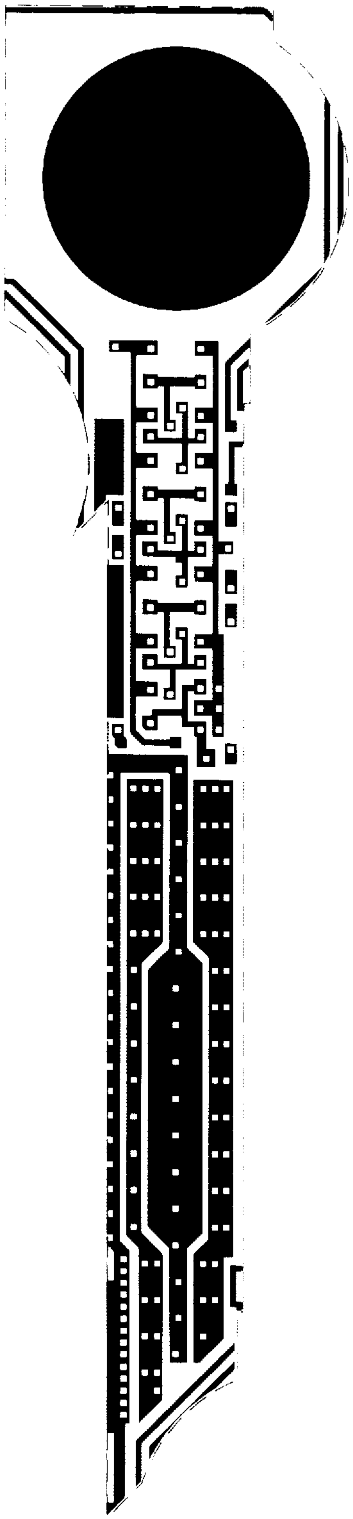
FIG. 37 illustrates a Metal 1 mask.
Figure 38:
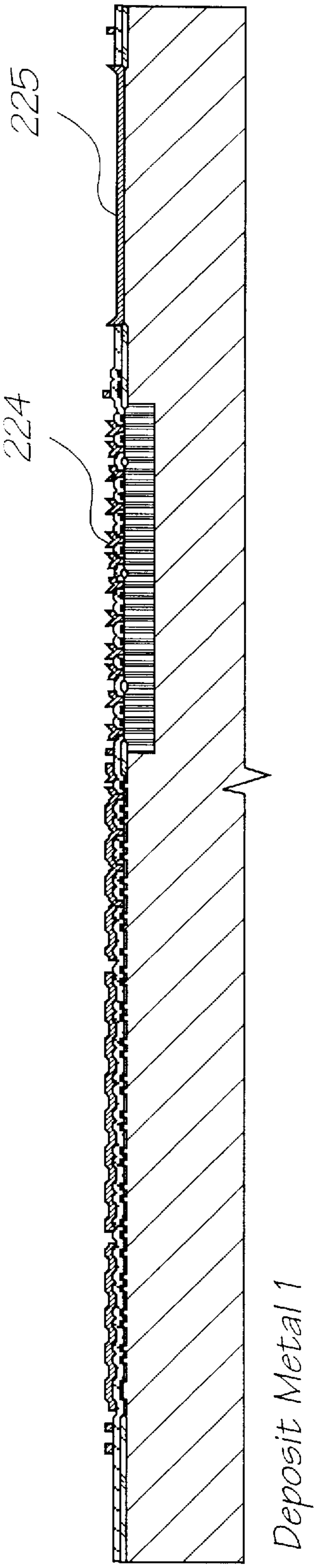
FIG. 38 illustrates a sectional view showing the effect of metal deposition of a Metal 1 layer.
Figure 39:
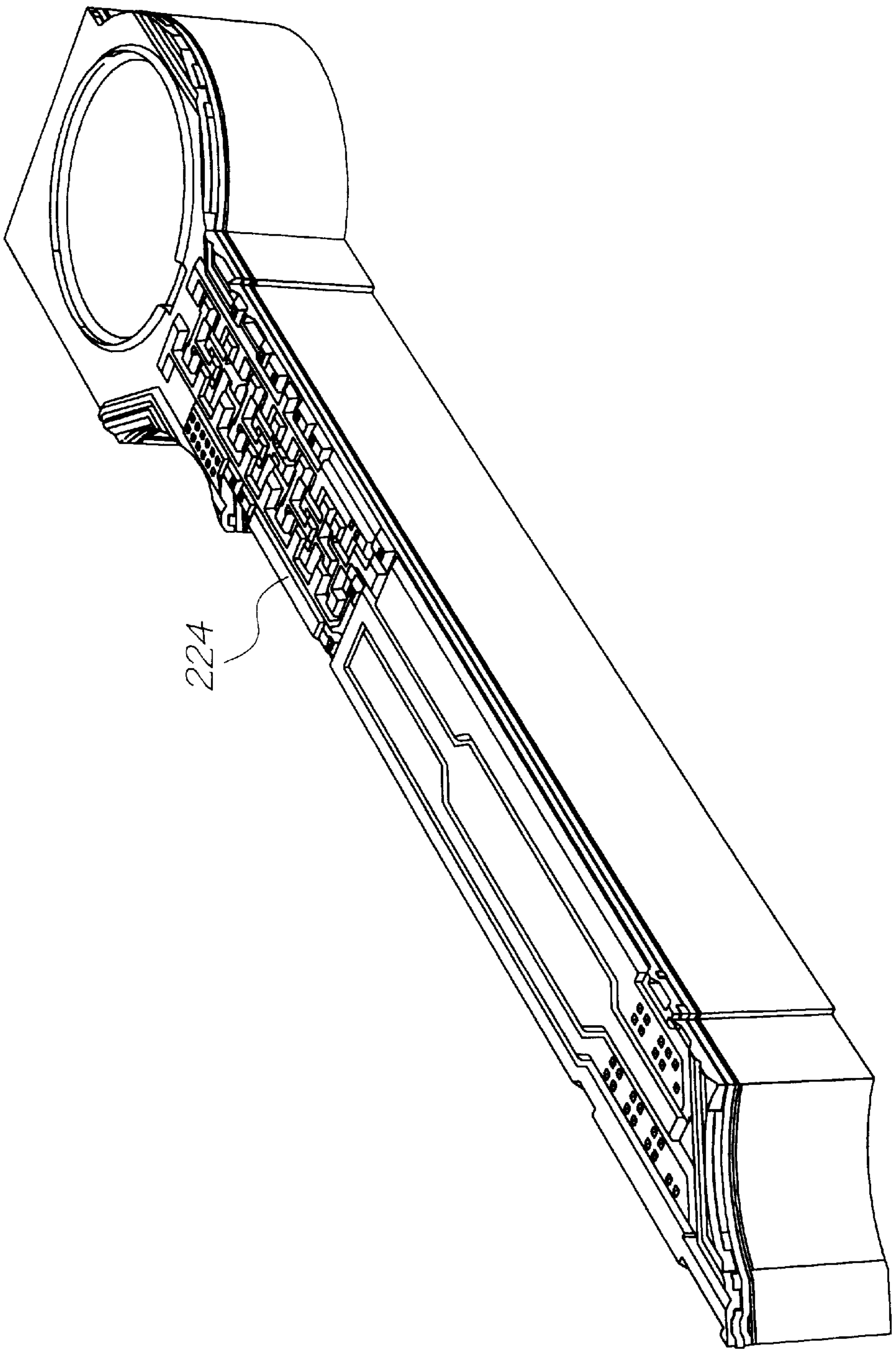
FIG. 39 illustrates a side perspective view partly in section of a single nozzle after metal 1 deposition.
Figure 41:
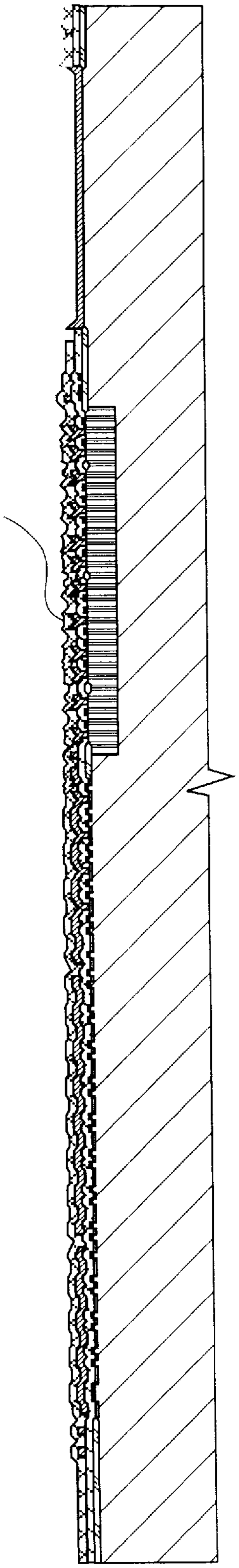
FIG. 41 illustrates a sectional view showing the effects of depositing ILD 2 and etching contact vias.

1. As shown in FIG. 18, processing starts with a standard 6" p-type <100 > wafers. (8" wafers can also be used, giving a substantial increase in primary yield).
2. Using the n-well mask of FIG. 19, implant the n-well transistor portions 210 of FIG. 20.
3. Grow a thin layer of $SiO_2$ and deposit $Si_3N_4$ forming a field oxide hard mask.
4. Etch the nitride and oxide using the active mask of FIG. 22. The mask is oversized to allow for the LOCOS bird's beak. The nozzle chamber region is incorporated in this mask, as field oxide is excluded from the nozzle chamber. The result is a series of oxide regions 212, illustrated in FIG. 23.
5. Implant the channel-stop using the n-well mask with a negative resist, or using a complement of the n-well mask.
6. Perform any required channel stop implants as required by the CMOS process used.
7. Grow 0.5 micron of field oxide using LOCOS.
8. Perform any required n/p transistor threshold voltage adjustments. Depending upon the characteristics of the CMOS process, it may be possible to omit the threshold adjustments. This is because the operating frequency is only 3.8 MHz, and the quality of the p-devices is not critical. The n-transistor threshold is more significant, as the on-resistance of the n-channel drive transistor has a significant effect on the efficiency and power consumption while printing.
9. Grow the gate oxide
10. Deposit 0.3 microns of poly, and pattern using the poly mask illustrated in FIG. 25 so as to form poly portions 214 shown in FIG. 26.
11. Perform the n+ implant shown e.g. 216 in FIG. 29 using the n+ mask shown in FIG. 28. The use of a drain engineering processes such as LDD should not be required, as the performance of the transistors is not critical.
12. Perform the p+ implant shown e.g. 218 in FIG. 32, using a complement of the n+ mask shown in FIG. 31, or using the n+ mask with a negative resist. The nozzle chamber region will be doped either n+ or p+ depending upon whether it is included in the n+ mask or not. The doping of this silicon region is not relevant as it is subsequently etched, and the STS ASE etch process recommended does not use boron as an etch stop.
13. Deposit 0.6 microns of PECVD TEOS glass to form ILD 1, shown e.g. 220 in FIG. 35.
14. Etch the contact cuts using the contact mask of FIG. 34. The nozzle region is treated as a single large contact region, and will not pass typical design rule checks. This region should therefore be excluded from the DRC.
15. Deposit 0.6 microns of aluminum to form metal 1.
16. Etch the aluminum using the metal 1 mask shown in FIG. 37 so as to form metal regions e.g. 224 shown in FIG. 38. The nozzle metal region is covered with metal 1 e.g. 225. This aluminum 225 is sacrificial, and is etched as part of the MEMS sequence. The inclusion of metal 1 in the nozzle is not essential, but helps reduce the step in the neck region of the actuator lever arm.
17. Deposit 0.7 microns of PECVD TEOS glass to form ILD 2 regions e.g. 228 of FIG. 41.

Figure 40:
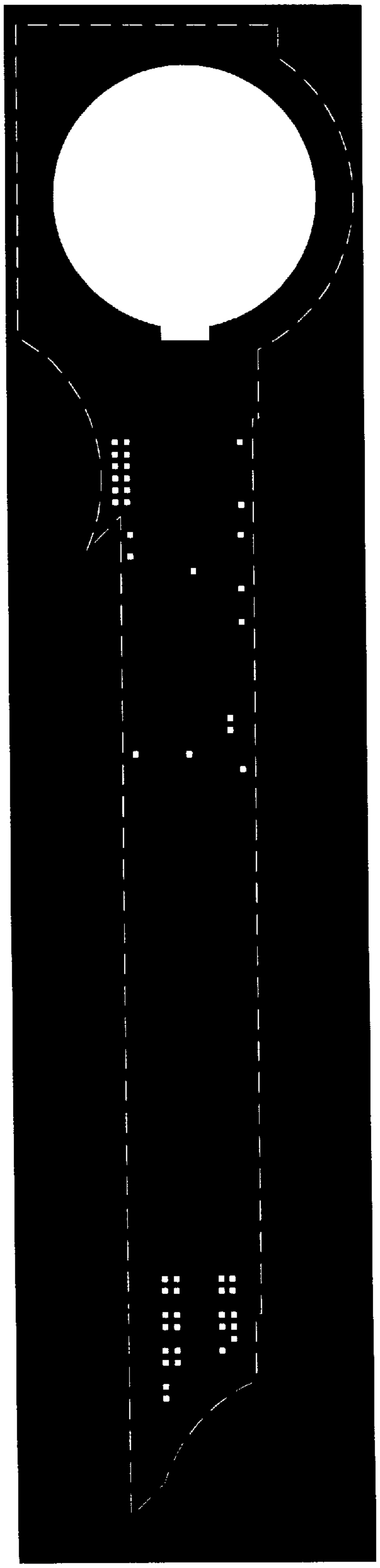
FIG. 40 illustrates the Via 1 mask.
Figure 42:
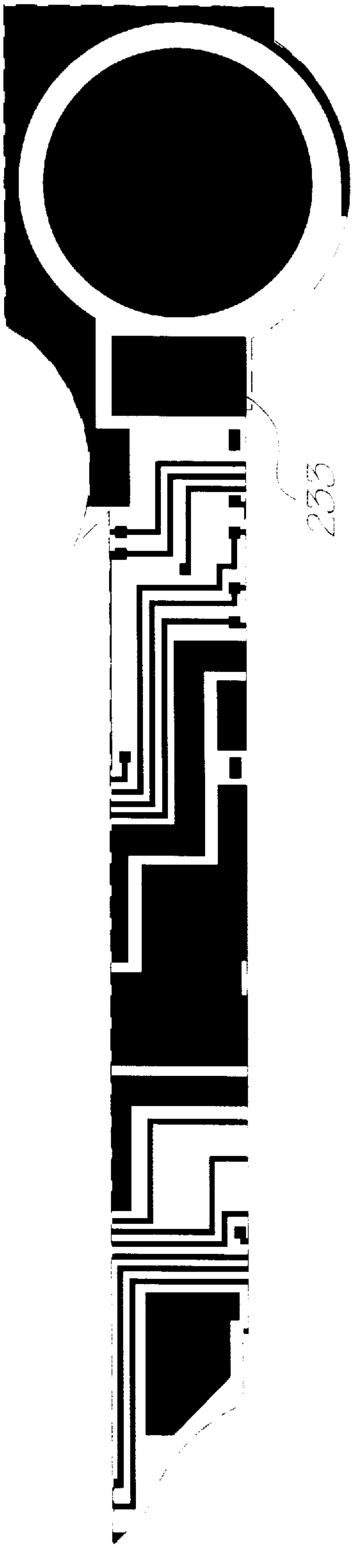
FIG. 42 illustrates a Metal 2 mask.
Figure 43:
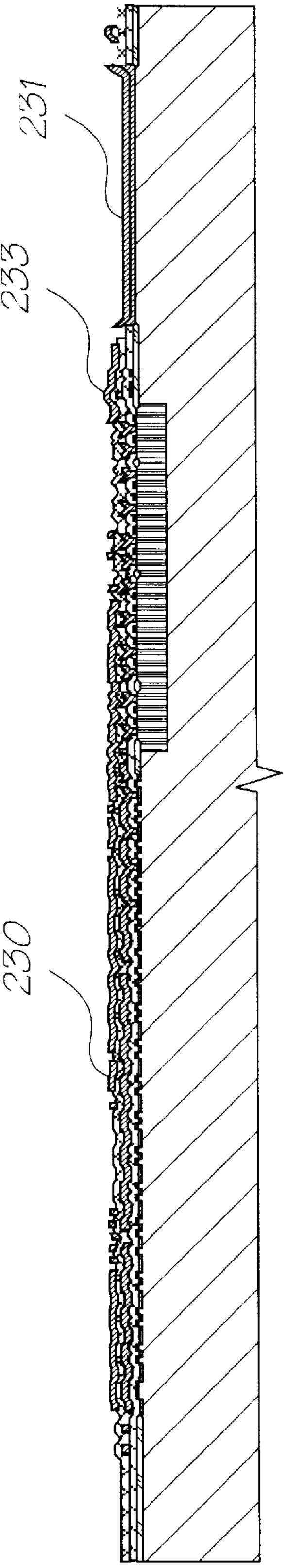
FIG. 43 illustrates a sectional view showing the effects of depositing a Metal 2 layer.
Figure 44:
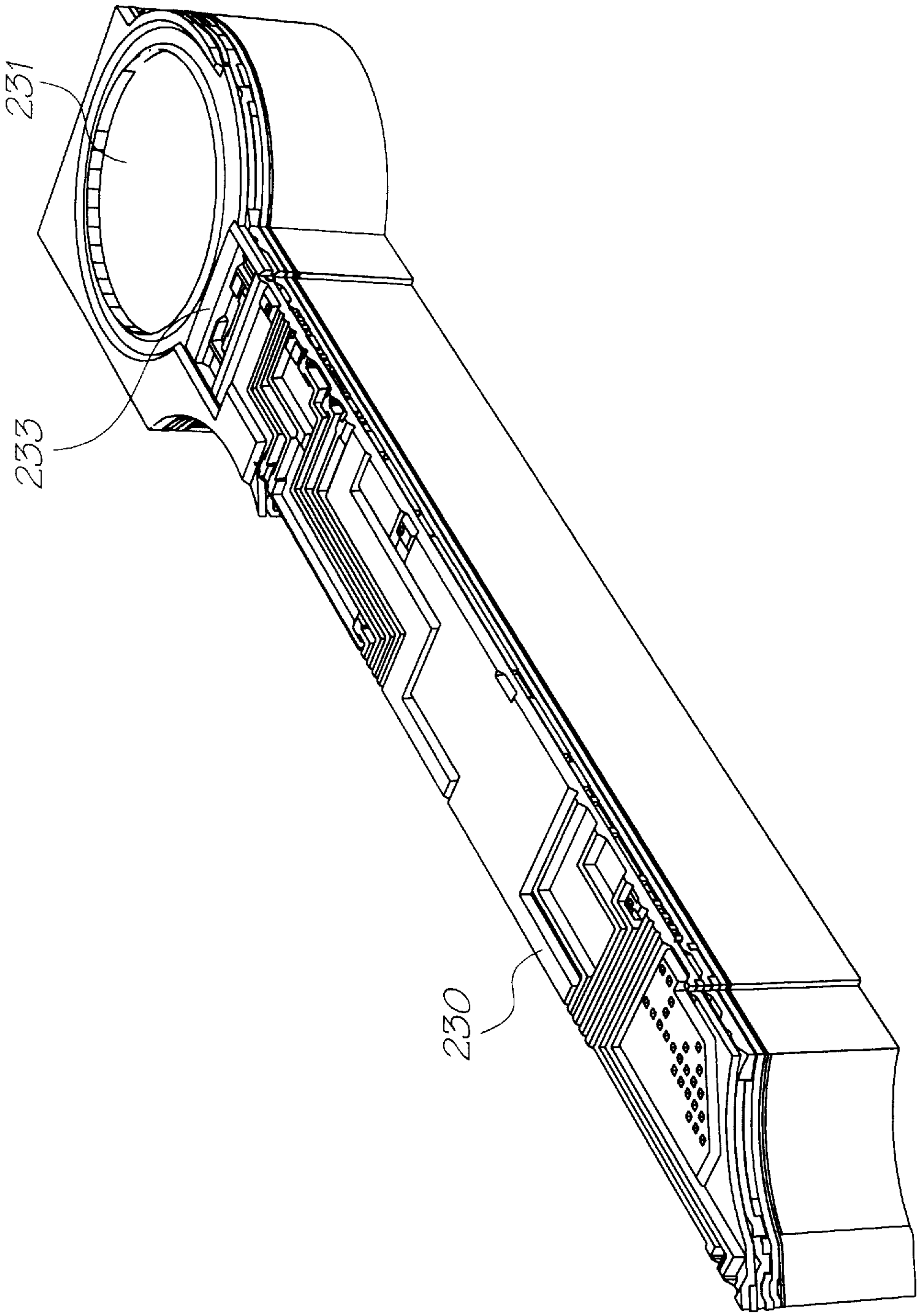
FIG. 44 illustrates a side perspective view partly in section of a single nozzle after metal 2 deposition.
Figure 45:
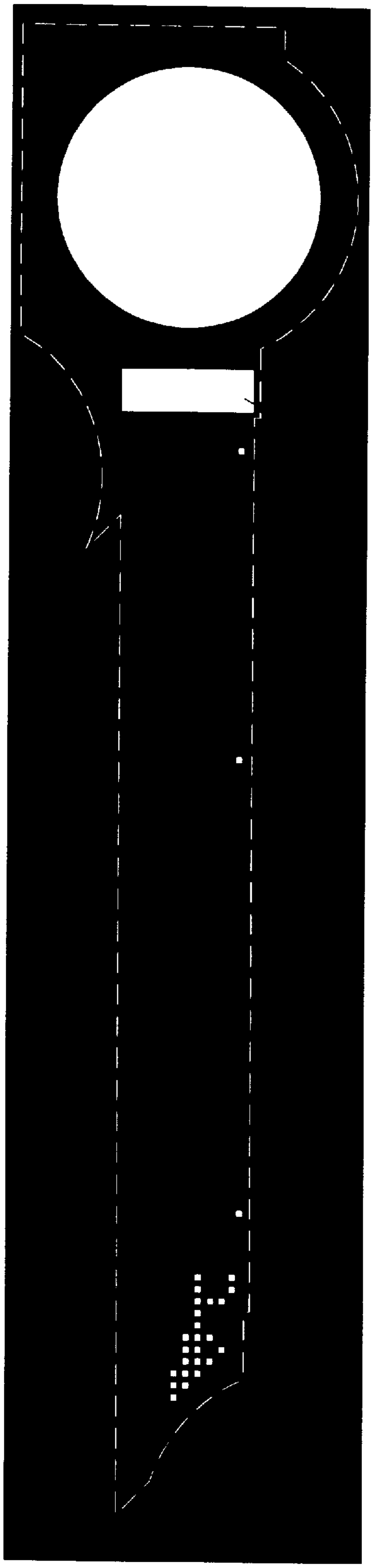
FIG. 45 illustrates the Via 2 mask.
Figure 46:
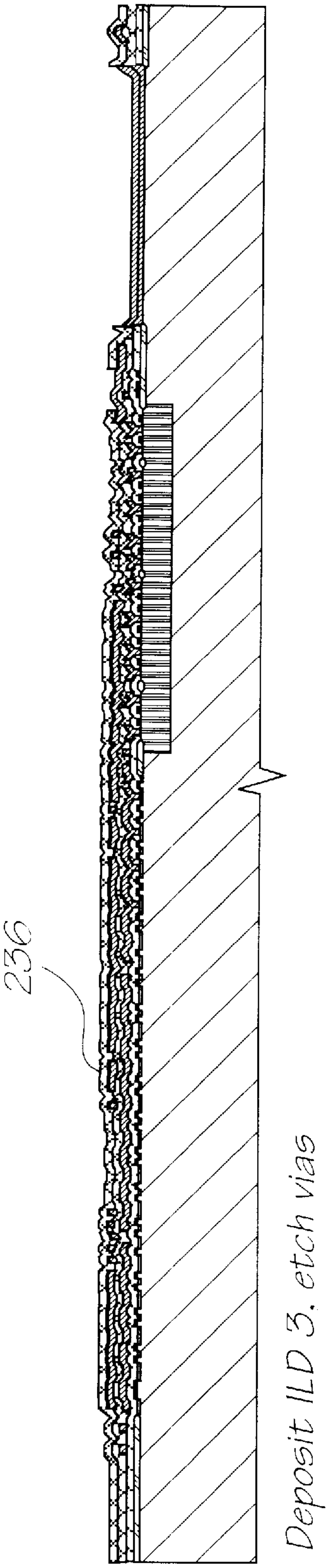
FIG. 46 illustrates a sectional view showing the effects of depositing ILD 3 and etching contact vias.
Figure 47:
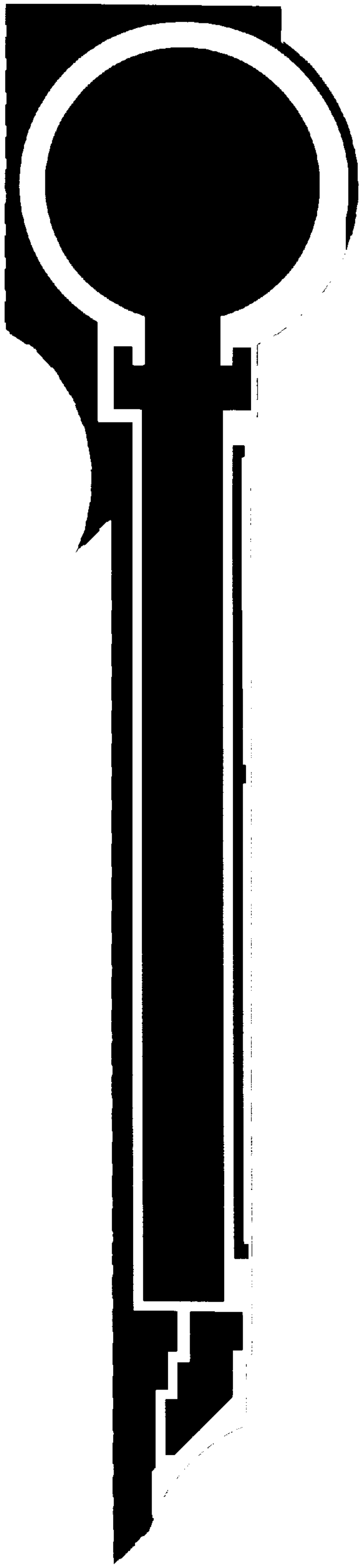
FIG. 47 illustrates a Metal 3 mask.
Figure 48:
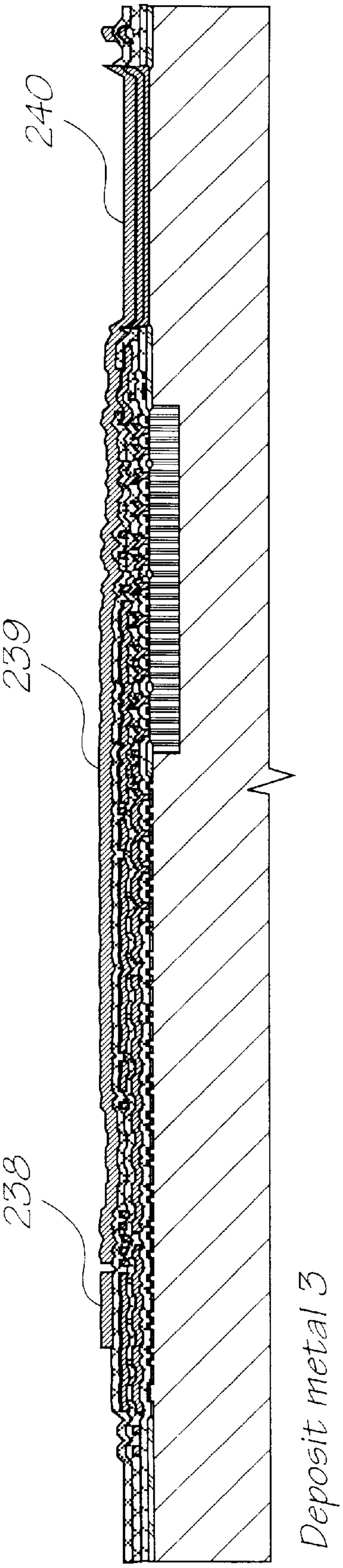
FIG. 48 illustrates a sectional view showing the effects of depositing a Metal 3 layer.
Figure 49:
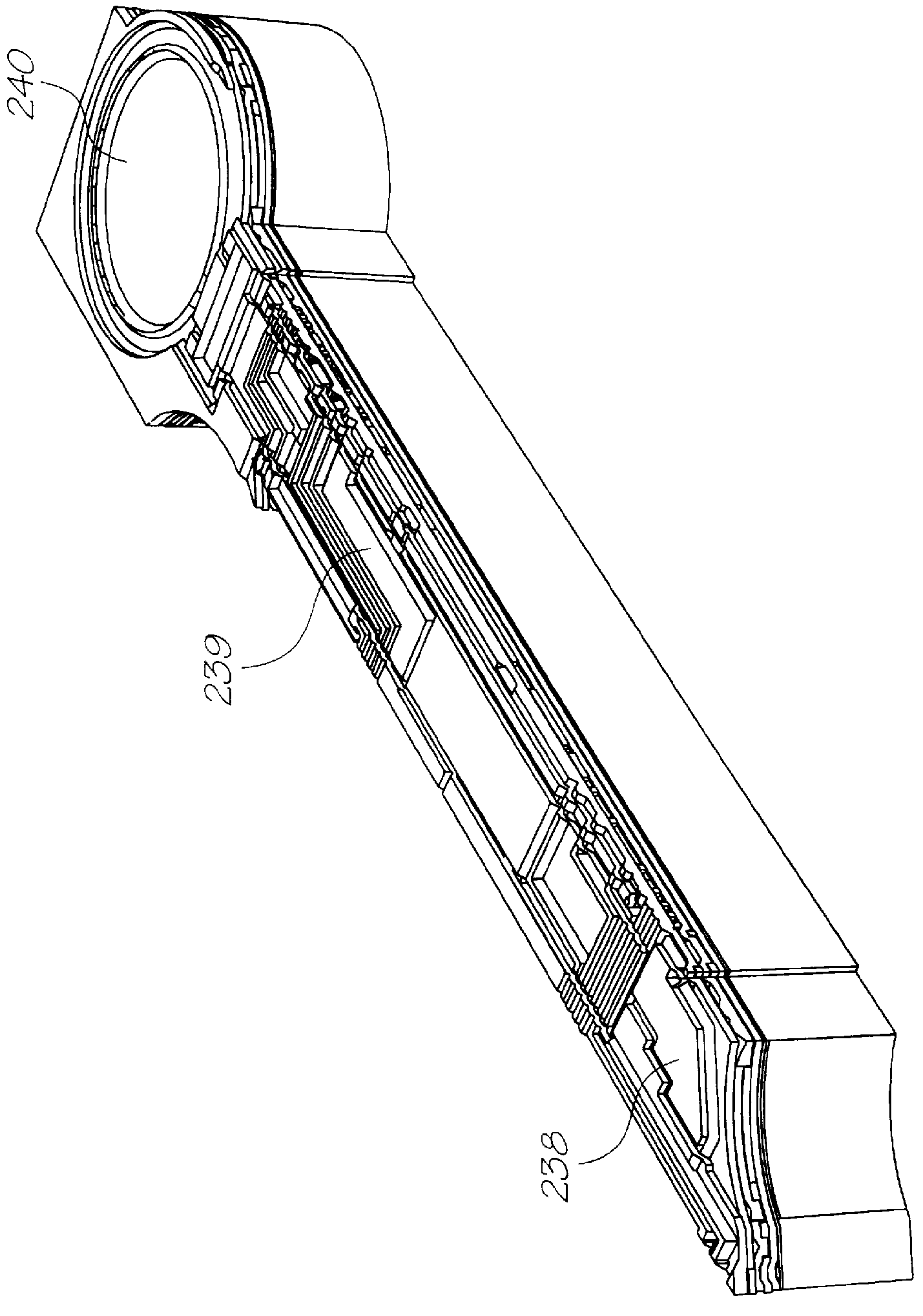
FIG. 49 illustrates a side perspective view partly in section of a single nozzle after metal 3 deposition.
Figure 50:
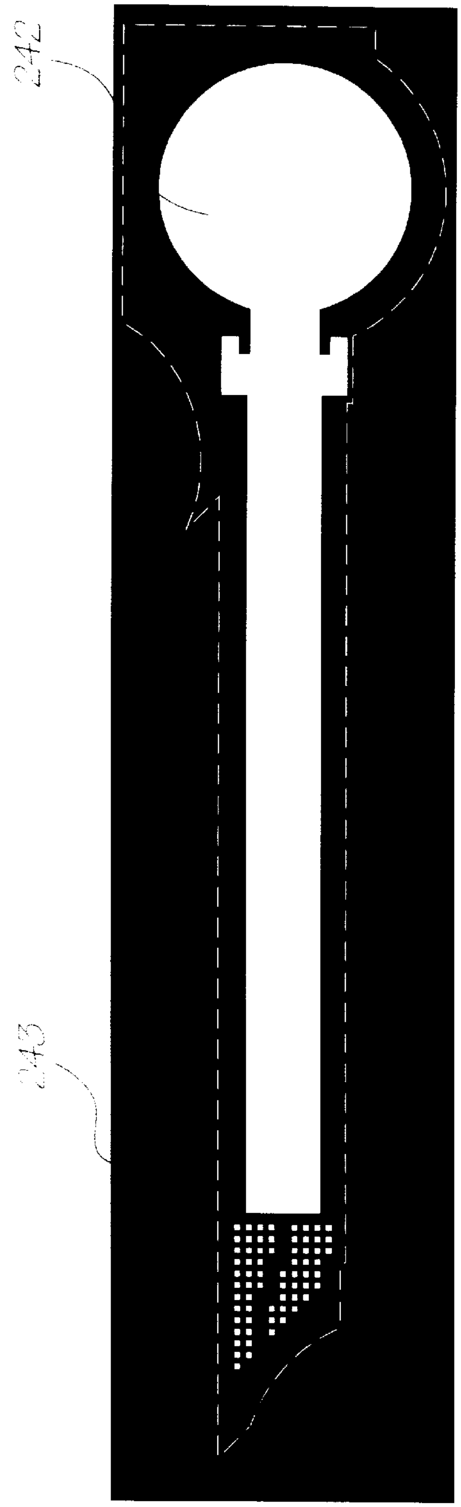
FIG. 50 illustrates a Via 3 mask.
Figure 51:
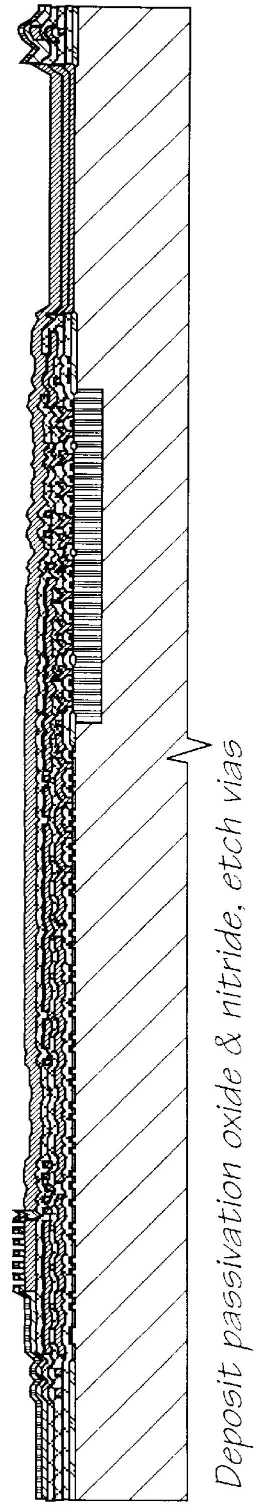
FIG. 51 illustrates a sectional view showing the effects of depositing passivation oxide and nitride and etching vias.
Figure 52:
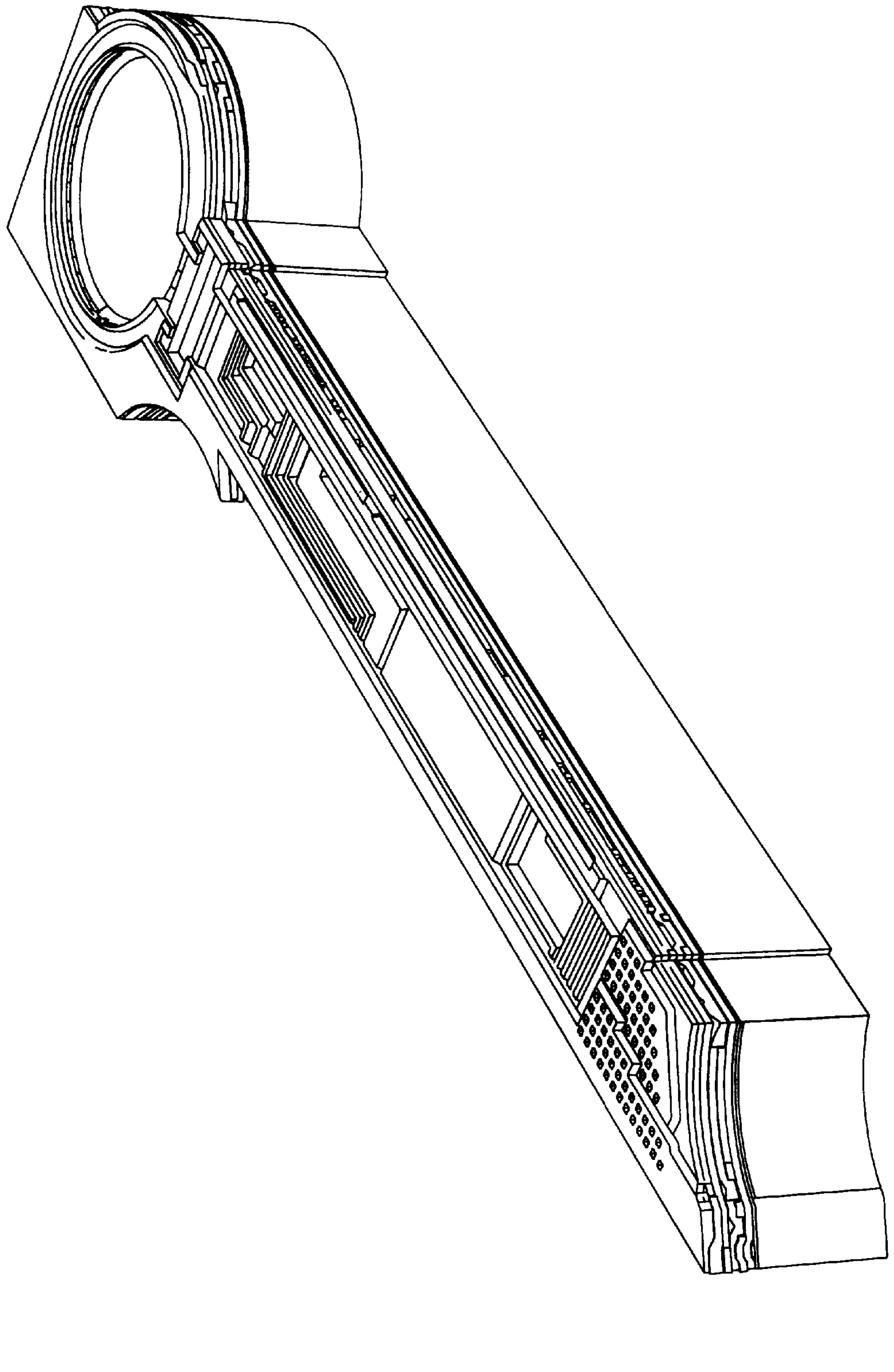
FIG. 52 illustrates a side perspective view partly in section of a single nozzle after depositing passivation oxide and nitride and etching vias.
Figure 53:
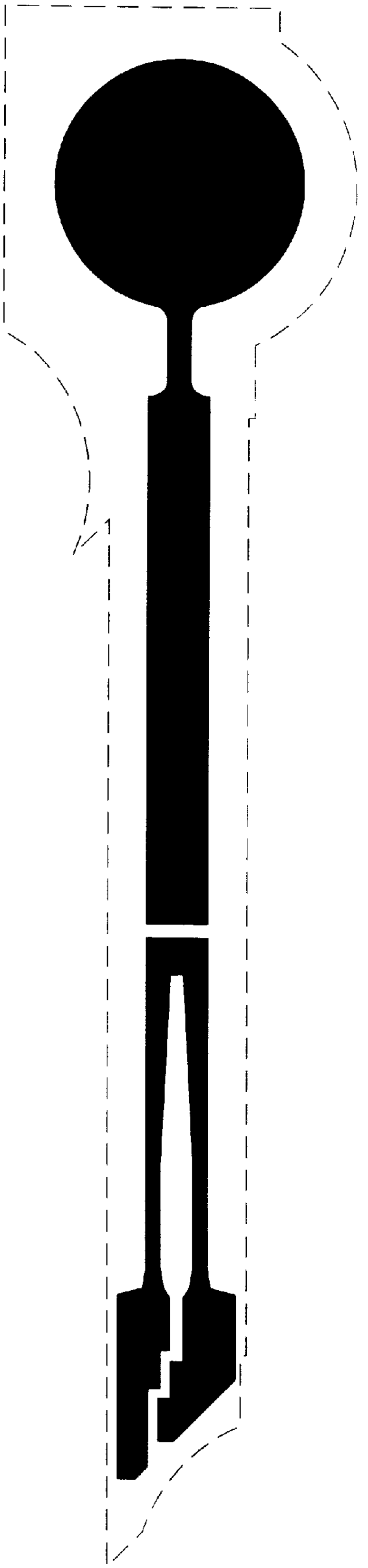
FIG. 53 illustrates a heater mask.
Figure 54:
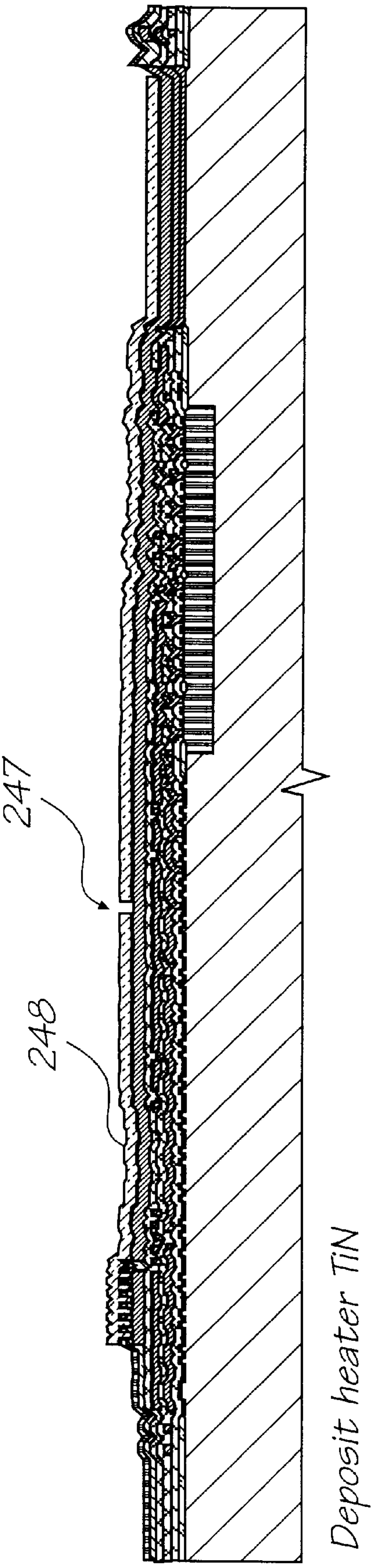
FIG. 54 illustrates a sectional view showing the effect of depositing a heater titanium nitride layer.
Figure 55:
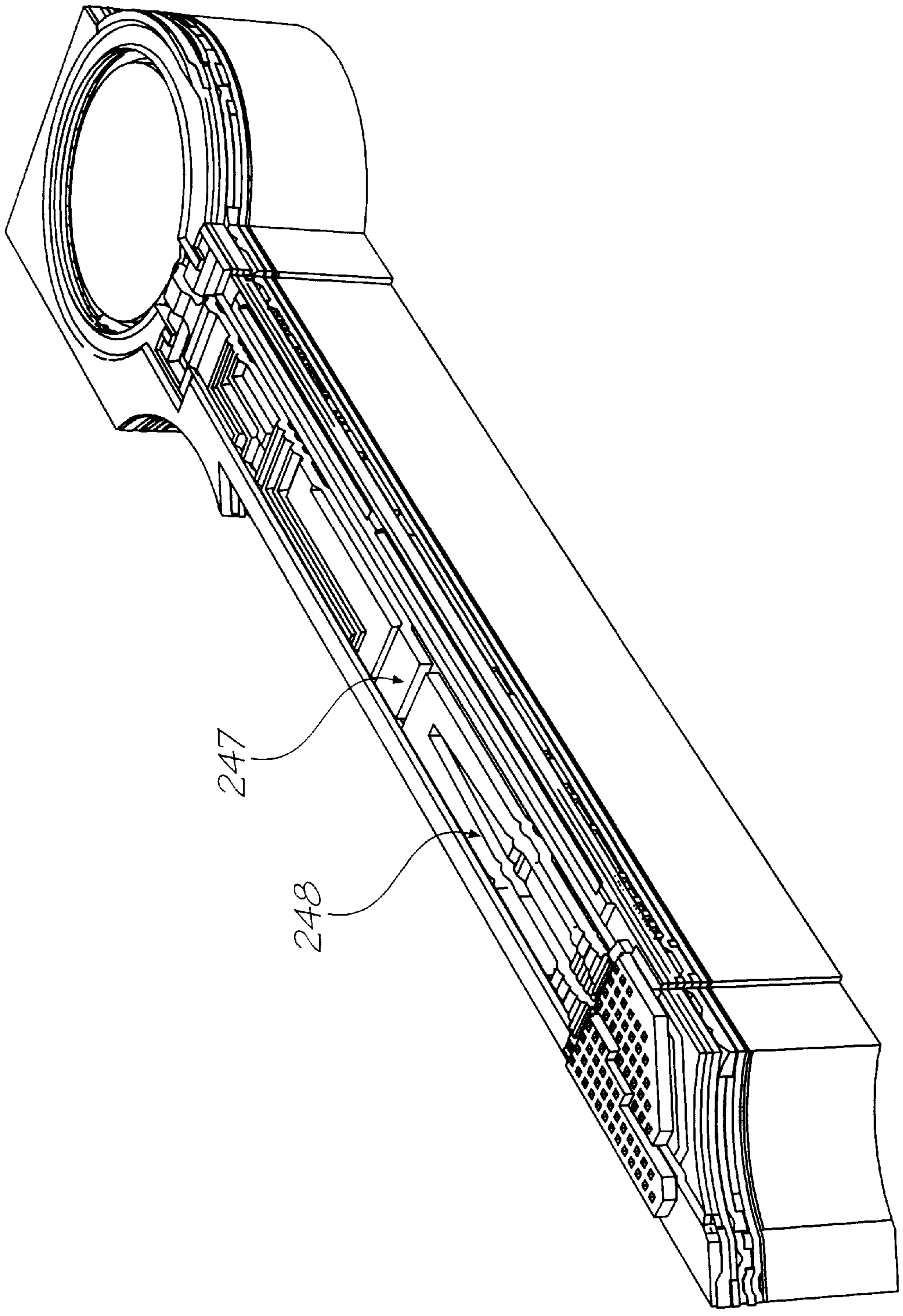
FIG. 55 illustrates a side perspective view partly in section of a single nozzle after depositing the heater titanium nitride layer.
Figure 56:
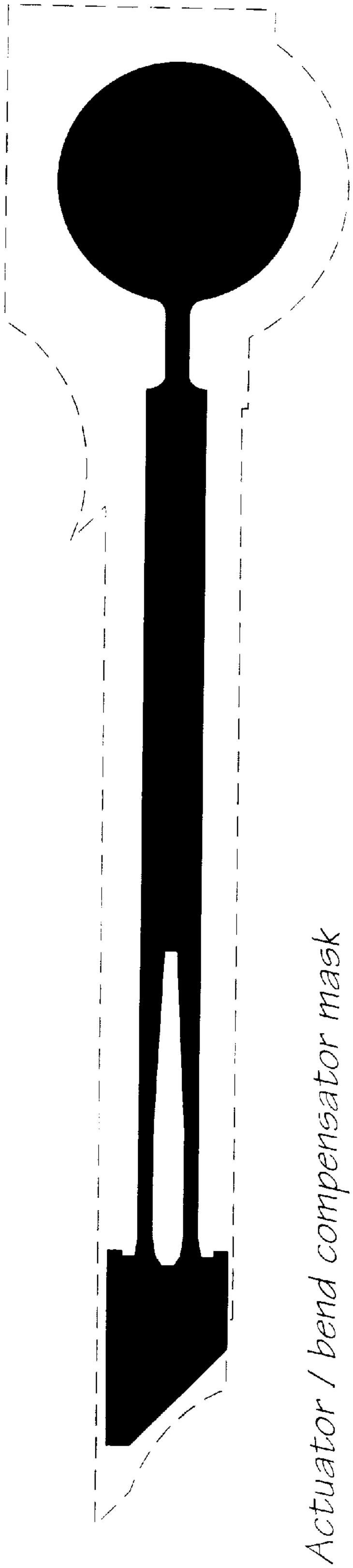
FIG. 56 illustrates an actuator/bend compensator mask.
Figure 57:
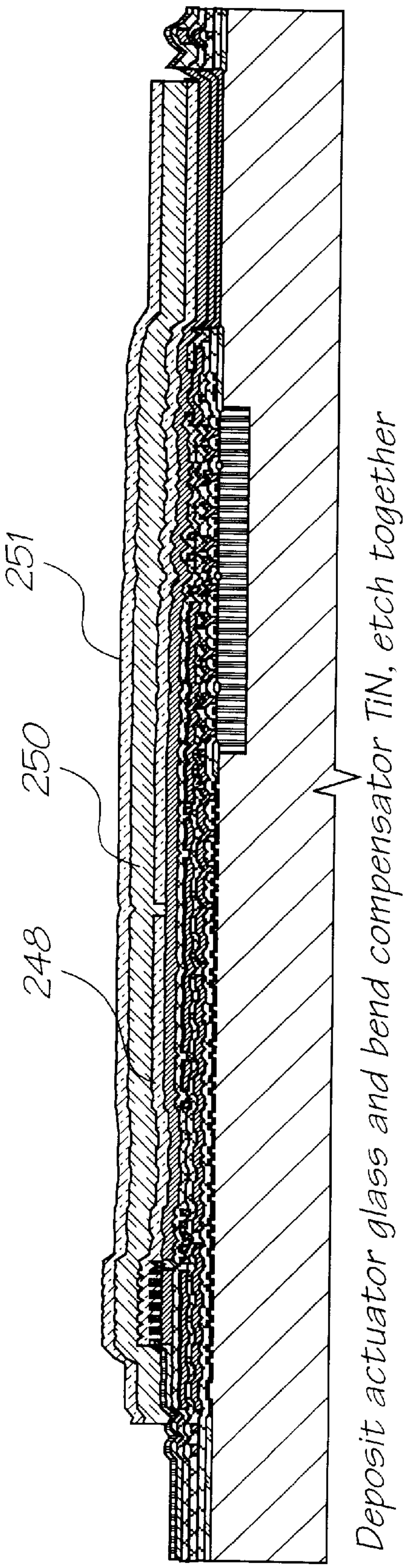
FIG. 57 illustrates a sectional view showing the effect of depositing an actuator glass and bend compensator titanium nitride after etching.
Figure 58:
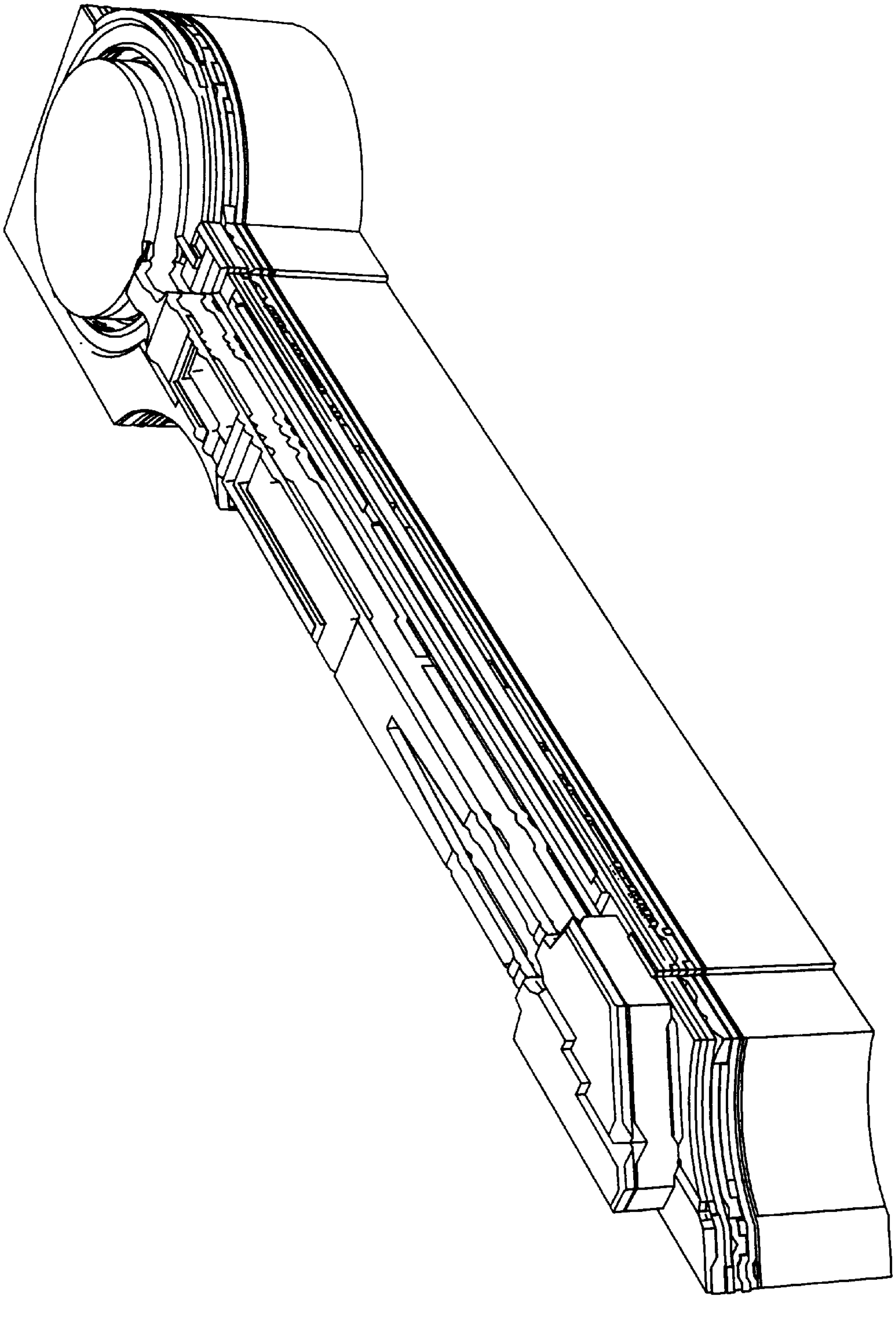
FIG. 58 illustrates a side perspective view partly in section of a single nozzle after depositing and etching the actuator glass and bend compensator titanium nitride layers.
Figure 59:
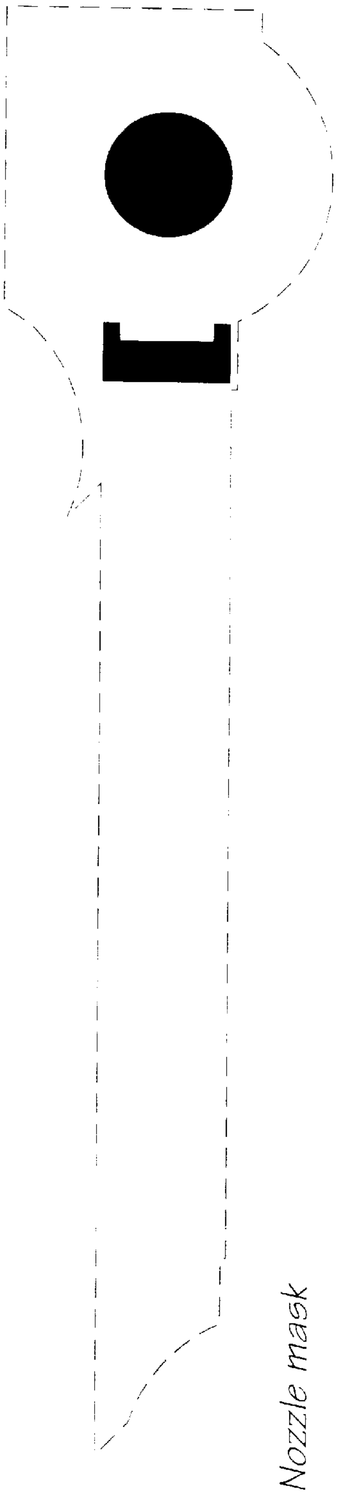
FIG. 59 illustrates a nozzle mask.
Figure 60:
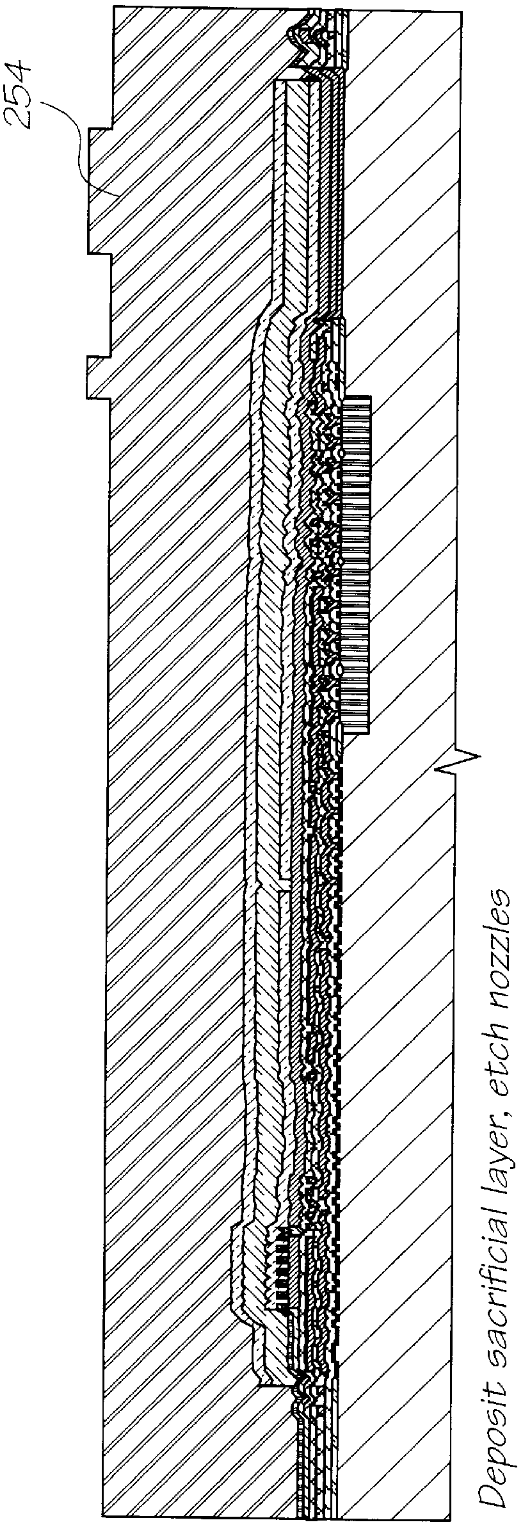
FIG. 60 illustrates a sectional view showing the effect of depositing a sacrificial layer and etching nozzles.
Figure 61:
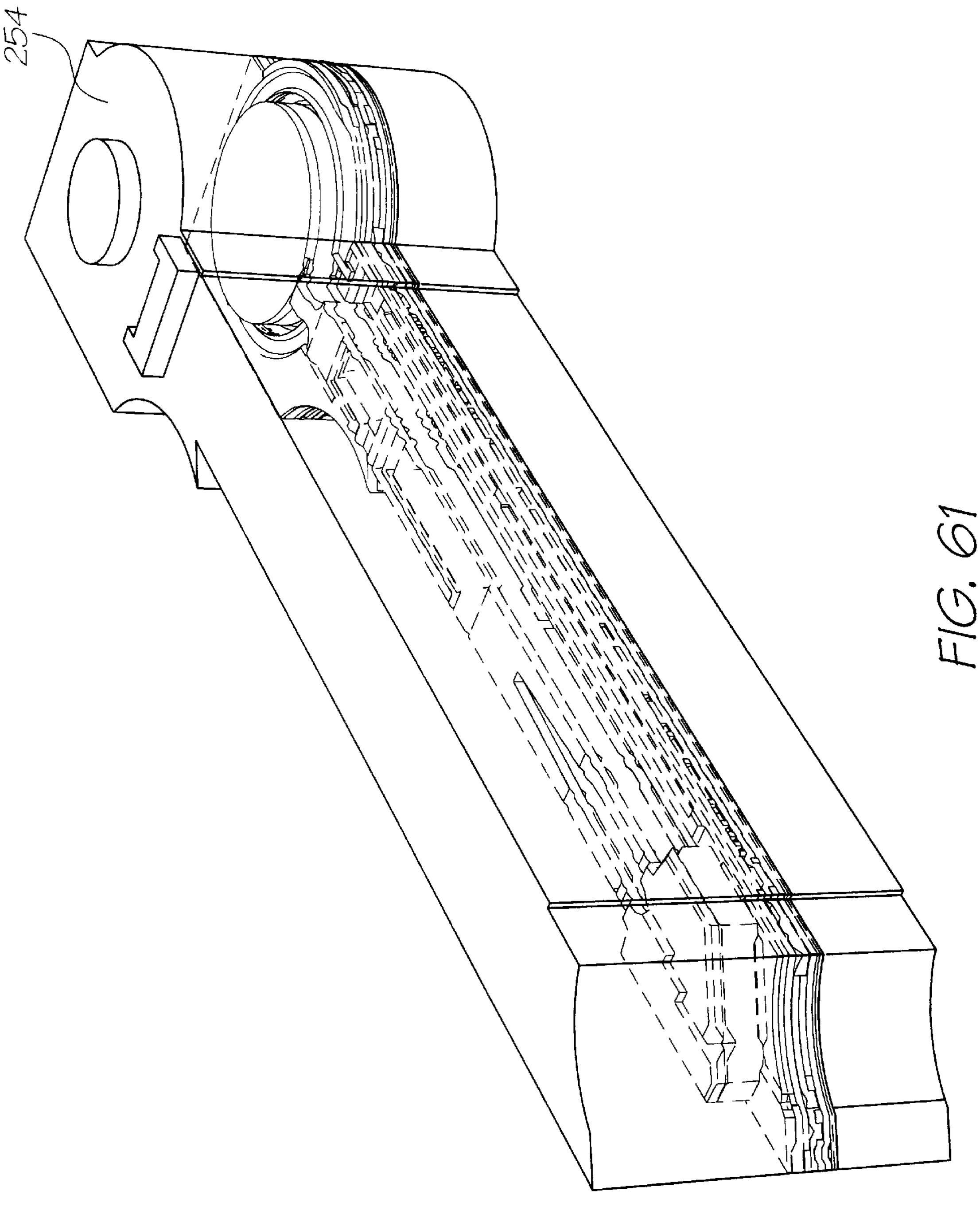
FIG. 61 illustrates a side perspective view partly in section of a single nozzle after depositing and initially etching the sacrificial layer.
Figure 62:
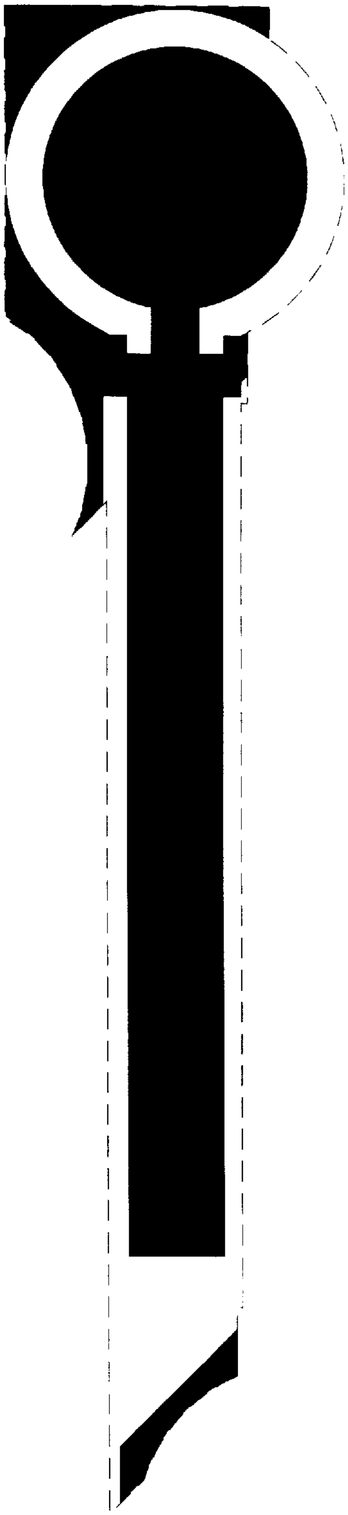
FIG. 62 illustrates a nozzle chamber mask.
Figure 63:
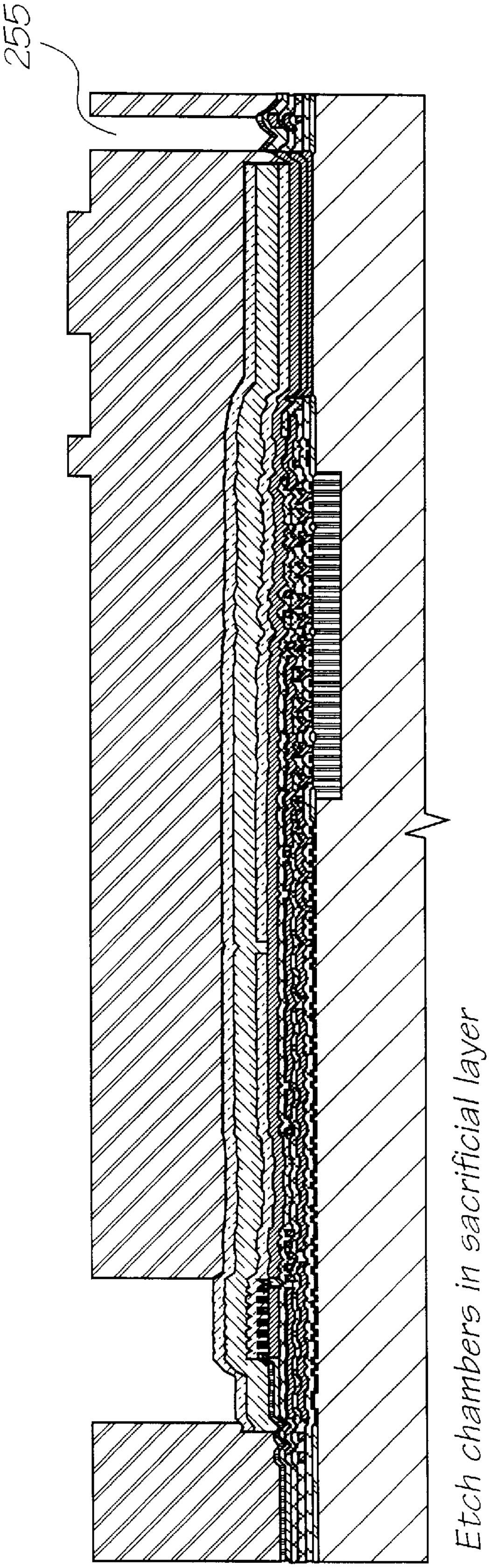
FIG. 63 illustrates a sectional view showing etched chambers in the sacrificial layer.
Figure 64:
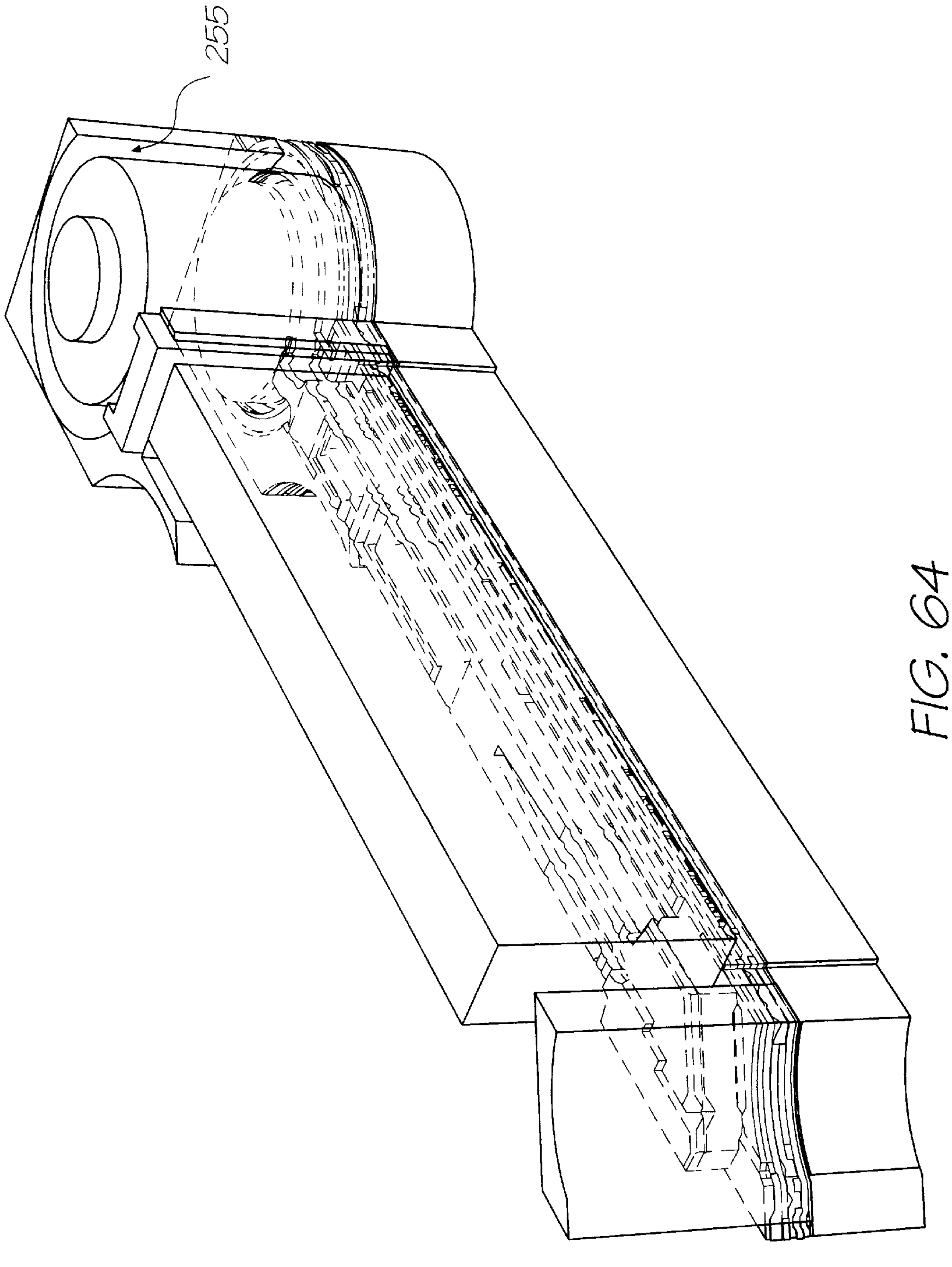
FIG. 64 illustrates a side perspective view partly in section of a single nozzle after further etching of the sacrificial layer.
Figure 65:
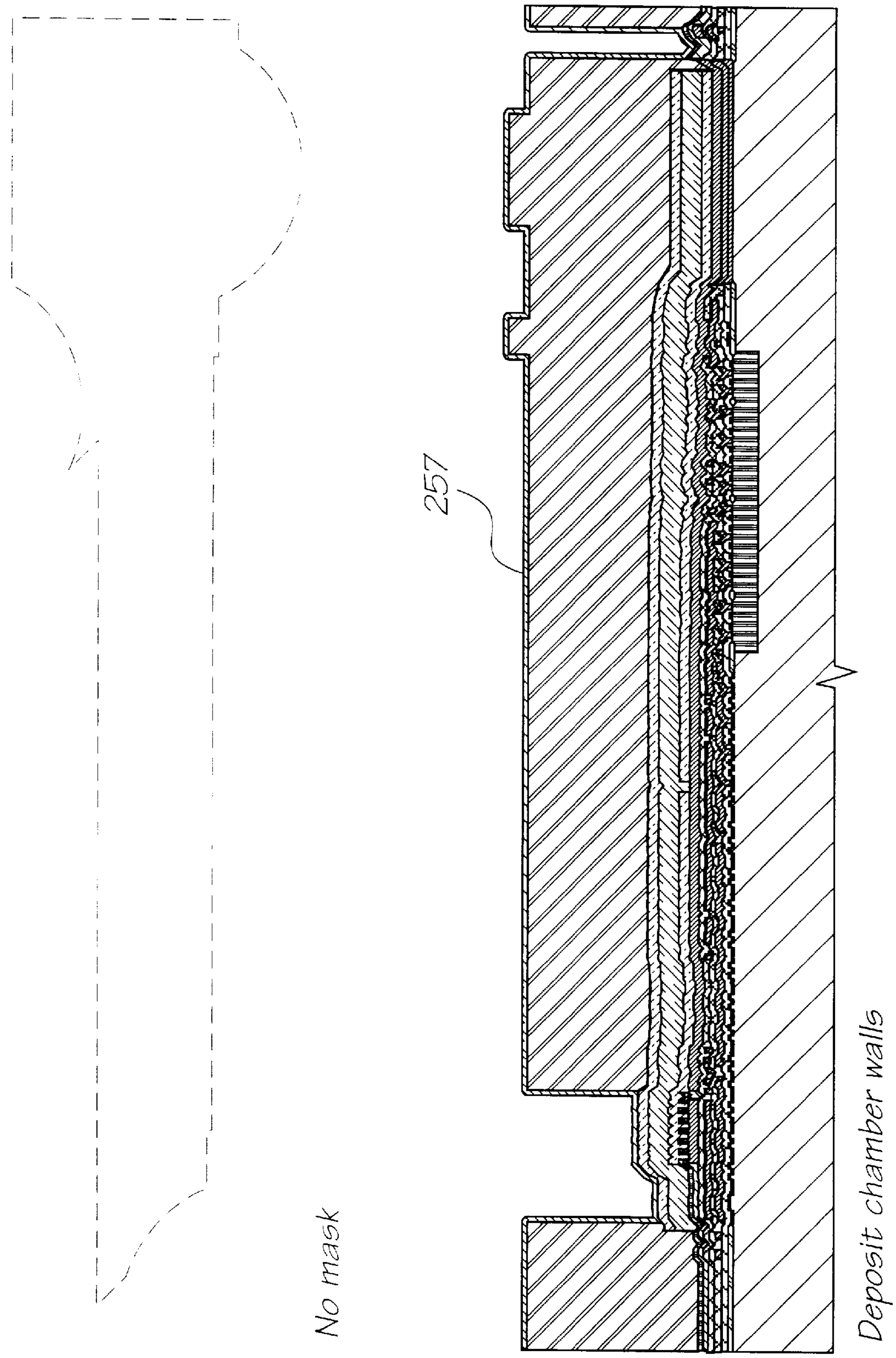
FIG. 65 illustrates a sectional view showing a deposited layer for nozzle chamber walls.
Figure 66:
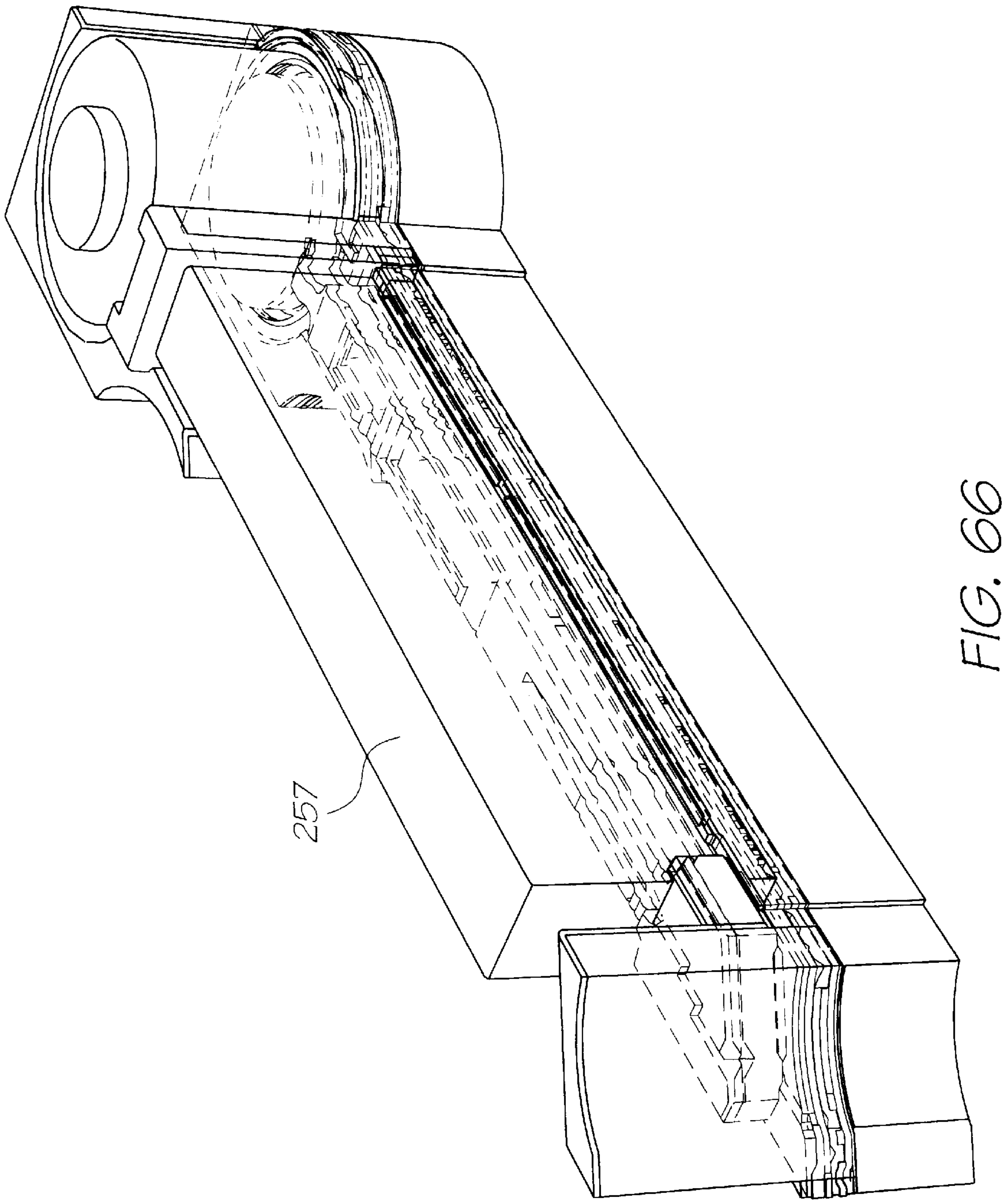
FIG. 66 illustrates a side perspective view partly in section of a single nozzle after further deposition of the nozzle chamber walls.

18. Etch the contact cuts using the via 1 mask shown in FIG. 40. The nozzle region is treated as a single large via region, and again it will not pass DRC.
19. Deposit 0.6 microns of aluminum to form metal 2.
20. Etch the aluminum using the metal 2 mask shown in FIG. 42 so as to form metal portions e.g. 230 shown in FIG. 43. A nozzle region 231 is fully covered with metal 2. This aluminum is sacrificial, and is etched as part of the MEMS sequence. The inclusion of metal 2 in the nozzle is not essential, but helps reduce the step in the neck region of the actuator lever arm. Sacrificial metal 2 is also used for another fluid control feature. A relatively large rectangle of metal 2 is included in the neck region 233 of the nozzle chamber. This is connected to the sacrificial metal 3, so is also removed during the MEMS sacrificial aluminum etch. This undercuts the lower rim of the nozzle chamber entrance for the actuator (which is formed from ILD 3). The undercut adds 90 degrees to angle of the fluid control surface, and thus increases the ability of this rim to prevent ink surface spread.
21. Deposit 0.7 microns of PECVD TEOS glass to form ILD 3.
22. Etch the contact cuts using the via 2 mask shown in FIG. 45 so as to leave portions e.g. 236 shown in FIG. 46. As well as the nozzle chamber, fluid control rims are also formed in ILD 3. These will also not pass DRC.
23. Deposit 1.0 microns of aluminum to form metal 3.
24. Etch the aluminum using the metal 3 mask shown in FIG. 47 so as to leave portions e.g. 238 as shown in FIG. 48. Most of metal 3 e.g. 239 is a sacrificial layer used to separate the actuator and paddle from the chip surface. Metal 3 is also used to distribute V+ over the chip. The nozzle region is fully covered with metal 3 e.g. 240. This aluminum is sacrificial, and is etched as part of the MEMS sequence. The inclusion of metal 3 in the nozzle is not essential, but helps reduce the step in the neck region of the actuator lever arm.
25. Deposit 0.5 microns of PECVD TEOS glass to form the overglass.
26. Deposit 0.5 microns of $Si_3N_4$ to form the passivation layer.
27. Etch the passivation and overglass using the via 3 mask shown in FIG. 50 so as to form the arrangement of FIG. 51. This mask includes access 242 to the metal 3 sacrificial layer, and the vias e.g. 243 to the heater actuator. Lithography of this step has 0.6 micron critical dimensions (for the heater vias) instead of the normally relaxed lithography used for opening bond pads. This is the one process step which is different from the normal CMOS process flow. This step may either be the last process step of the CMOS process, or the first step of the MEMS process, depending upon the fab setup and transport requirements.
28. Wafer Probe. Much, but not all, of the functionality of the chips can be determined at this stage. If more complete testing at this stage is required, an active dummy load can be included on chip for each drive transistor. This can be achieved with minor chip area penalty, and allows complete testing of the CMOS circuitry.
29. Transfer the wafers from the CMOS facility to the MEMS facility. These may be in the same fab, or may be distantly located.
30. Deposit 0.9 microns of magnetron sputtered TN. Voltage is −65V, magnetron current is 7.5 A, argon gas pressure is 0.3 Pa, temperature is 300° C. This results in a coefficient of thermal expansion of $9.4 \times 10^{-6}/°$ C., and a Young's modulus of 600 GPa [Thin Solid Films 270 p 266, 1995], which are the key thin film properties used.
31. Etch the TN using the heater mask shown in FIG. 53. This mask defines the heater element, paddle arm, and paddle. There is a small gap 247 shown in FIG. 54 between the heater and the TN layer of the paddle and paddle arm. This is to prevent electrical connection between the heater and the ink, and possible electrolysis problems. Sub-micron accuracy is required in this step to maintain a uniformity of heater characteristics across the wafer. This is the main reason that the heater is not etched simultaneously with the other actuator layers. CD for the heater mask is 0.5 microns. Overlay accuracy is +/−0.1 microns. The bond pads are also covered with this layer of bend due to thermal stress, and results in the glass being under constant compressive stress, which increases the efficiency of the actuator.
33. Deposit 0.9 microns of magnetron sputtered TiN. This layer is deposited to cancel bend from the differential thermal stress of the lower TiN and glass layers, and to prevent the paddle from curling when released from the sacrificial materials. The deposition characteristics should be identical to the first TiN layer.
34. Anisotropically plasma etch the TiN and glass using actuator mask as shown in FIG. 56. This mask defines the actuator and paddle. CD for the actuator mask is 1 micron. Overlay accuracy is +/−0.1 microns. The results of the etching process is illustrated in FIG. 57 with the glass layer 250 sandwiched between TiN layers 251, 248.
35. Electrical testing can be performed by wafer probing at this time. All CMOS tests and heater functionality and resistance tests can be completed at wafer probe.
36. Deposit 15 microns of sacrificial material. There are many possible choices for this material. The essential requirements are the ability to deposit a 15 micron layer without excessive wafer warping, and a high etch selectivity to PECVD glass and TiN. Several possibilities are phosphosilicate glass (PSG), borophosphosilicate glass (BPSG), polymers such as polyimide, and aluminum. Either a close CTE match to silicon (BPSG with the correct doping, filled polyimide) or a low Young's modulus (aluminum) is required. This example uses BPSG. Of these issues, stress is the most demanding due to the extreme layer thickness. BPSG normally has a CTE well below that of silicon, resulting in considerable compressive stress. However, the composition of BPSG can be varied significantly to adjust its CTE close to that of silicon. As the BPSG is a sacrificial layer, its electrical properties are not relevant, and compositions not normally suitable as a CMOS dielectric can be used. Low density, high porosity, and a high water content are all beneficial characteristics as they will increase the etch selectivity versus PECVD glass when using an anhydrous HF etch.
37. Etch the sacrificial layer to a depth of 2 microns using the nozzle mask as defined in FIG. 59 so as to form the structure 254 illustrated in section in FIG. 60. The mask of FIG. 59 defines all of the regions where a subsequently deposited overcoat is to be polished off using CMP. This includes the nozzles themselves, and various other fluid control features. CD for the nozzle mask is 2 microns. Overlay accuracy is +/−0.5 microns.
38. Anisotropically plasma etch the sacrificial layer down to the CMOS passivation layer using the chamber mask as illustrated in FIG. 62. This mask defines the nozzle chamber and actuator shroud including slots 255 as shown in FIG. 63. CD for the chamber mask is 2 microns. Overlay accuracy is +/−0.2 microns.
39. Deposit 0.5 microns of fairly conformal overcoat material 257 as illustrated in FIG. 65. The electrical properties of this material are irrelevant, and it can be a conductor, insulator, or semiconductor. The material should be: chemically inert, strong, highly selective etch with respect to the sacrificial material, be suitable for CMP, and be suitable for conformal deposition at temperatures below 500° C. Suitable materials include: PECVD glass, MOCVD TiN, ECR CVD TiN, PECVD $Si_3N_4$, and many others. The choice for this example is PECVD TEOS glass. This must have a very low water content if BPSG is used as the sacrificial material and anhydrous HF is used as the sacrificial etchant, as the anhydrous HF etch relies on water content to achieve 1000:1 etch selectivity of BPSG over TEOS glass. The conformed overcoat 257 forms a protective covering shell around the operational portions of the thermal bend actuator while permitting movement of the actuator within the shell.

Figure 67:
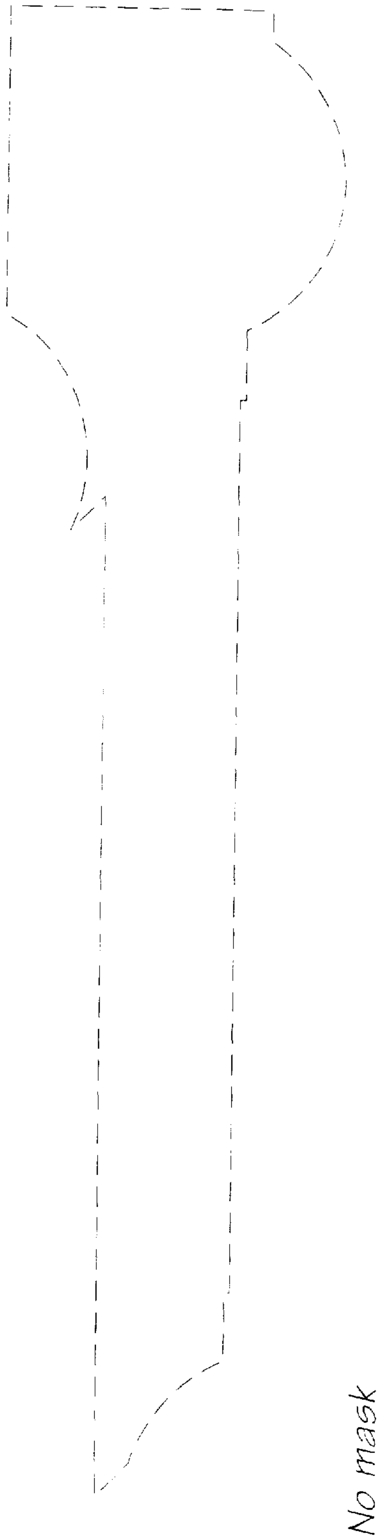
FIG. 67 illustrates a sectional view showing a process of creating self aligned nozzles using Chemical Mechanical Planarization (CMP)
Figure 67:
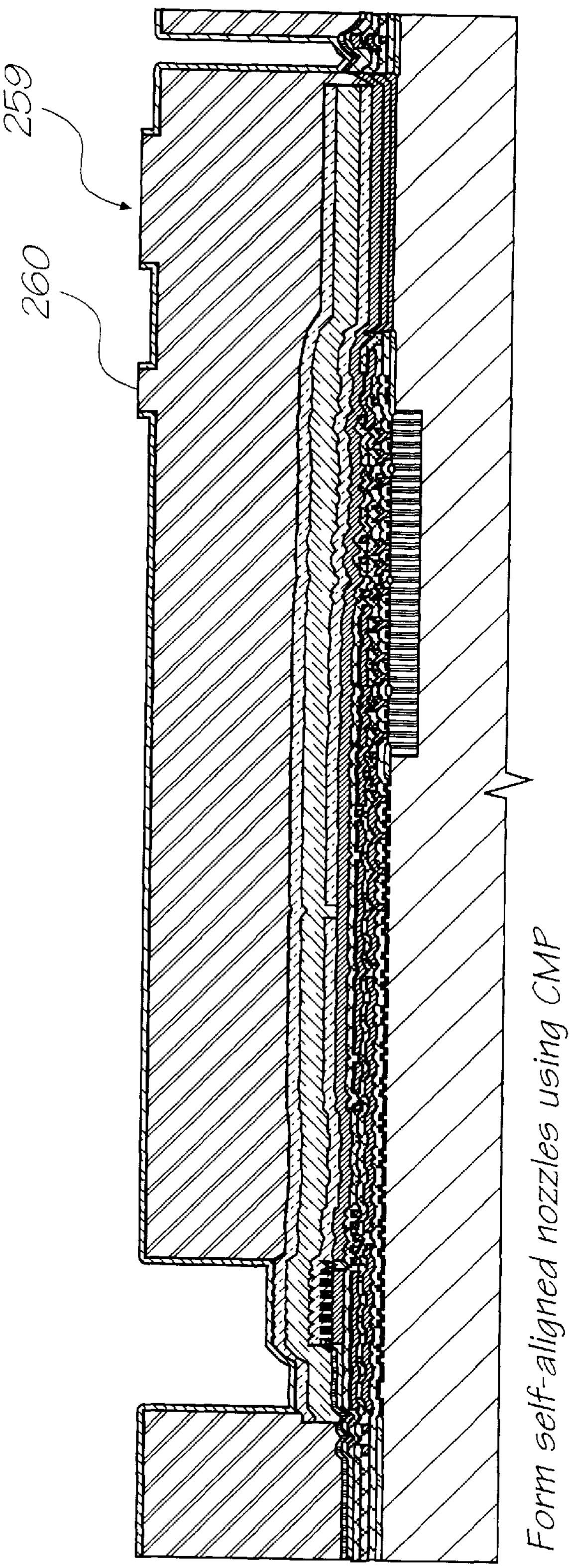
Figure 68:
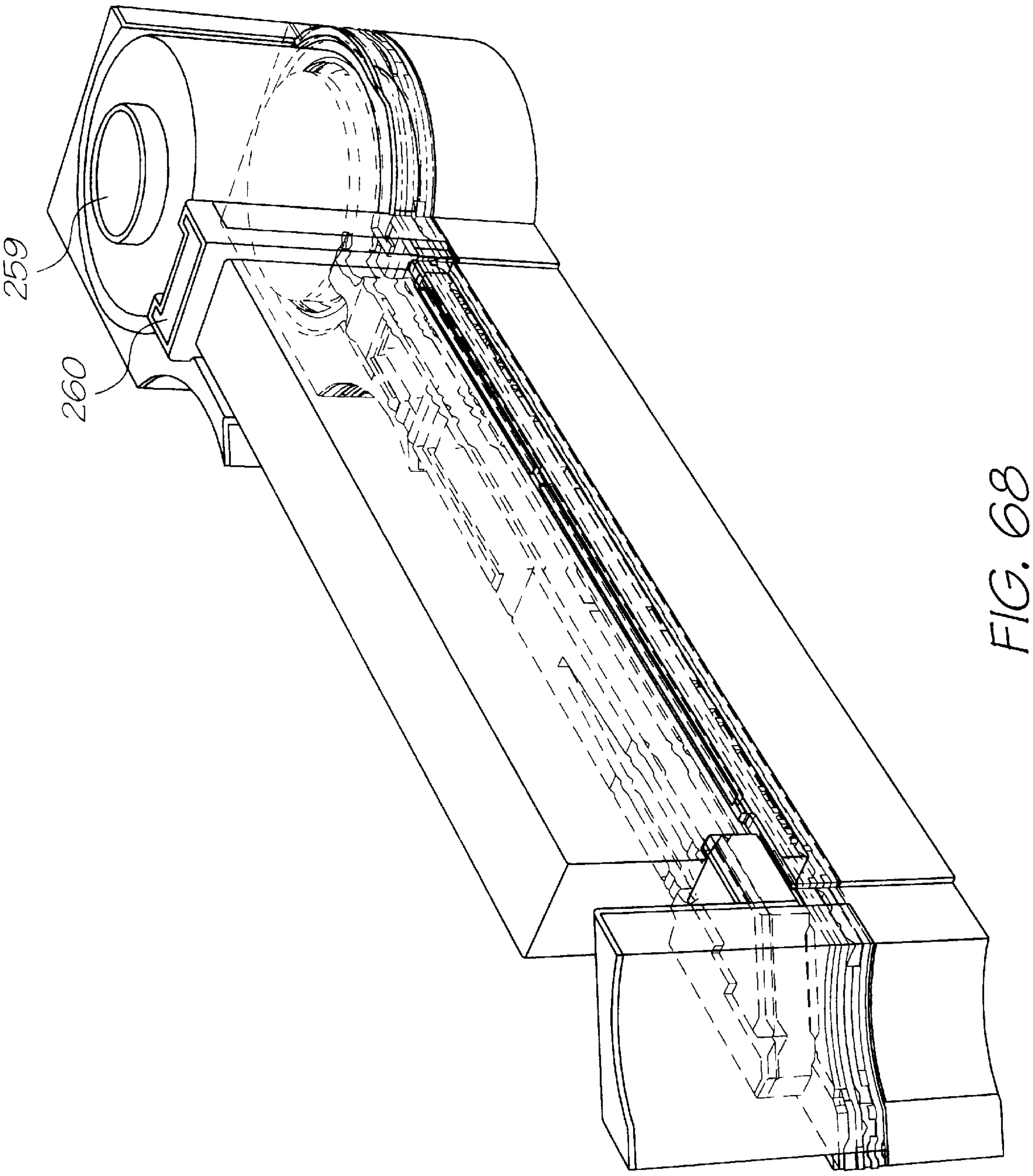
FIG. 68 illustrates a side perspective view partly in section of a single nozzle after CMP of the nozzle chamber walls.
Figure 70:
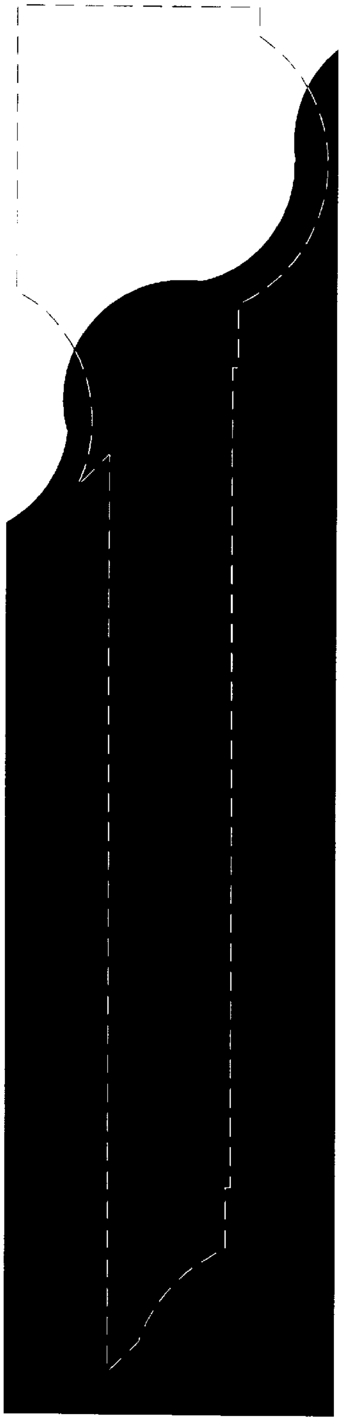
FIG. 70 illustrates a back etch inlet mask.
Figure 69:
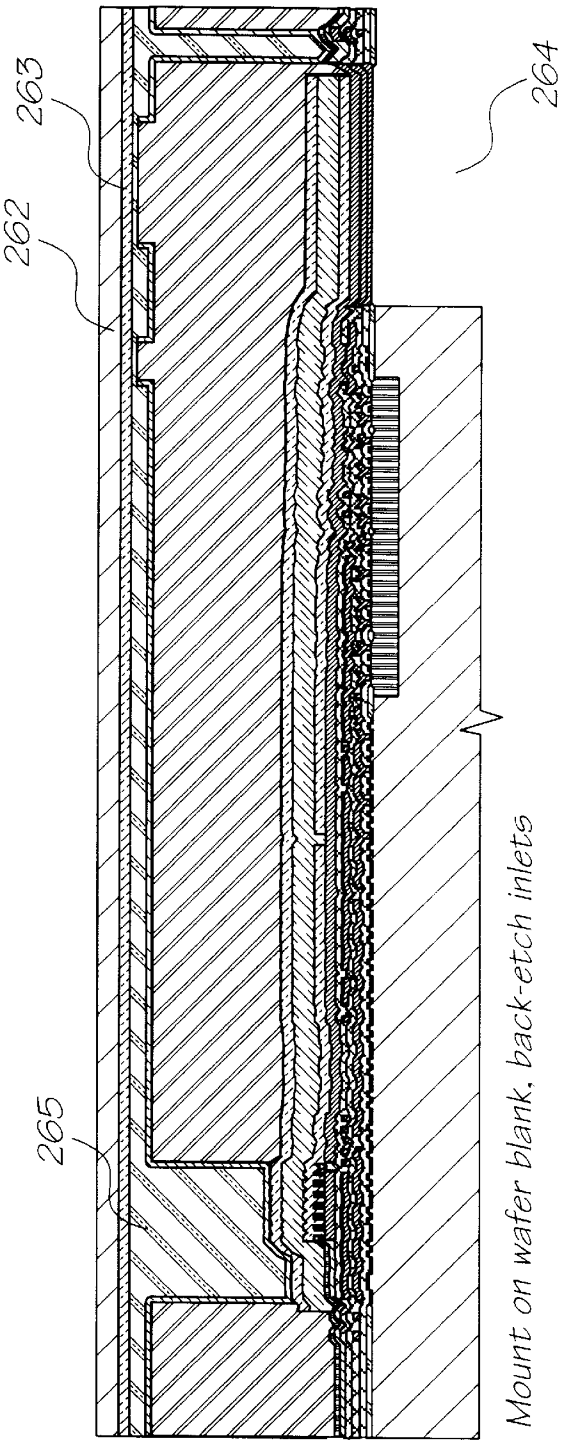
FIG. 69 illustrates a sectional view showing the nozzle mounted on a wafer blank.
Figure 71:
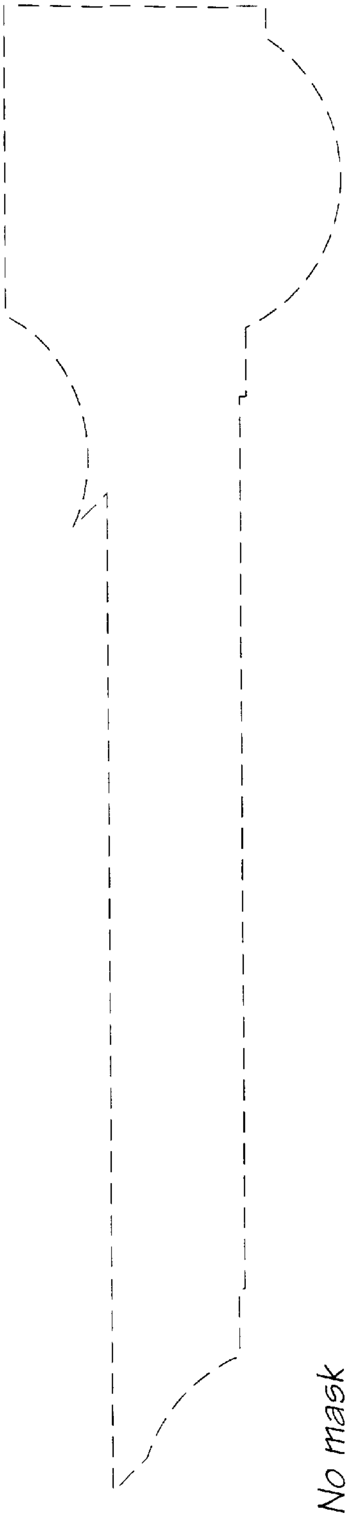
FIG. 71 illustrates a sectional view showing the sacrificial layers etched away.
Figure 71:
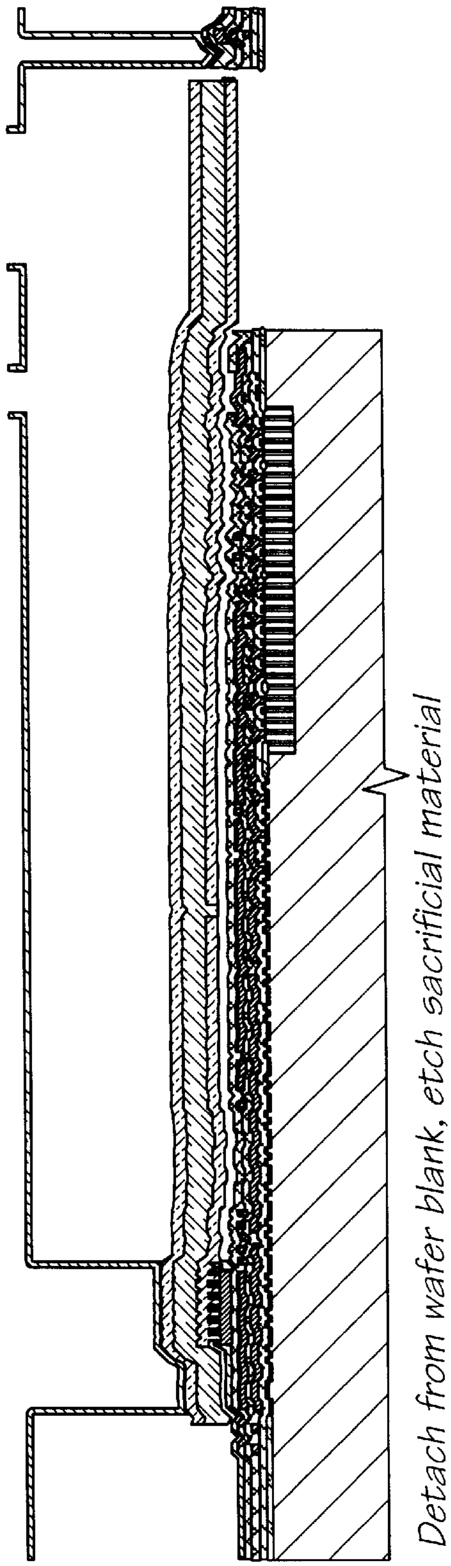
Figure 72:
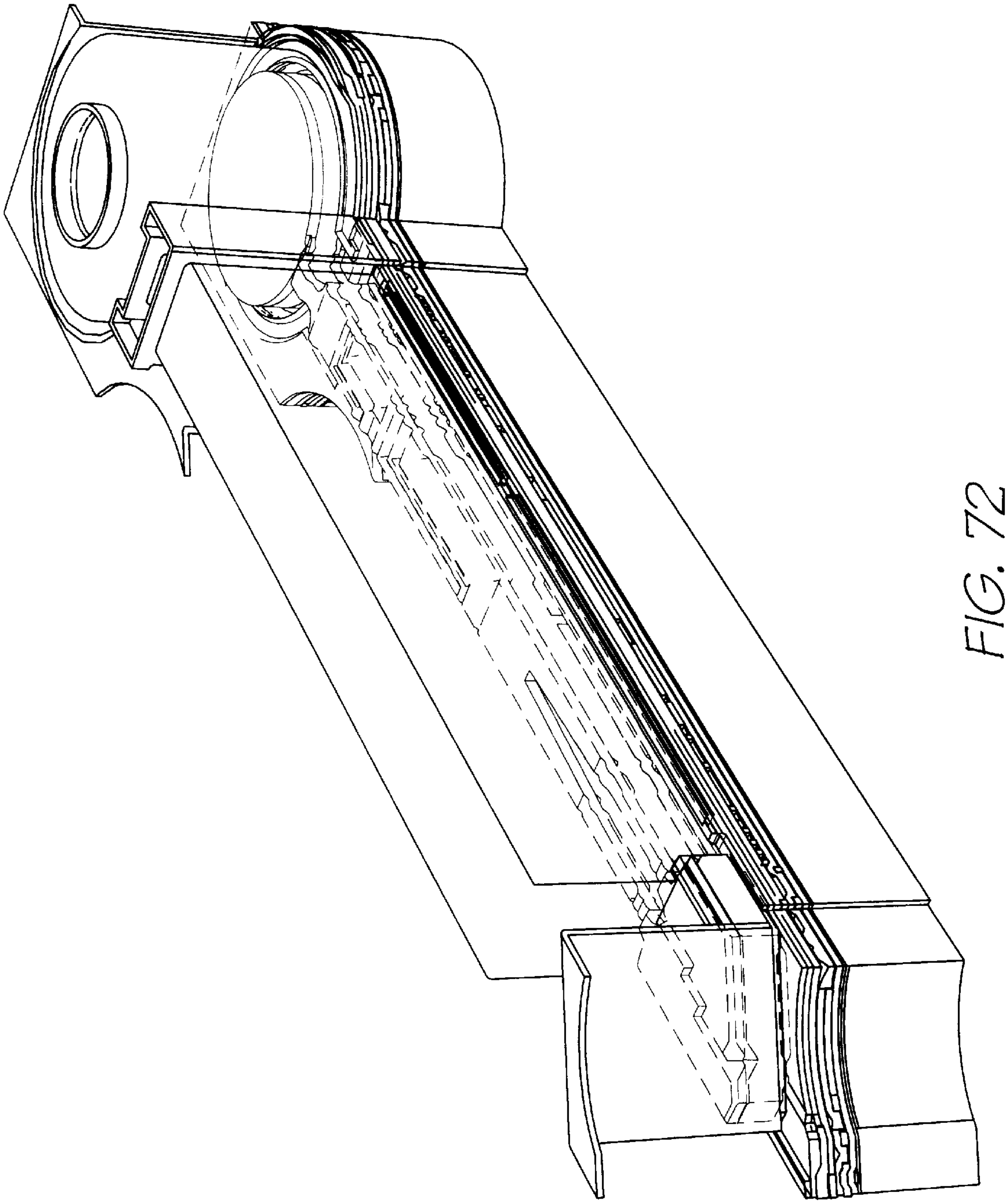
FIG. 72 illustrates a side perspective view partly in section of a single nozzle after etching away of the sacrificial layers.
Figure 73:
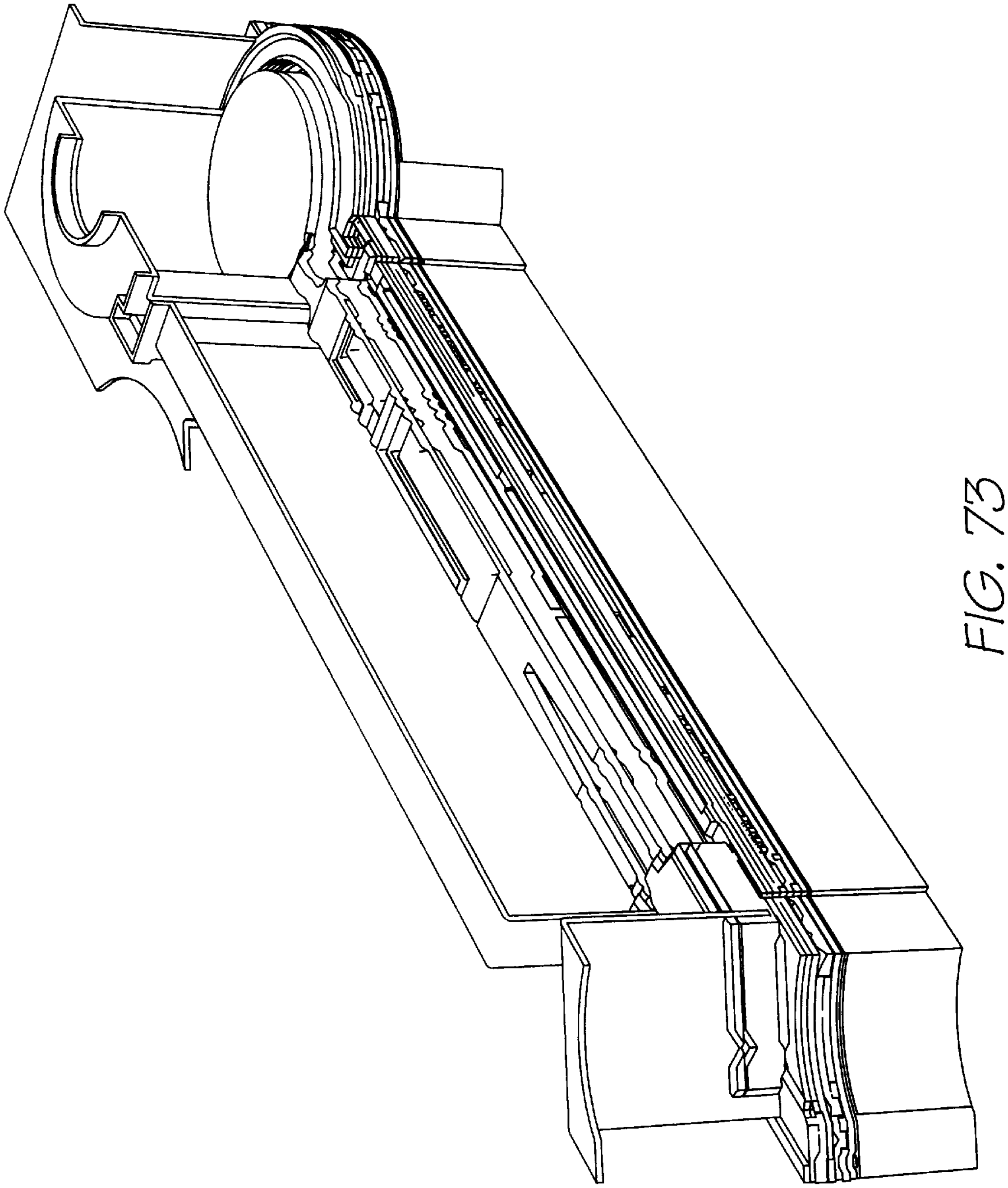
FIG. 73 illustrates a side perspective view partly in section of a single nozzle after etching away of the sacrificial layers taken along a different section line.
Figure 74:
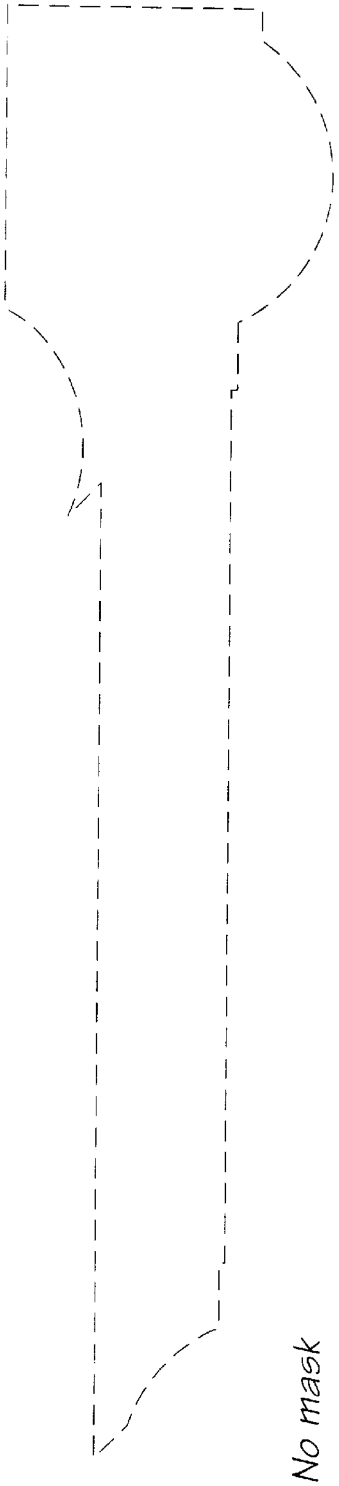
FIG. 74 illustrates a sectional view showing a nozzle filled with ink.
Figure 74:
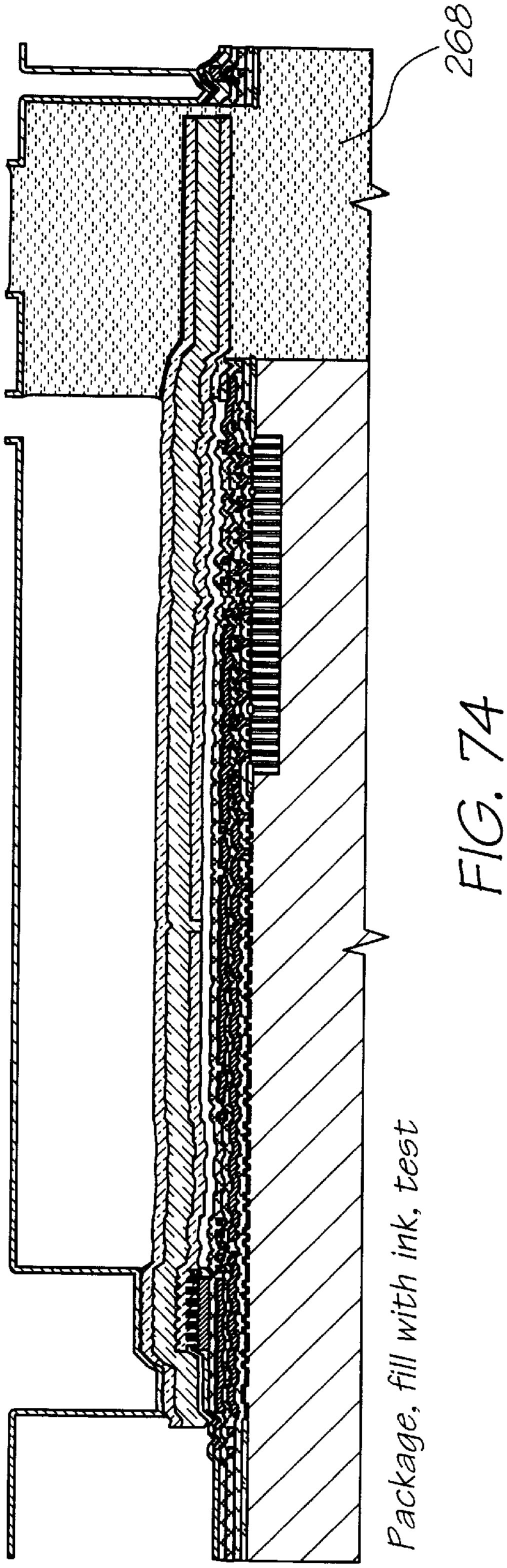
Figure 75:
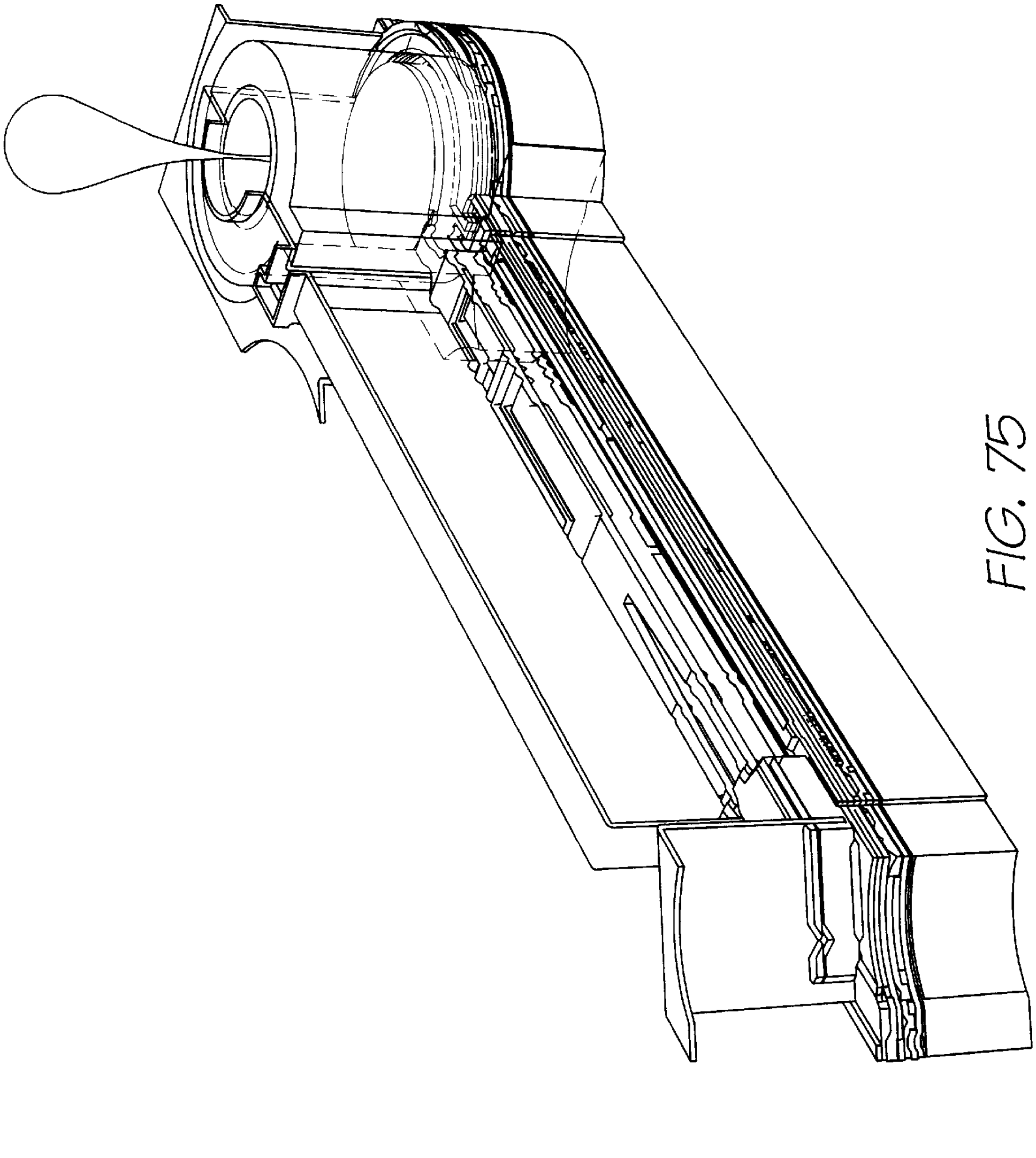
FIG. 75 illustrates a side perspective view partly in section of a single nozzle ejecting ink.

40. Planarize the wafe; to a depth of 1 micron using CMP as illustrated in FIG. 67. The CMP processing should be maintained to an accuracy of +/−0.5 microns over the wafer surface. Dishing of the sacrificial material is not relevant. This opens the nozzles 259 and fluid control regions e.g. 260. The rigidity of the sacrificial layer relative to the nozzle chamber structures during CMP is one of the key factors which may affect the choice of sacrificial materials.
41. Turn the print head wafer over and securely mount the front surface on an oxidized silicon wafer blank 262 illustrated in FIG. 69 having an oxidized surface 263. The mounting can be by way of glue 265. The blank wafers 262 can be recycled.
42. Thin the print head wafer to 300 microns using back-grinding (or etch) and polish. The wafer thinning is performed to reduce the subsequent processing duration for deep silicon etching from around 5 hours to around 2.3 hours. The accuracy of the deep silicon etch is also improved, and the hard-mask thickness is halved to 2.5 microns. The wafers could be thinned further to improve etch duration and print head efficiency. The limitation to wafer thickness is the print head fragility after sacrificial BPSG etch.
43. Deposit a $Sio_2$ hard mask (2.5 microns of PECVD glass) on the backside of the wafer and pattern using the inlet mask as shown in FIG. 67. The hard mask of FIG. 67 is used for the subsequent deep silicon etch, which is to a depth of 315 microns with a hard mask selectivity of 150:1. This mask defines the ink inlets, which are etched through the wafer. CD for the inlet mask is 4 microns. Overlay accuracy is +/−2 microns. The inlet mask is undersize by 5.25 microns on each side to allow for a re-entrant etch angle of 91 degrees over a 300 micron etch depth. Lithography for this step uses a mask aligner instead of a stepper. Alignment is to patterns on the front of the wafer. Equipment is readily available to allow sub-micron front-to-back alignment.
44. Back-etch completely through the silicon wafer (using, for example, an ASE Advanced Silicon Etcher from Surface Technology Systems) through the previously deposited hard mask. The STS ASE is capable of etching highly accurate holes through the wafer with aspect ratios of 30:1 and sidewalls of 90 degrees. In this case, a re-entrant sidewall angle of 91 degrees is taken as nominal. A re-entrant angle is chosen because the ASE performs better, with a higher etch rate for a given accuracy, with a slightly re-entrant angle. Also, a re-entrant etch can be compensated by making the holes on the mask undersize. Non-re-entrant etch angles cannot be so easily compensated, because the mask holes would merge. The wafer is also preferably diced by this etch. The final result is as illustrated in FIG. 69 including back etched ink channel portions 264.
45. Etch all exposed aluminum. Aluminum on all three layers is used as sacrificial layers in certain places.
46. Etch all of the sacrificial material. The nozzle chambers are cleared by this etch with the result being as shown in FIG. 71. If BPSG is used as the sacrificial material, it can be removed without etching the CMOS glass layers or the actuator glass. This can be achieved with 1000:1 selectivity against undoped glass such as TEOS, using anhydrous HF at 1500 sccm in a $N_2$ atmosphere at 60° C. [L. Chang et al, "Anhydrous HF etch reduces processing steps for DRAM capacitors", Solid State Technology Vol. 41 No. 5, pp 71–76, 1998]. The actuators are freed and the chips are separated from each other, and from the blank wafer, by this etch. If aluminum is used as the sacrificial layer instead of BPSG, then its removal is combined with the previous step, and this step is omitted.
47. Pick up the loose print heads with a vacuum probe, and mount the print heads in their packaging. This must be done carefully, as the unpackaged print heads are fragile. The front surface of the wafer is especially fragile, and should not be touched. This process should be performed manually, as it is difficult to automate. The package is a custom injection molded plastic housing incorporating ink channels that supply the appropriate color ink to the ink inlets at the back of the print head. The package also provides mechanical support to the print head. The package is especially designed to place minimal stress on the chip, and to distribute that stress evenly along the length of the package. The print head is glued into this package with a compliant sealant such as silicone.
48. Form the external connections to the print head chip. For a low profile connection with minimum disruption of airflow, tape automated bonding (TAB) may be used. Wire bonding may also be used if the printer is to be operated with sufficient clearance to the paper. All of the bond pads are along one 100 mm edge of the chip. There are a total of 504 bond pads, in 8 identical groups of 63 (as the chip is fabricated using 8 stitched stepper steps). Each bond pad is 100×100 micron, with a pitch of 200 micron. 256 of the bond pads are used to provide power and ground connections to the actuators, as the peak current is 6.58 Amps at 3V. There are a total of 40 signal connections to the entire print head (24 data and 16 control), which are mostly bussed to the eight identical sections of the print head.
49. Hydrophobize the front surface of the print heads. This can be achieved by the vacuum deposition of 50 nm or more of polytetrafluoroethylene (PTFE). However, there are also many other ways to achieve this. As the fluid is fully controlled by mechanical protuberances formed in previous steps, the hydrophobic layer is an 'optional extra' to prevent ink spreading on the surface if the print head becomes contaminated by dust.
50. Plug the print heads into their sockets. The socket provides power, data, and ink. The ink fills the print-head by capillarity. Allow the completed print heads to fill with ink, and test. FIG. 74 illustrates the filling of ink 268 into the nozzle chamber.

Process Parameters used for this Implementation Example

The CMOS process parameters utilized can be varied to suit any CMOS process of 0.5 micron dimensions or better. The MEMS process parameters should not be varied beyond the tolerances shown below. Some of these parameters affect the actuator performance and fluidics, while others have more obscure relationships. For example, the wafer thin stage affects the cost and accuracy of the deep silicon etch, the thickness of the back-side hard mask, and the dimensions of the associated plastic ink channel molding. Suggested process parameters can be as follows:

| Parameter | Type | Min. | Nom. | Max. | Units | Tol. |
|---|---|---|---|---|---|---|
| Wafer resistivity | CMOS | 15 | 20 | 25 | Ω cm | ±25% |
| Wafer thickness | CMOS | 600 | 650 | 700 | μm | ±8% |
| N-Well Junction depth | CMOS | 2 | 2.5 | 3 | μm | ±20% |
| n+ Junction depth | CMOS | 0.15 | 0.2 | 0.25 | μm | ±25% |
| p+ Junction depth | CMOS | 0.15 | 0.2 | 0.25 | μm | ±25% |
| Field oxide thickness | CMOS | 0.45 | 0.5 | 0.55 | μm | ±10% |
| Gate oxide thickness | CMOS | 12 | 13 | 14 | nm | ±7% |
| Poly thickness | CMOS | 0.27 | 0.3 | 0.33 | μm | ±10% |
| ILD 1 thickness (PECVD glass) | CMOS | 0.5 | 0.6 | 0.7 | μm | ±16% |
| Metal 1 thickness (aluminum) | CMOS | 0.55 | 0.6 | 0.65 | μm | ±8% |
| ILD 2 thickness (PECVD glass) | CMOS | 0.6 | 0.7 | 0.8 | μm | ±14% |
| Metal 2 thickness (aluminum) | CMOS | 0.55 | 0.6 | 0.65 | μm | ±8% |
| ILD 3 thickness (PECVD glass) | CMOS | 0.6 | 0.7 | 0.8 | μm | ±14% |
| Metal 3 thickness (aluminum) | CMOS | 0.9 | 1.0 | 1.1 | μm | ±10% |
| Overcoat (PECVD glass) | CMOS | 0.4 | 0.5 | 0.6 | μm | ±20% |
| Passivation ($Si_3N_4$) | CMOS | 0.4 | 0.5 | 0.6 | μm | ±20% |
| Heater thickness (TiN) | MEMS | 0.85 | 0.9 | 0.95 | μm | ±5% |
| Actuator thickness (PECVD glass) | MEMS | 1.9 | 2.0 | 2.1 | μm | ±5% |
| Bend compensator thickness (TiN) | MEMS | 0.85 | 0.9 | 0.95 | μm | ±5% |
| Sacrificial layer thickness (low stress BPSG) | MEMS | 13.5 | 15 | 16.5 | μm | ±10% |
| Nozzle etch (BPSG) | MEMS | 1.6 | 2.0 | 2.4 | μm | ±20% |
| Nozzle chamber and shroud (PECVD glass) | MEMS | 0.3 | 0.5 | 0.7 | μm | ±40% |
| Nozzle CMP depth | MEMS | 0.7 | 1 | 1.3 | μm | ±30% |
| Wafer thin (back-grind and polish) | MEMS | 295 | 300 | 305 | μm | ±1.6% |
| Back etch hard mask ($SiO_2$) | MEMS | 2.25 | 2.5 | 2.75 | μm | ±10% |
| STS ASE back-etch (stop on aluminum) | MEMS | 305 | 325 | 345 | μm | ±6% |

Control Logic

Figure 76:
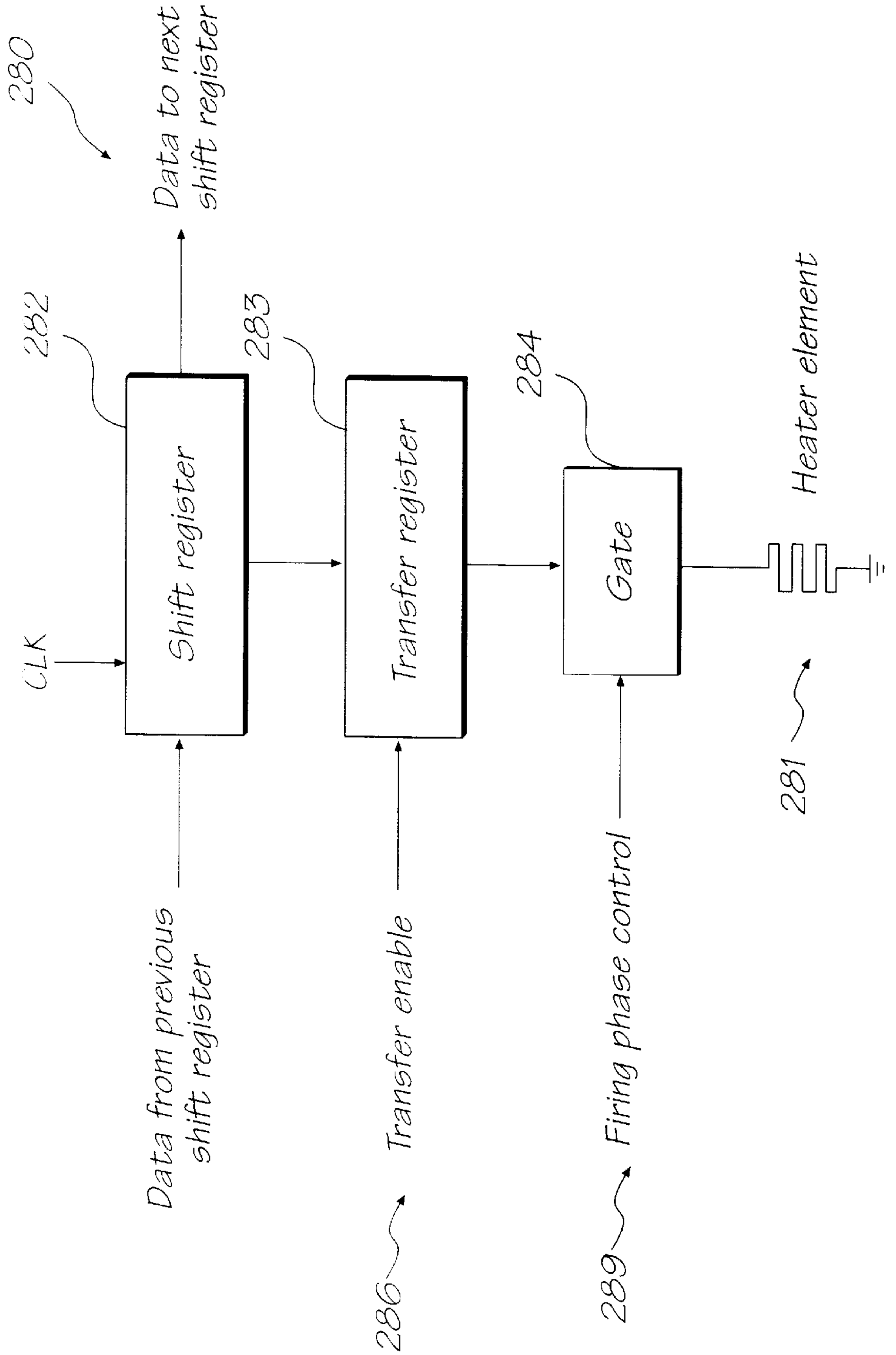
FIG. 76 illustrates a schematic of control logic for a single nozzle.

Turning over to FIG. 76, there is illustrated the associated control logic for a single ink jet nozzle. The control logic 280 is utilized to activate a heater element 281 on demand. The control logic 280 includes a shift register 282, a transfer register 283 and a firing control gate 284. The basic operation is to shift data from one shift register 282 to the next until it is in place. Subsequently, the data is transferred to a transfer register 283 upon activation of a transfer enable signal 286. The data is latched in the transfer register 283 and subsequently, a firing phase control signal 289 is utilized to activate a gate 284 for output of a heating pulse to heat an element 281.

Figure 77:
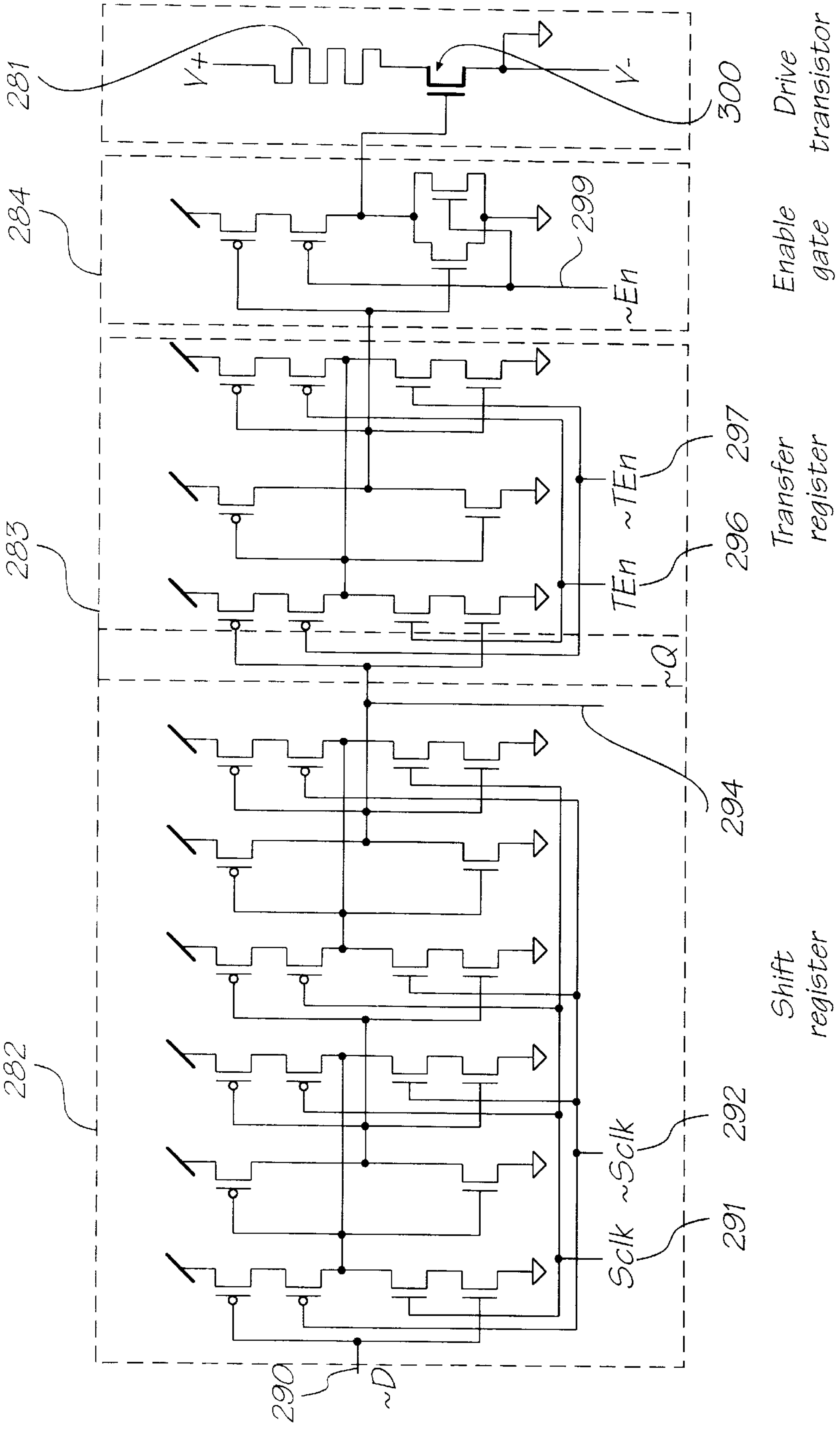
FIG. 77 illustrates a CMOS implementation of the control logic of a single nozzle.

As the preferred implementation utilizes a CMOS layer for implementation of all control circuitry, one form of suitable CMOS implementation of the control circuitry will now be described. Turning now to FIG. 77, there is illustrated a schematic block diagram of the corresponding CMOS circuitry. Firstly, shift register 282 takes an inverted data input and latches the input under control of shift clocking signals 291, 292. The data input 290 is output 294 to the next shift register and is also latched by a transfer register 283 under control of transfer enable signals 296, 297. The enable gate 284 is activated under the control of enable signal 299 so as to drive a power transistor 300 which allows for resistive heating of resistor 281. The functionality of the shift register 282, transfer register 283 and enable gate 284 are standard CMOS components well understood by those skilled in the art of CMOS circuit design.

Replicated Units

The ink jet print head can consist of a large number of replicated unit cells each of which has basically the same design. This design will now be discussed.

Figure 78:
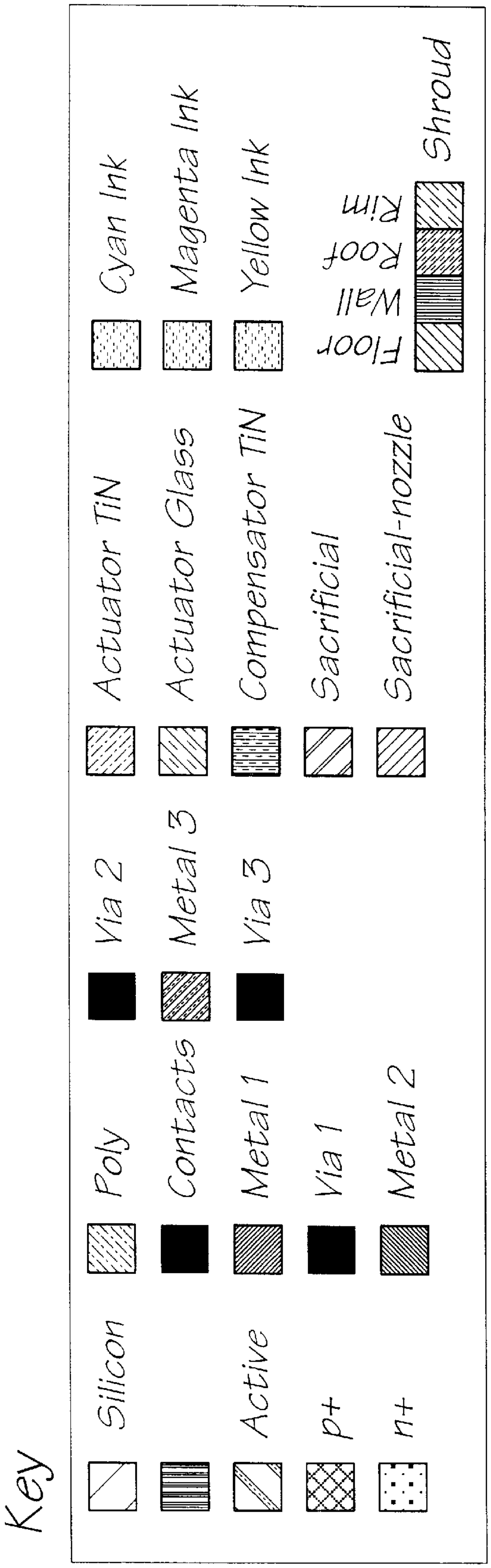
FIG. 78 illustrates a legend or key of the various layers utilized in the described CMOS/MEMS implementation.

Turning initially to FIG. 78, there is illustrated a general key or legend of different material layers utilized in subsequent discussions.

Figure 79:
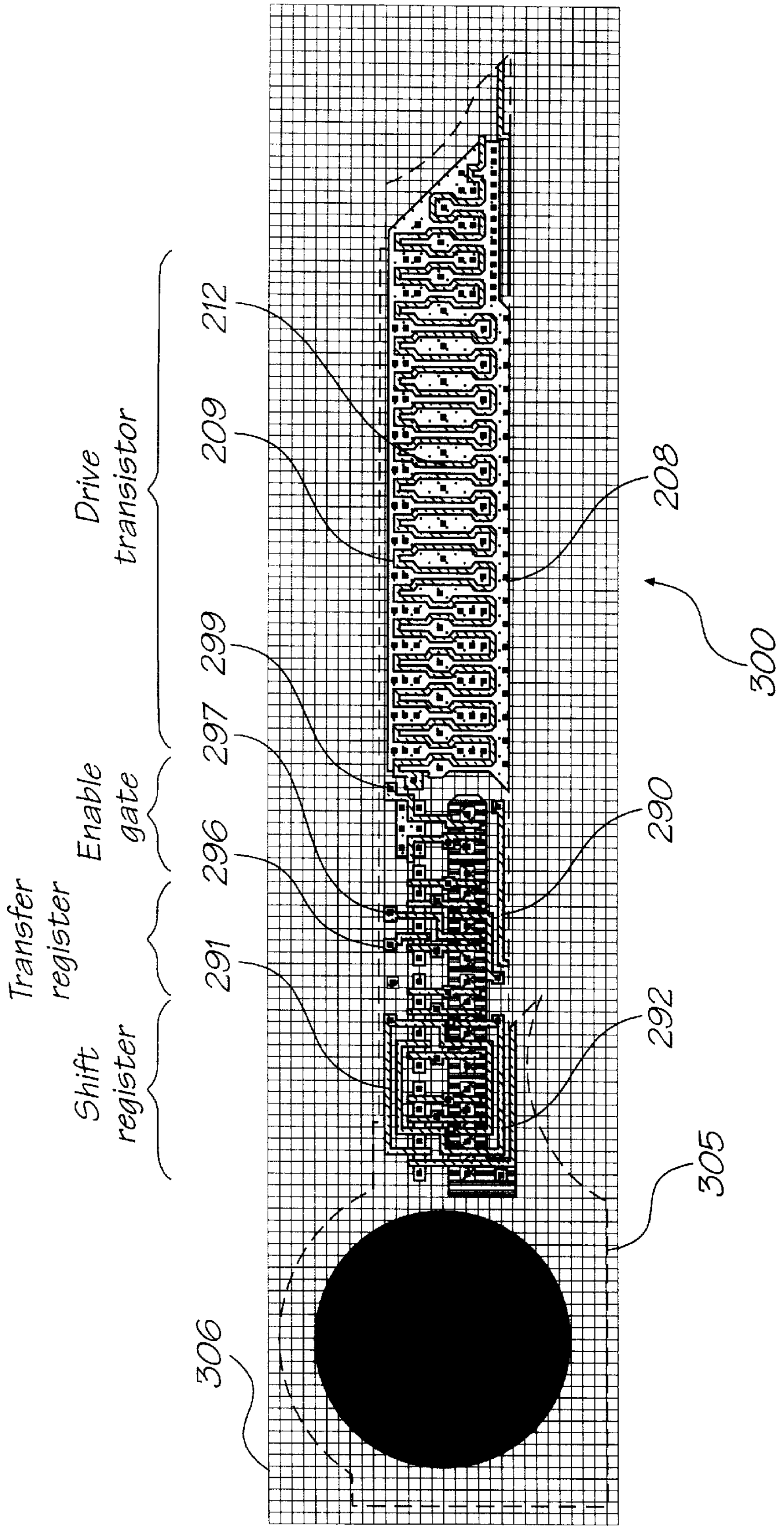
FIG. 79 illustrates the CMOS levels up to the poly level.

FIG. 79 illustrates a unit cell 305 on a 1 micron grid 306. The unit cell 305 is copied and replicated a large number of times with FIG. 79 illustrating the diffusion and poly-layers in addition to vias e.g. 308. The signals 290, 291, 292, 296, 297 and 299 are as previously discussed with reference to FIG. 77. A number of important aspects of FIG. 79 include the general layout including the shift register, transfer register and gate and drive transistor. Importantly, the drive transistor 300 includes an upper poly-layer e.g. 309 which is laid out having a large number of perpendicular traces e.g. 312. The perpendicular traces are important in ensuring that the corrugated nature of a heater element formed over the power transistor 300 will have a corrugated bottom with corrugations running generally in the perpendicular direction of trace 112. This is best shown in FIGS. 69, 71 and 74. Consideration of the nature and directions of the corrugations, which arise unavoidably due to the CMOS wiring underneath, is important to the ultimate operational efficiency of the actuator. In the ideal situation, the actuator is formed without corrugations by including a planarization step on the upper surface of the substrate step prior to forming the actuator. However, the best compromise that obviates the additional process step is to ensure that the corrugations extend in a direction that is transverse to the bending axis of the actuator as illustrated in the examples, and preferably constant along its length. This results in an actuator that may only be 2% less efficient than a flat actuator, which in many situations will be an acceptable result. By contrast, corrugations that extend longitudinally would reduce the efficiency by about 20% compared to a flat actuator.

Figure 80:
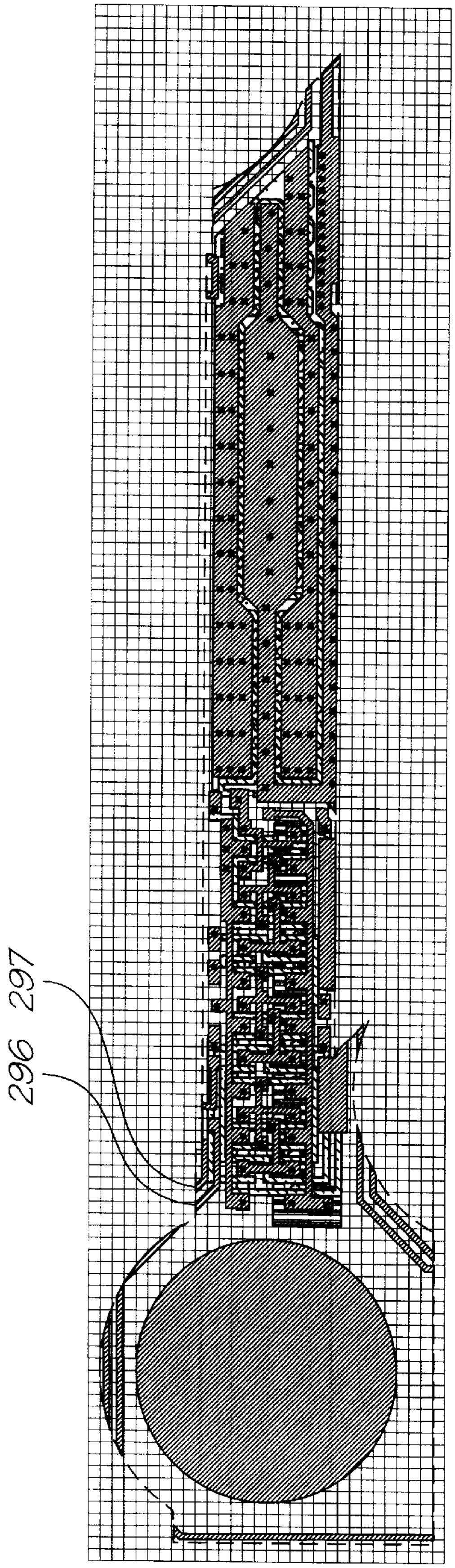
FIG. 80 illustrates the CMOS levels up to the metal 1 level.

In FIG. 80, there is illustrated the addition of the first level metal layer which includes enable lines 296, 297.

Figure 81:
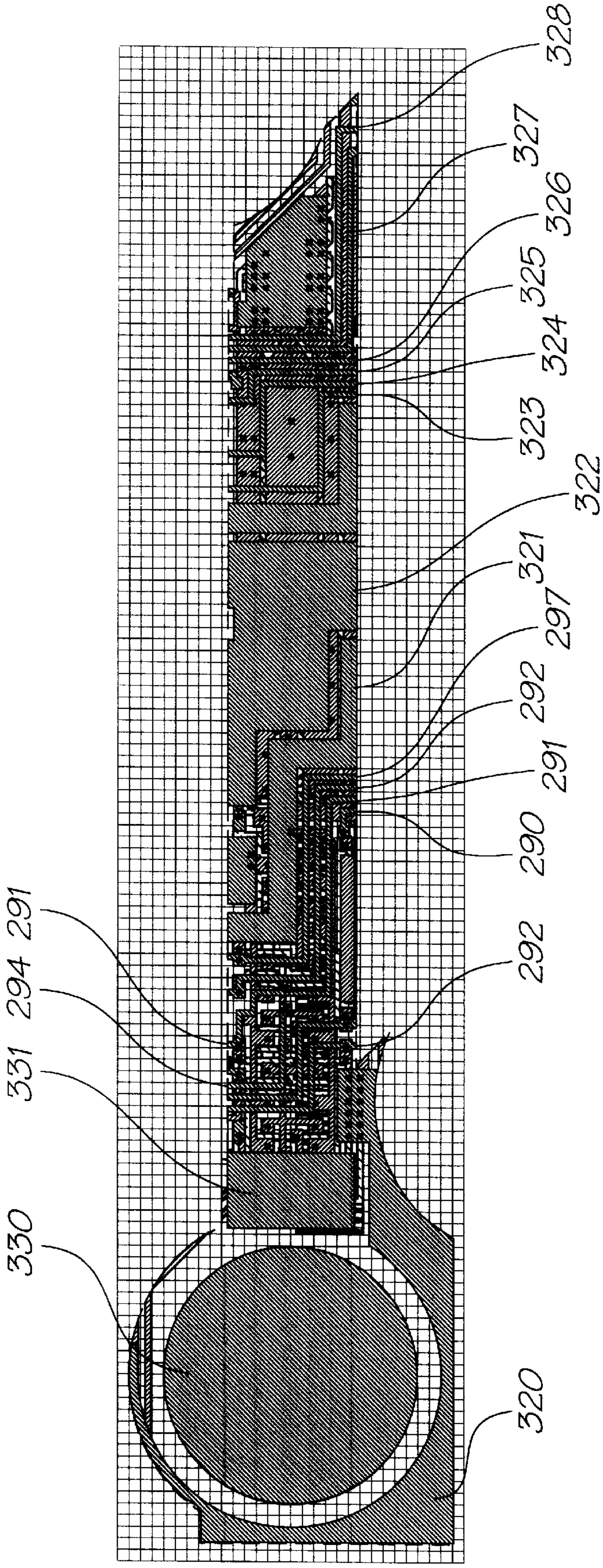
FIG. 81 illustrates the CMOS levels up to the metal 2 level.

In FIG. 81, there is illustrated the second level metal layer which includes data in-line 290, SClock line 91, SClock 292, Q 294, TEn 296 and TEn 297, V-320, $V_{DD}$ 321, $V_{SS}$ 322, in addition to associated reflected components 323 to 328. The portions 330 and 331 are utilized as a sacrificial etch.

Figure 82:
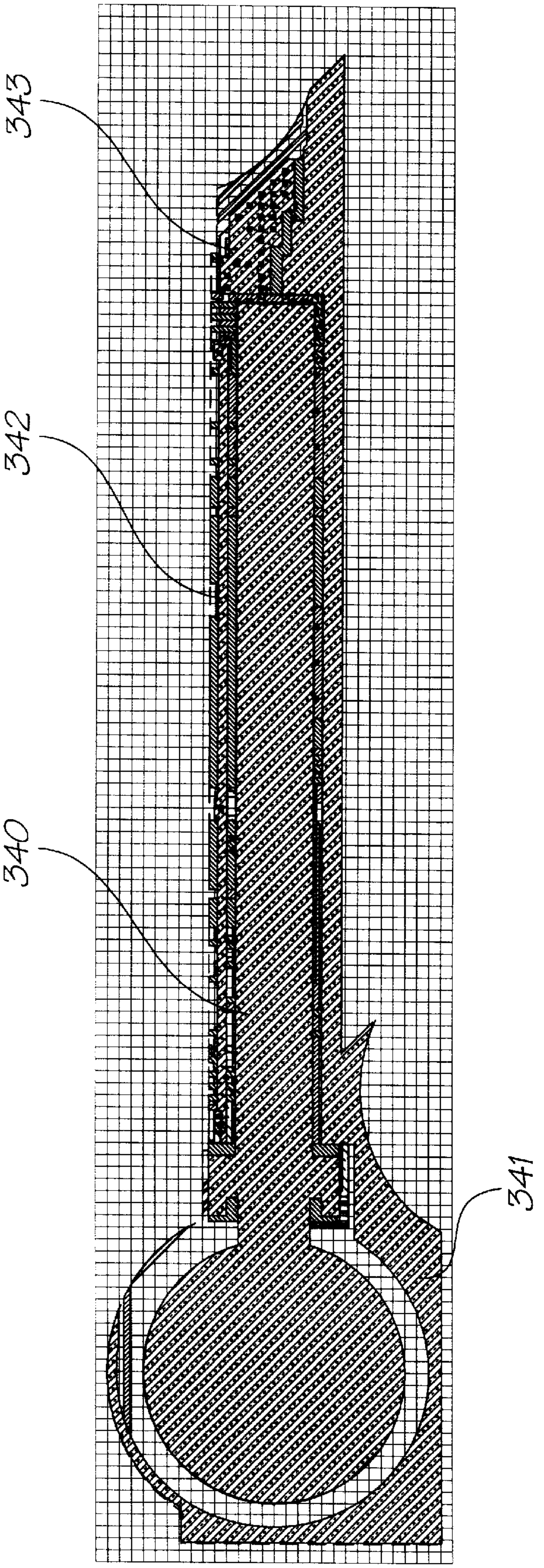
FIG. 82 illustrates the CMOS levels up to the metal 3 level.

Turning now to FIG. 82 there is illustrated the third level metal layer which includes a portion 340 which is utilized as a sacrificial etch layer underneath the heater actuator. The portion 341 is utilized as part of the actuator structure with the portions 342 and 343 providing electrical interconnections.

Figure 83:
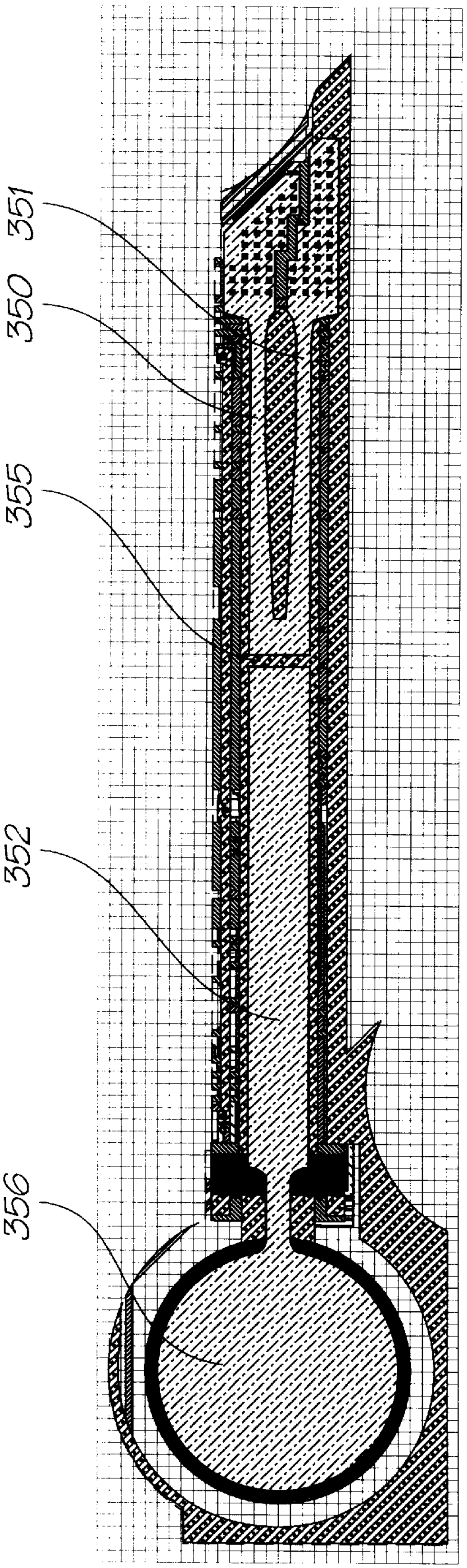
FIG. 83 illustrates the CMOS and MEMS levels up to a MEMS heater level.

Turning now to FIG. 83, there is illustrated the planar conductive heating circuit layer including heater arms 350 and 351 which are interconnected to the lower layers. The heater arms are formed on either side of a tapered slot so that they are narrower toward the fixed or proximal end of the actuator arm, giving increased resistance and therefore heating and expansion in that region. The second portion of the heating circuit layer 352 is electrically isolated from the arms 350 and 351 by a discontinuity 355 and provides for structural support for the main paddle 356. The discontinuity may take any suitable form but is typically a narrow slot as shown at 355.

Figure 84:
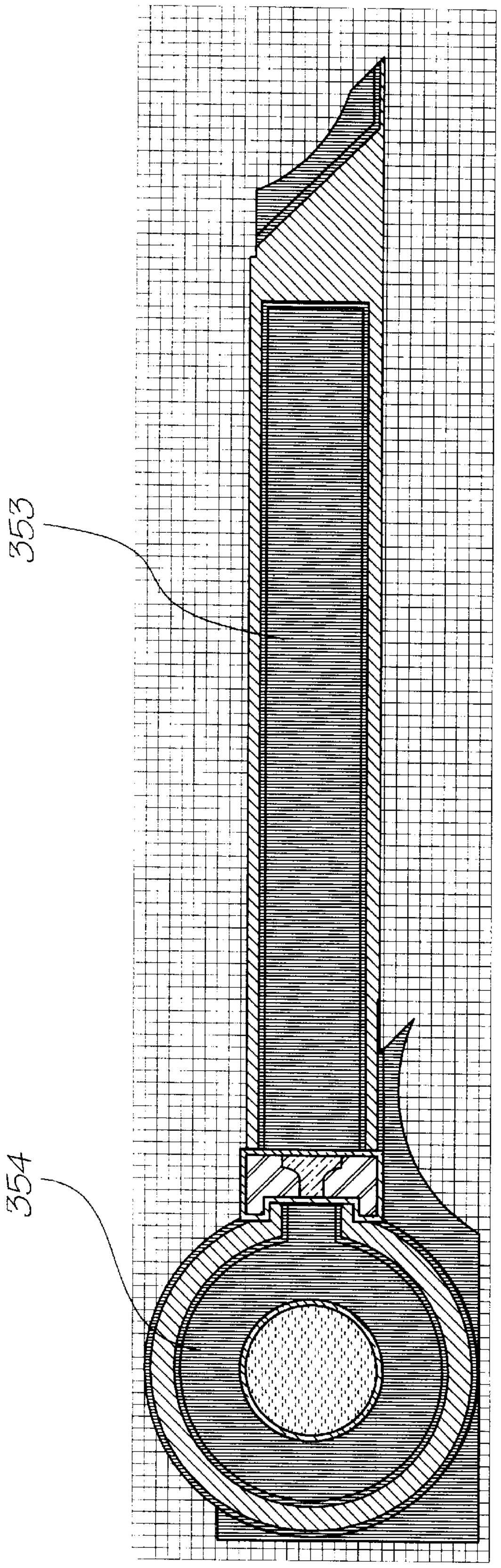
FIG. 84 illustrates an Actuator Shroud Level.

In FIG. 84 there is illustrated the portions of the shroud and nozzle layer including shroud 353 and outer nozzle chamber 354.

Figure 85:
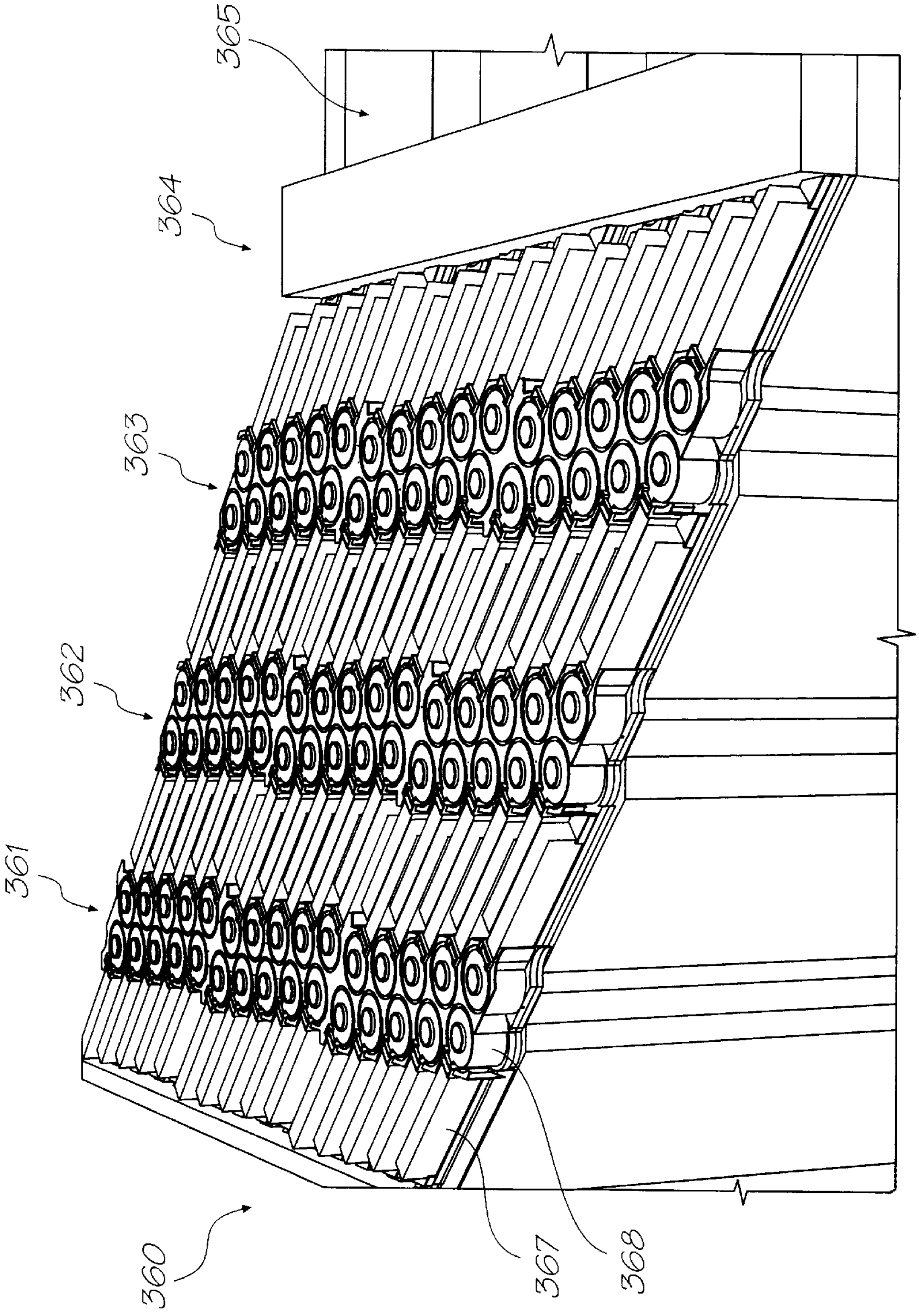
FIG. 85 illustrates a side perspective and partly sectional view of a portion of an ink jet print head.
Figure 86:
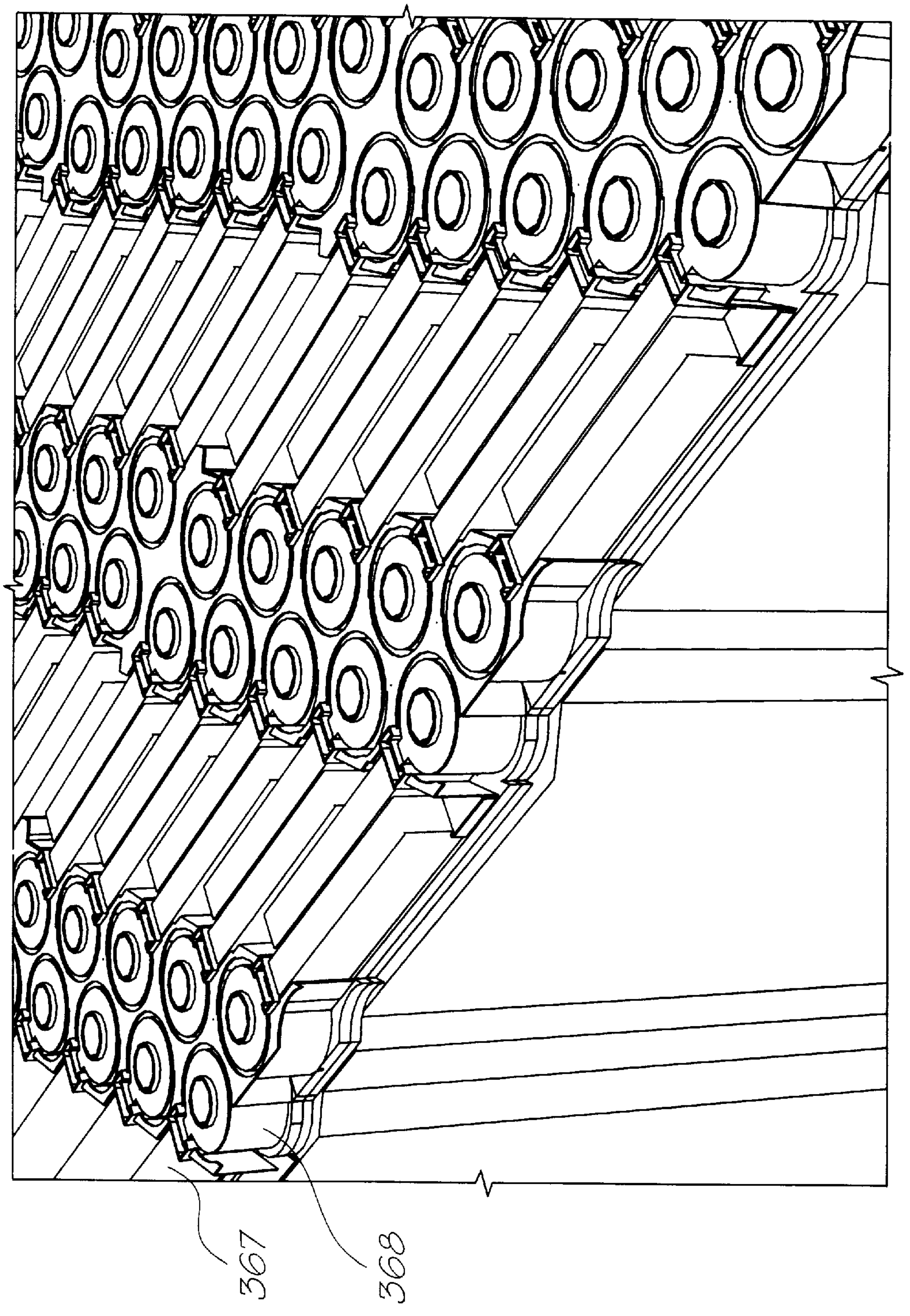
FIG. 86 illustrates an enlarged side perspective and partly sectional view of a portion of an ink jet print head.

Turning to FIG. 85, there is illustrated a portion 360 of a array of ink ejection nozzles which are divided into three groups 361–363 with each group providing separate color output (cyan, magenta and yellow) so as to provide full three color printing. A series of standard cell clock buffers and address decoders 364 is also provided in addition to bond pads 365 for interconnection with the external circuitry.

Each color group 361, 363 consists of two spaced apart rows of ink ejection nozzles e.g. 367 each having a heater actuator element.

Figure 87:
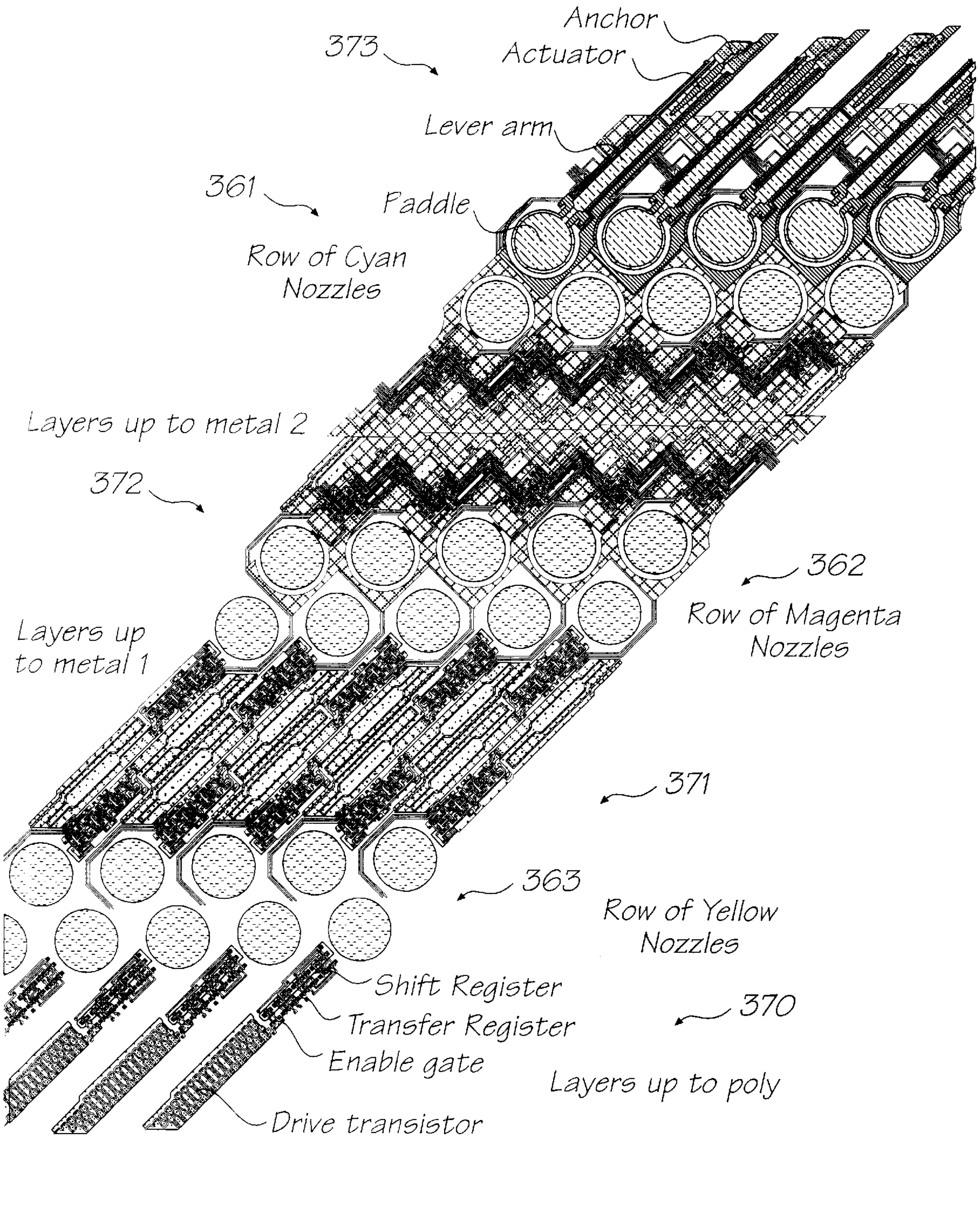
FIG. 87 illustrates a number of layers formed in the construction of a series of actuators.

FIG. 87 illustrates one form of overall layout in a cut away manner with a first area 370 illustrating the layers up to the polysilicon level. A second area 371 illustrates the layers up to the first level metal, the area 372 illustrates the layers up to the second level metal and the area 373 illustrates the layers up to the heater actuator layer.

Figure 88:
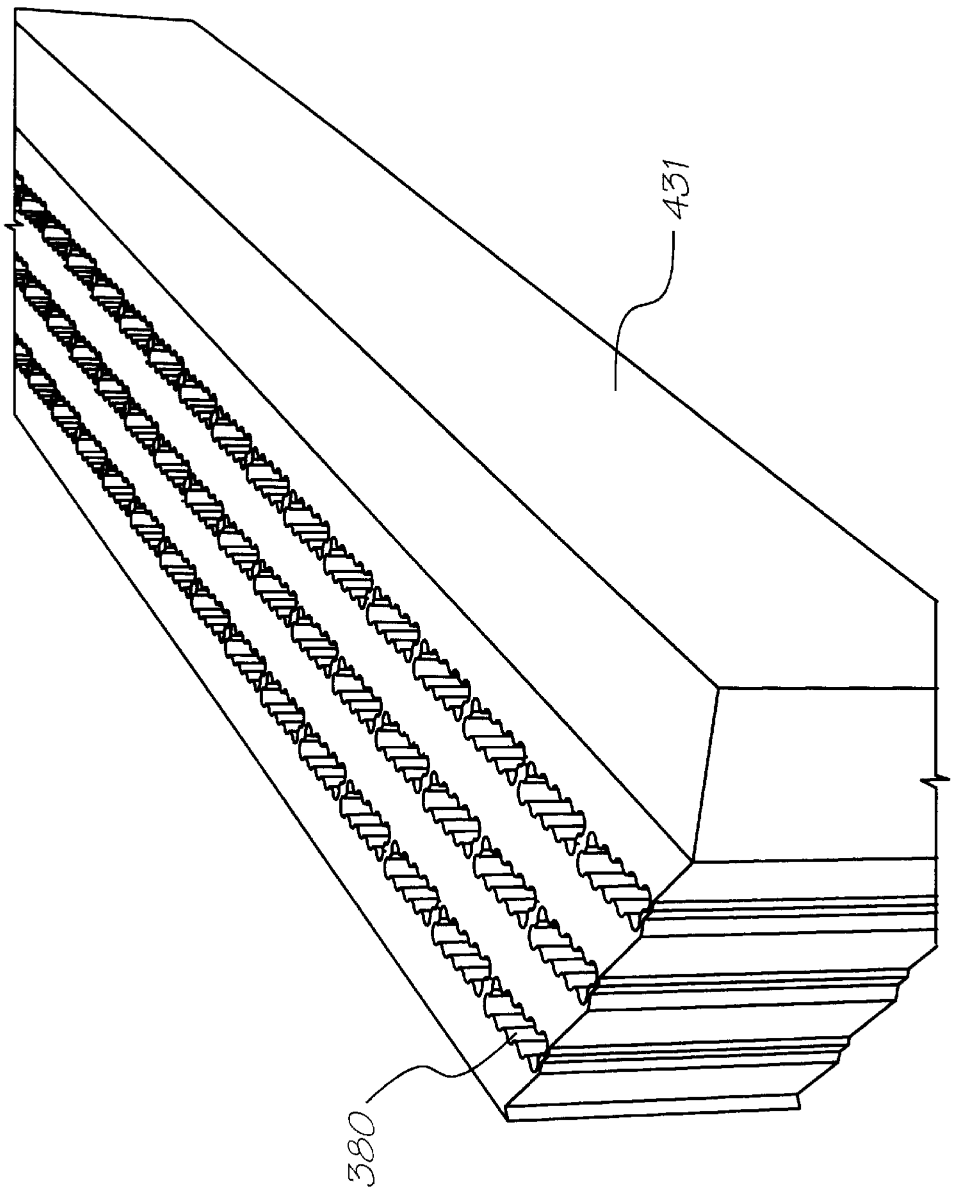
FIG. 88 illustrates a portion of a back surface of a wafer showing the through wafer ink supply channels.
Figure 89:
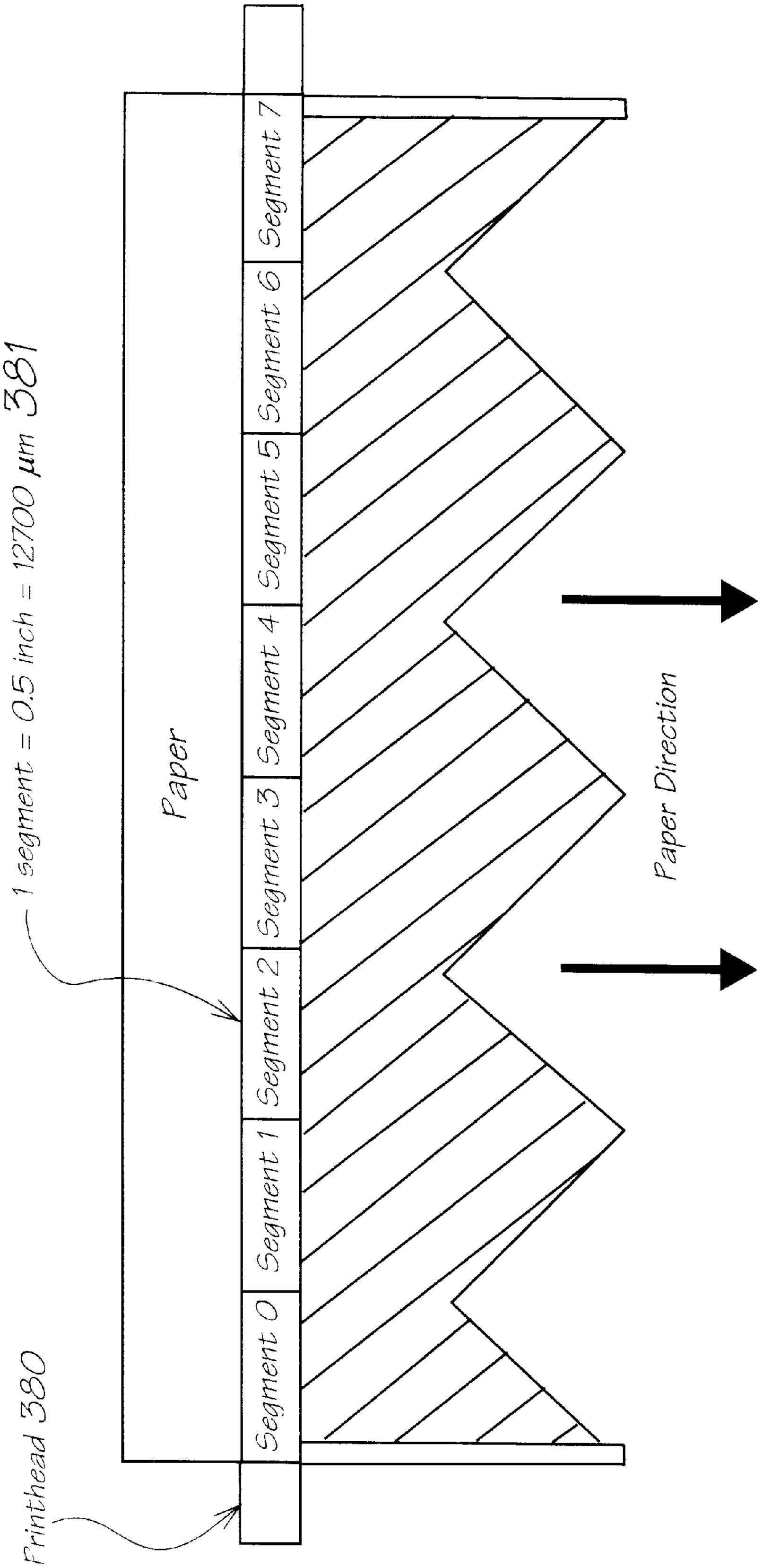
FIG. 89 illustrates an arrangement of segments in a print head.
Figure 90:
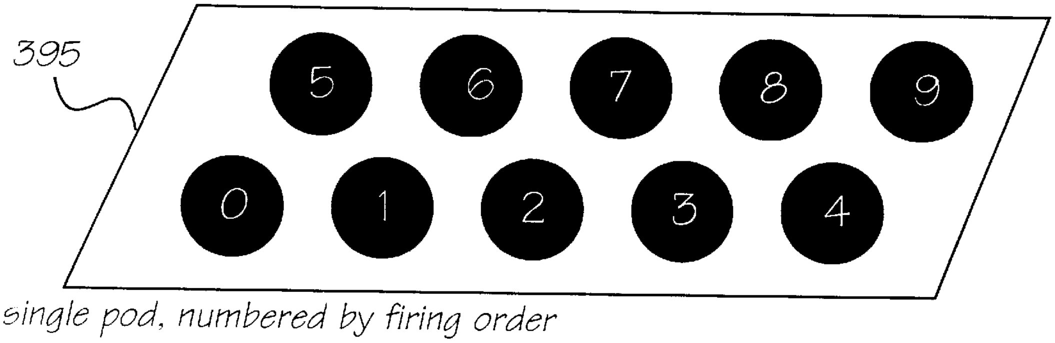
FIG. 90 illustrates schematically a single pod numbered by firing order.
Figure 91:
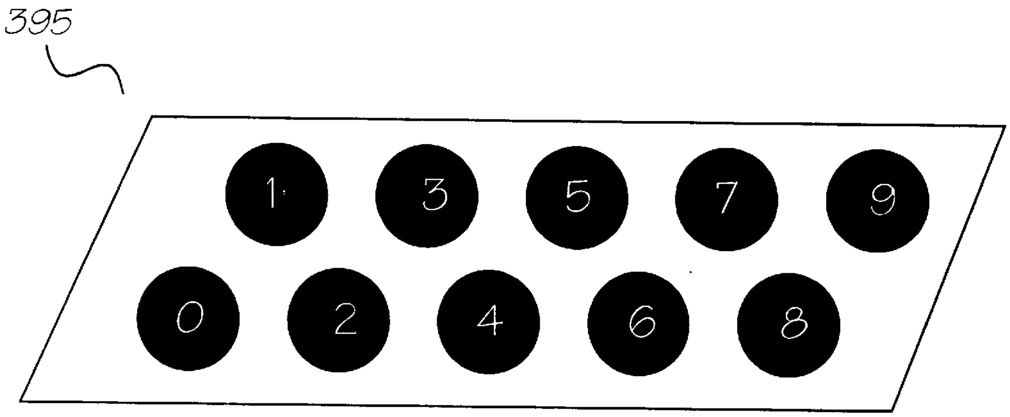
FIG. 91 illustrates schematically a single pod numbered by logical order.
Figure 93:
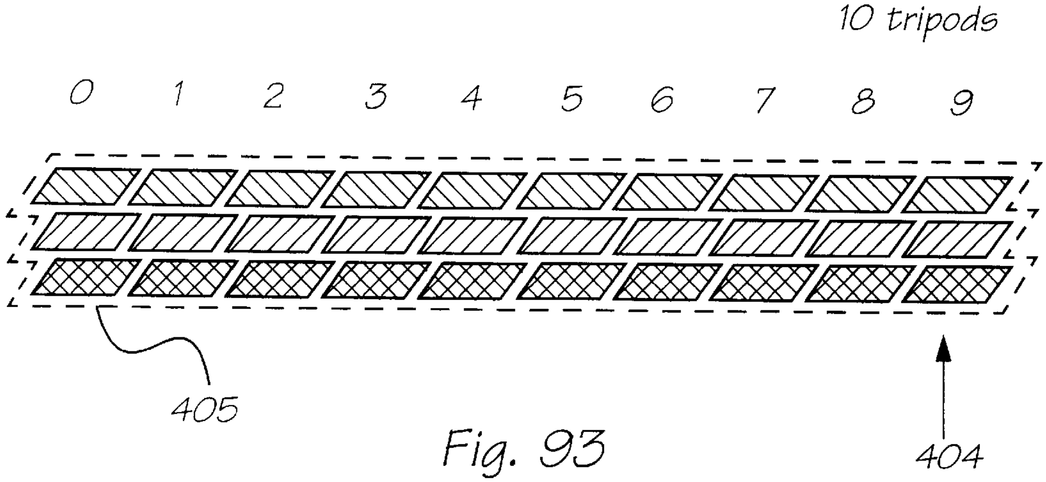
FIG. 93 illustrates schematically a single podgroup containing 10 tripods.
Figure 92:
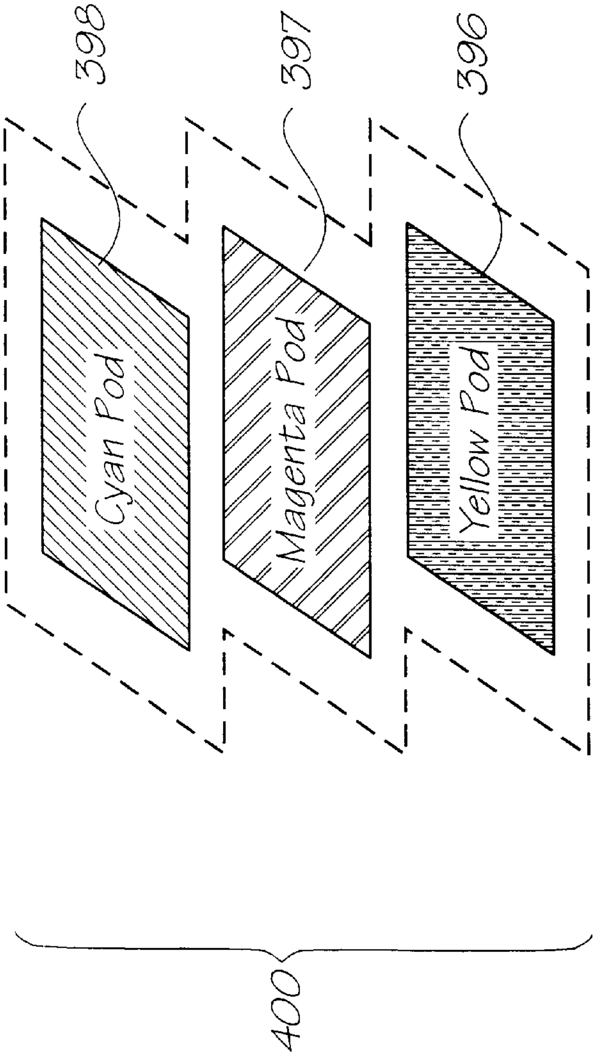
FIG. 92 illustrates schematically a single tripod containing one pod of each color.
Figure 94:
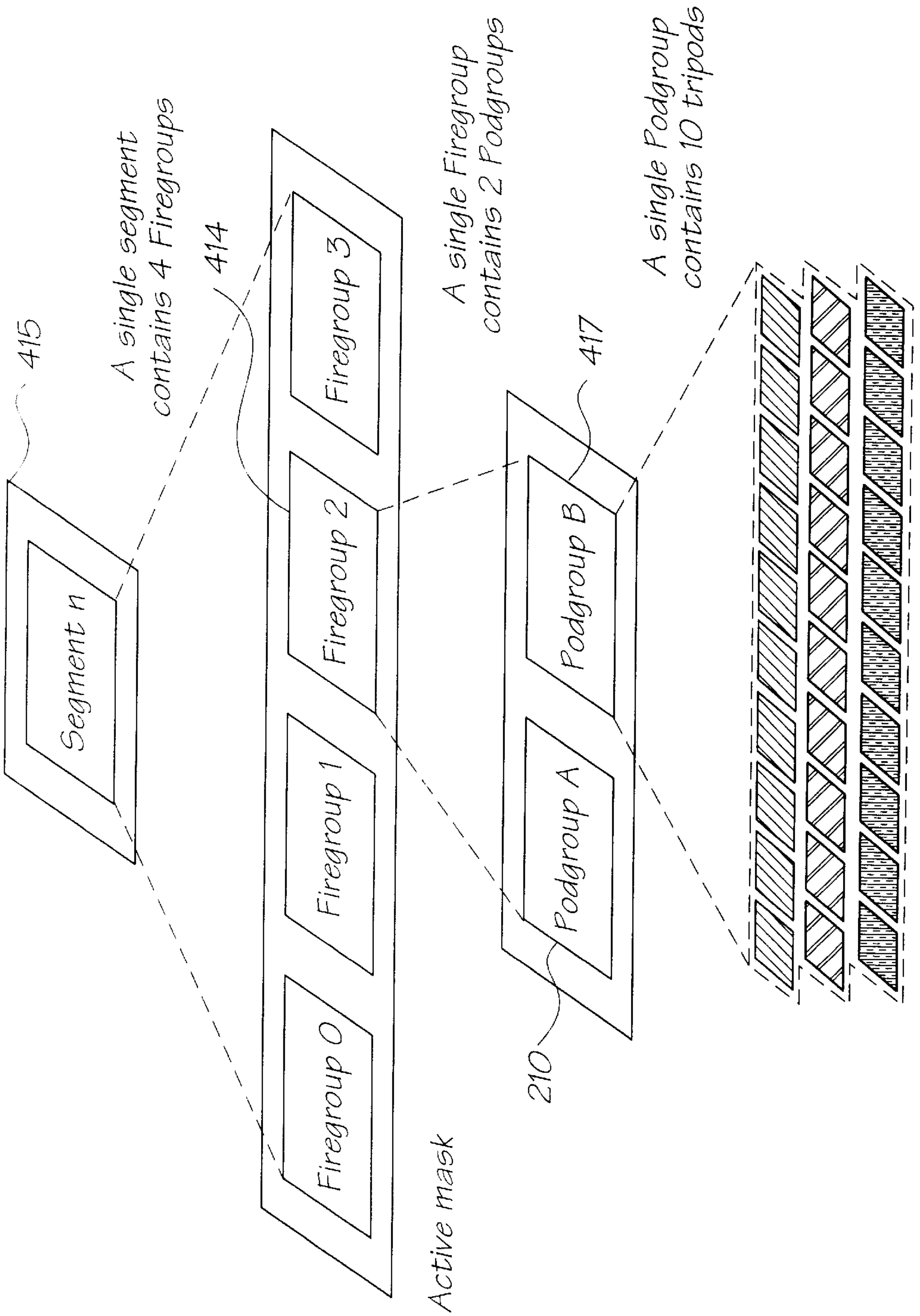
FIG. 94 illustrates schematically, the relationship between segments, firegroups and tripods.
Figure 95:
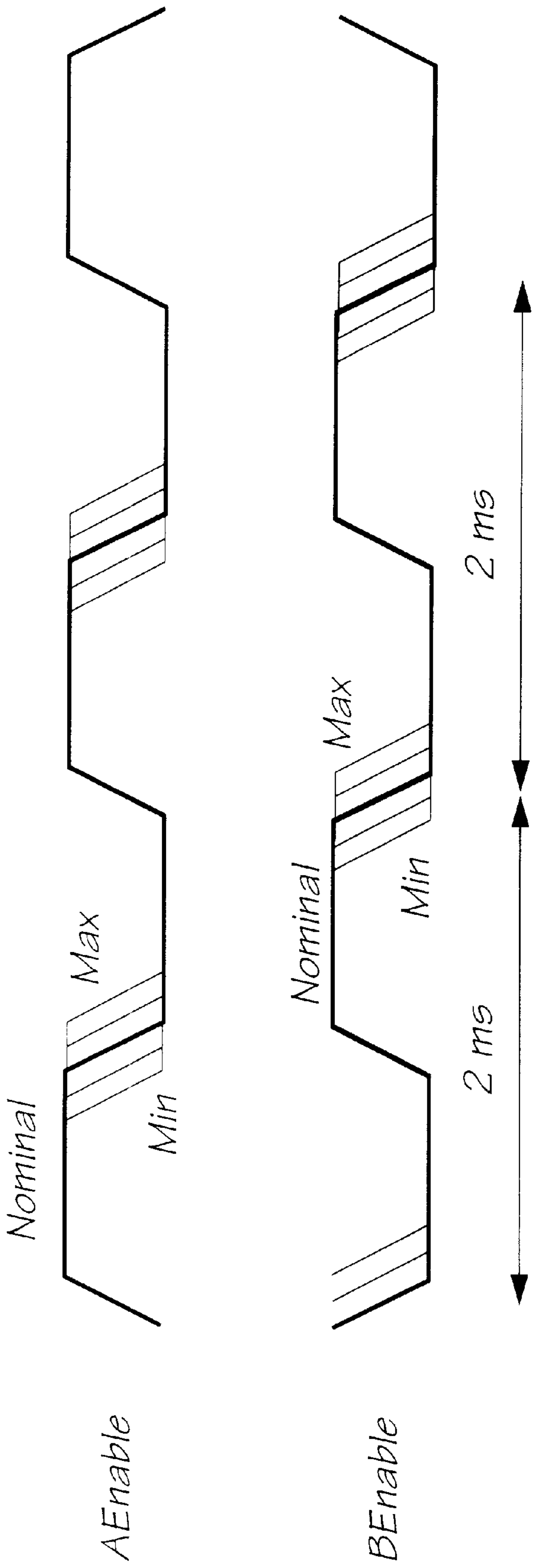
FIG. 95 illustrates clocking for AEnable and BEnable during a typical print cycle.
Figure 96:
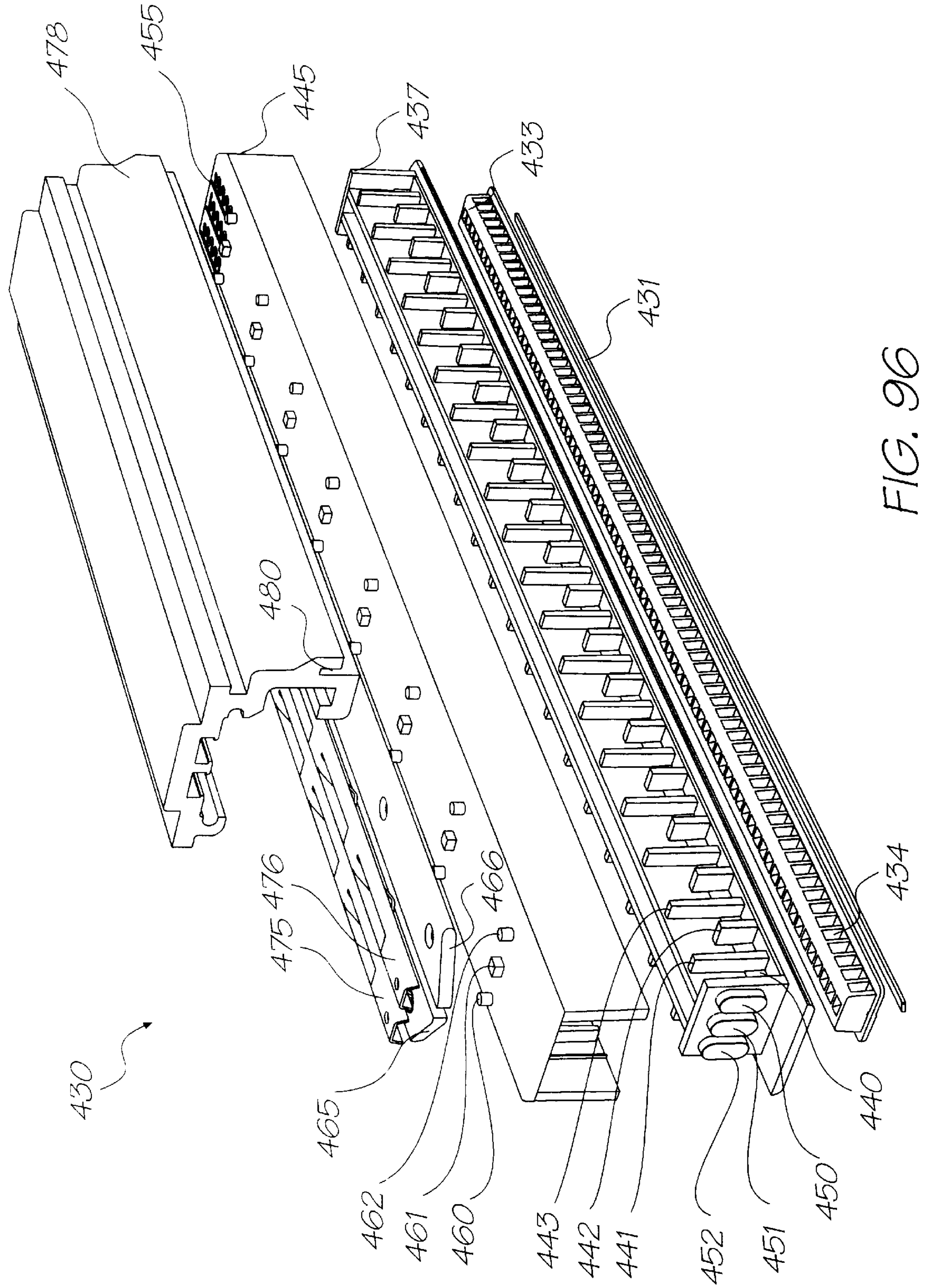
FIG. 96 illustrates an exploded perspective view showing the incorporation of a print head into an ink channel molding support structure.
Figure 97:
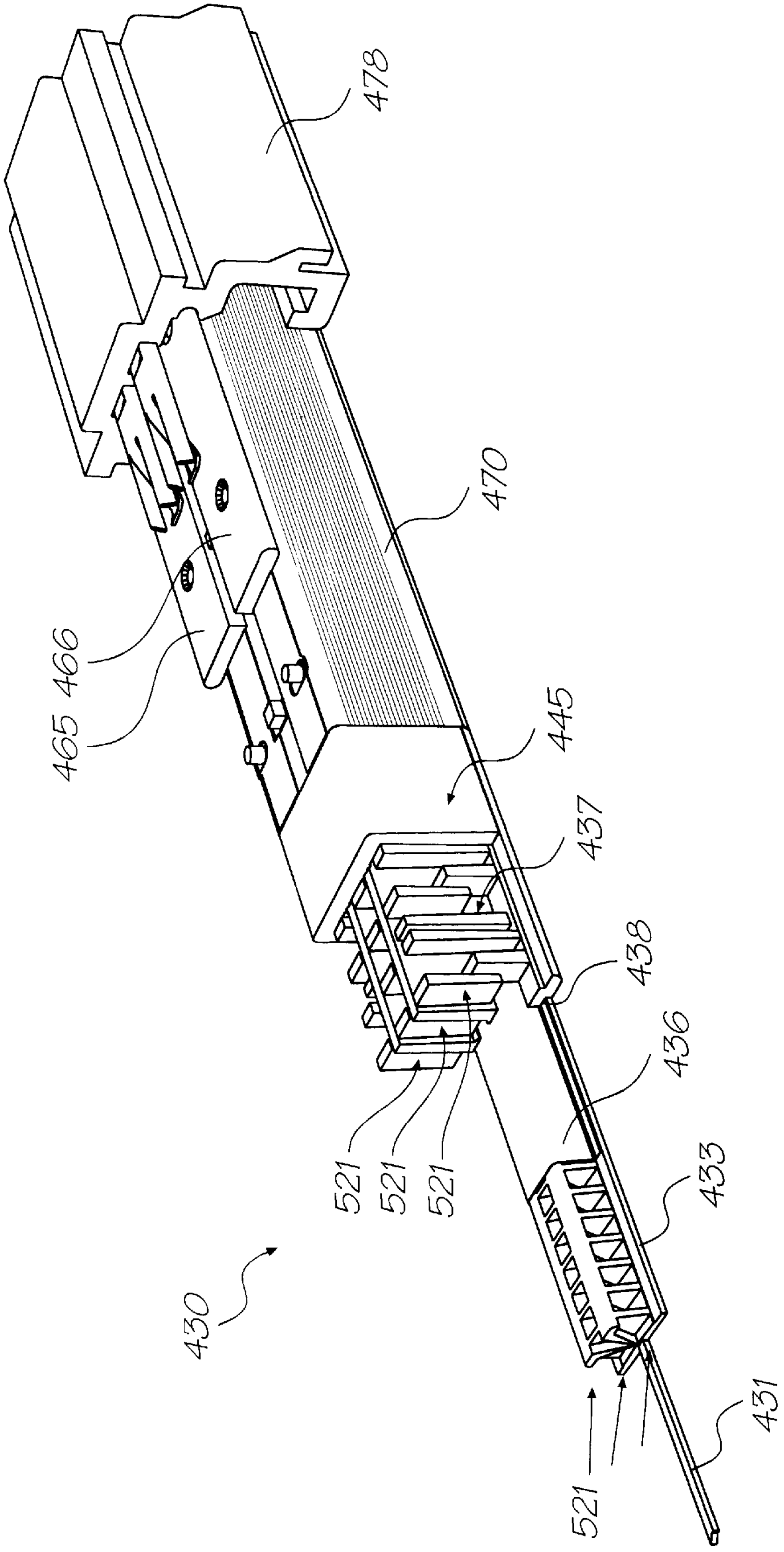
FIG. 97 illustrates a side perspective view partly in section of the ink channel molding support structure.
Figure 98:
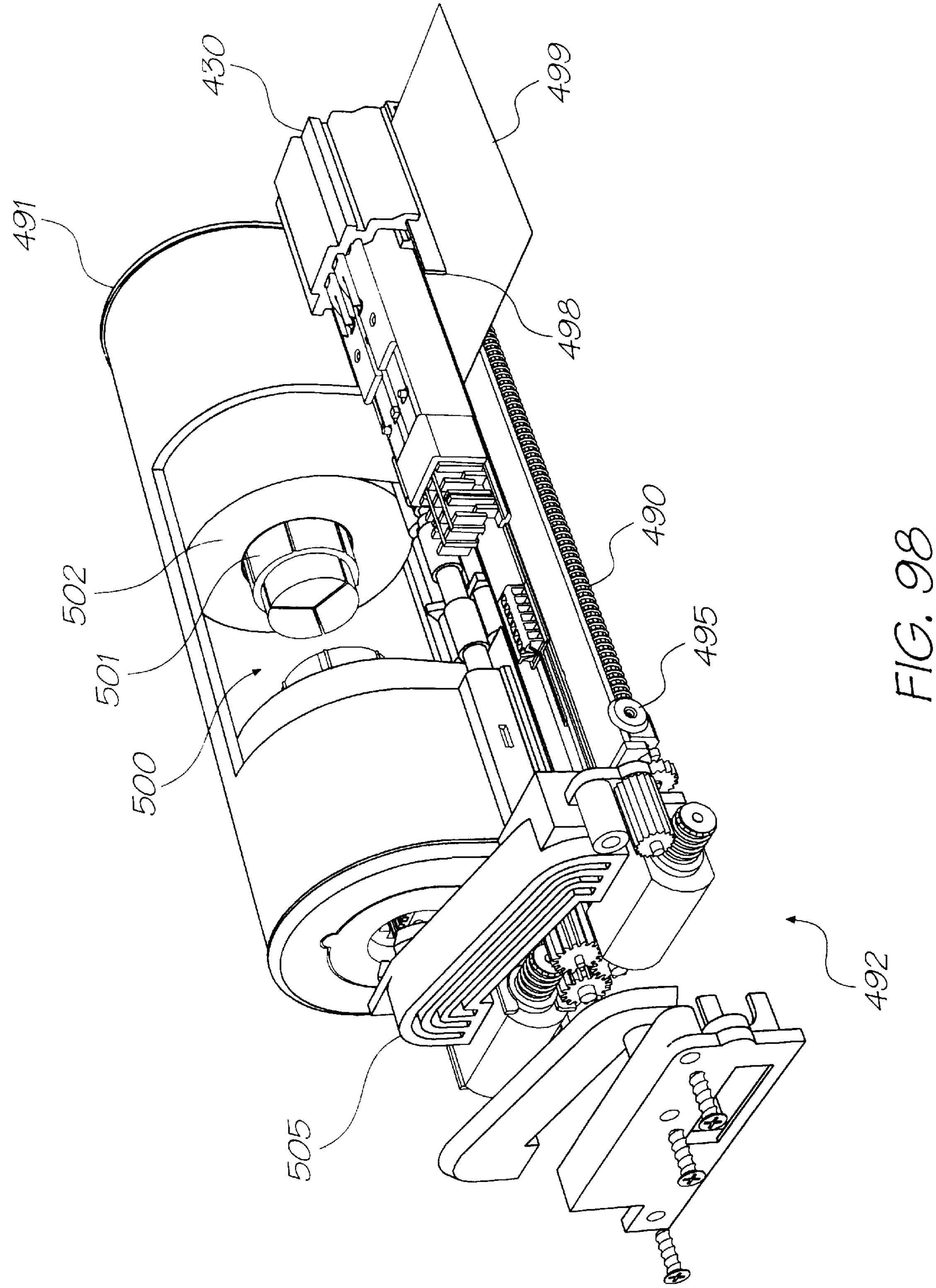
FIG. 98 illustrates a side perspective view partly in section of a print roll unit, print head and platen.
Figure 99:
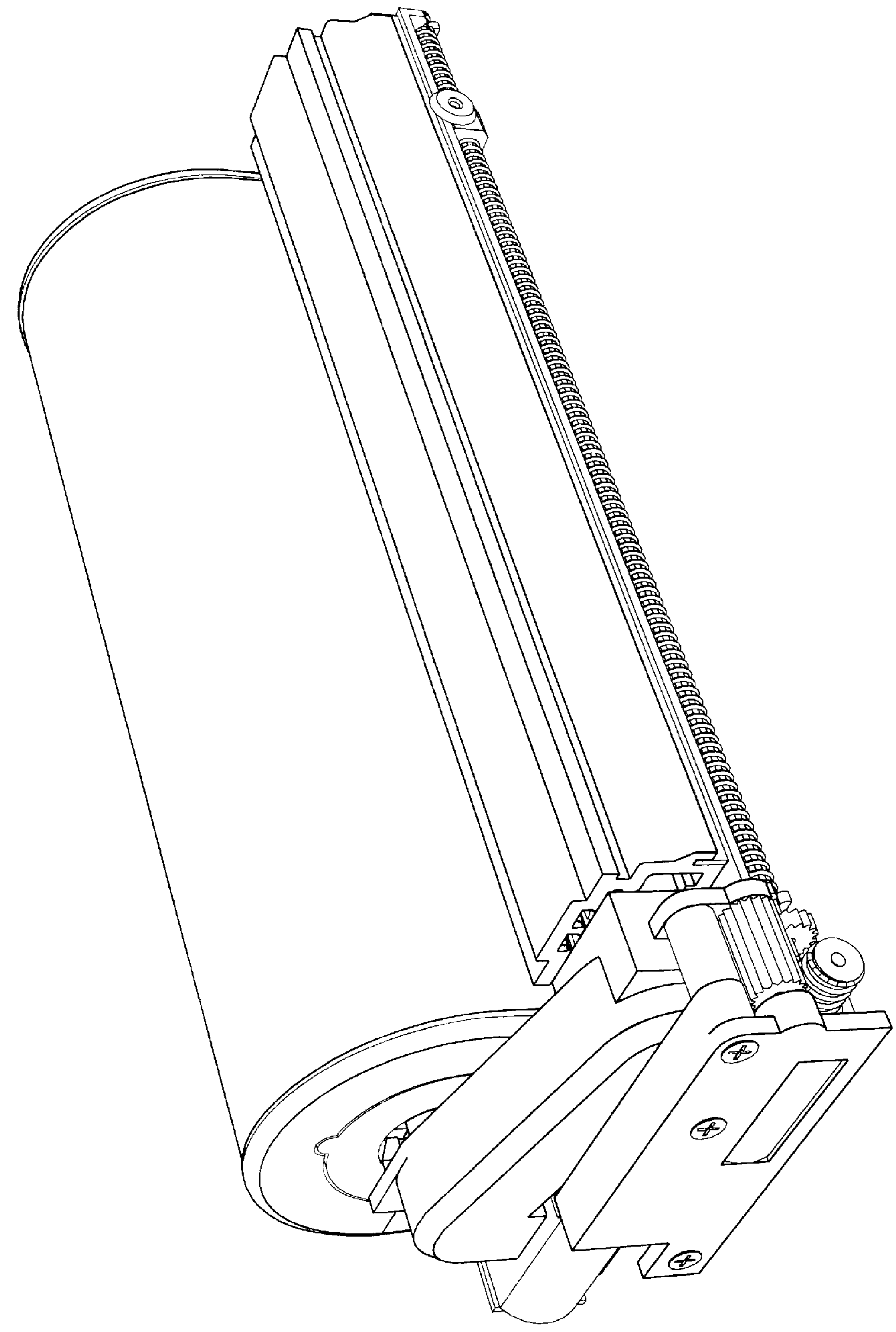
FIG. 99 illustrates a side perspective view of a print roll unit, print head and platen.
Figure 100:
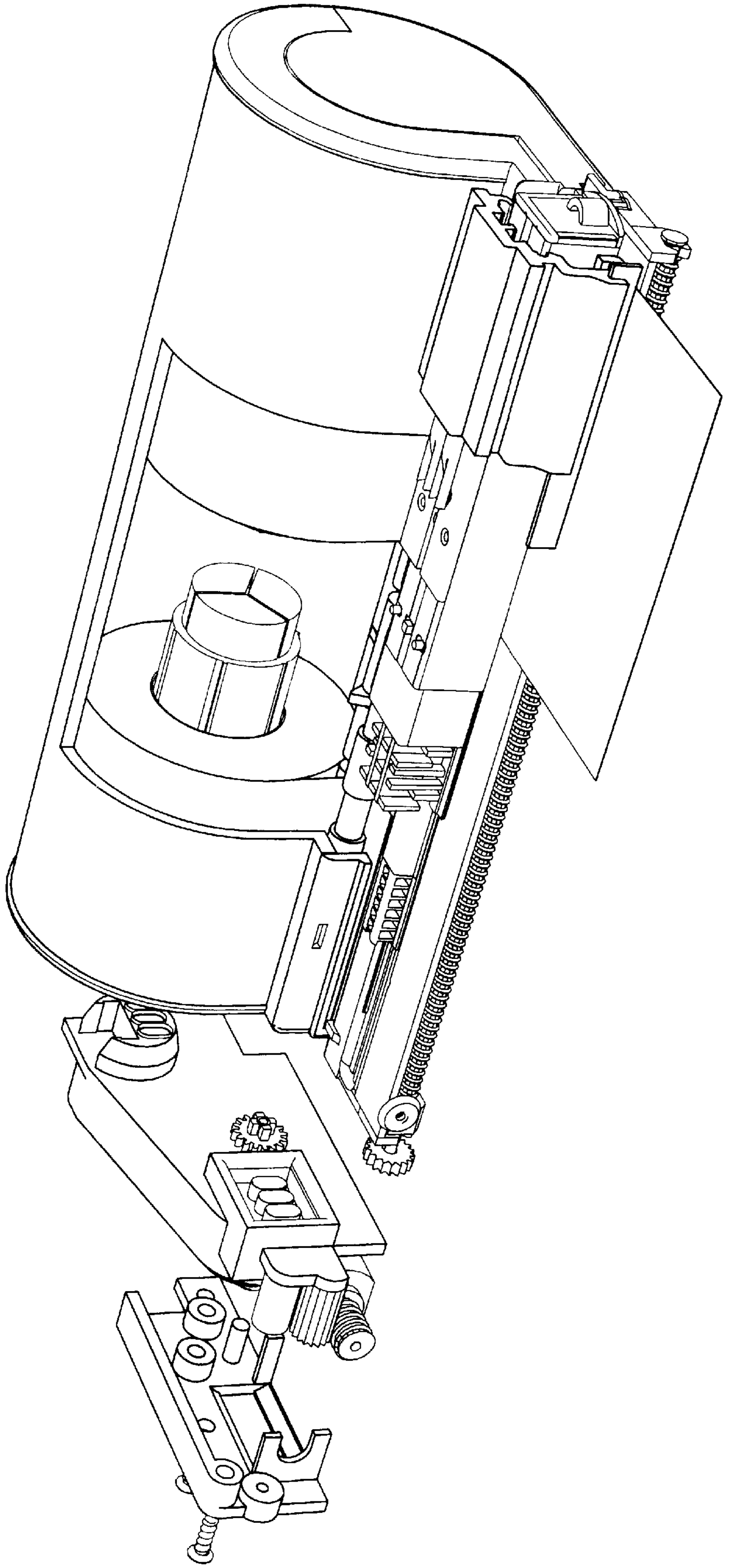
FIG. 100 illustrates a side exploded perspective view of a print roll unit, print head and platen.
Figure 101:
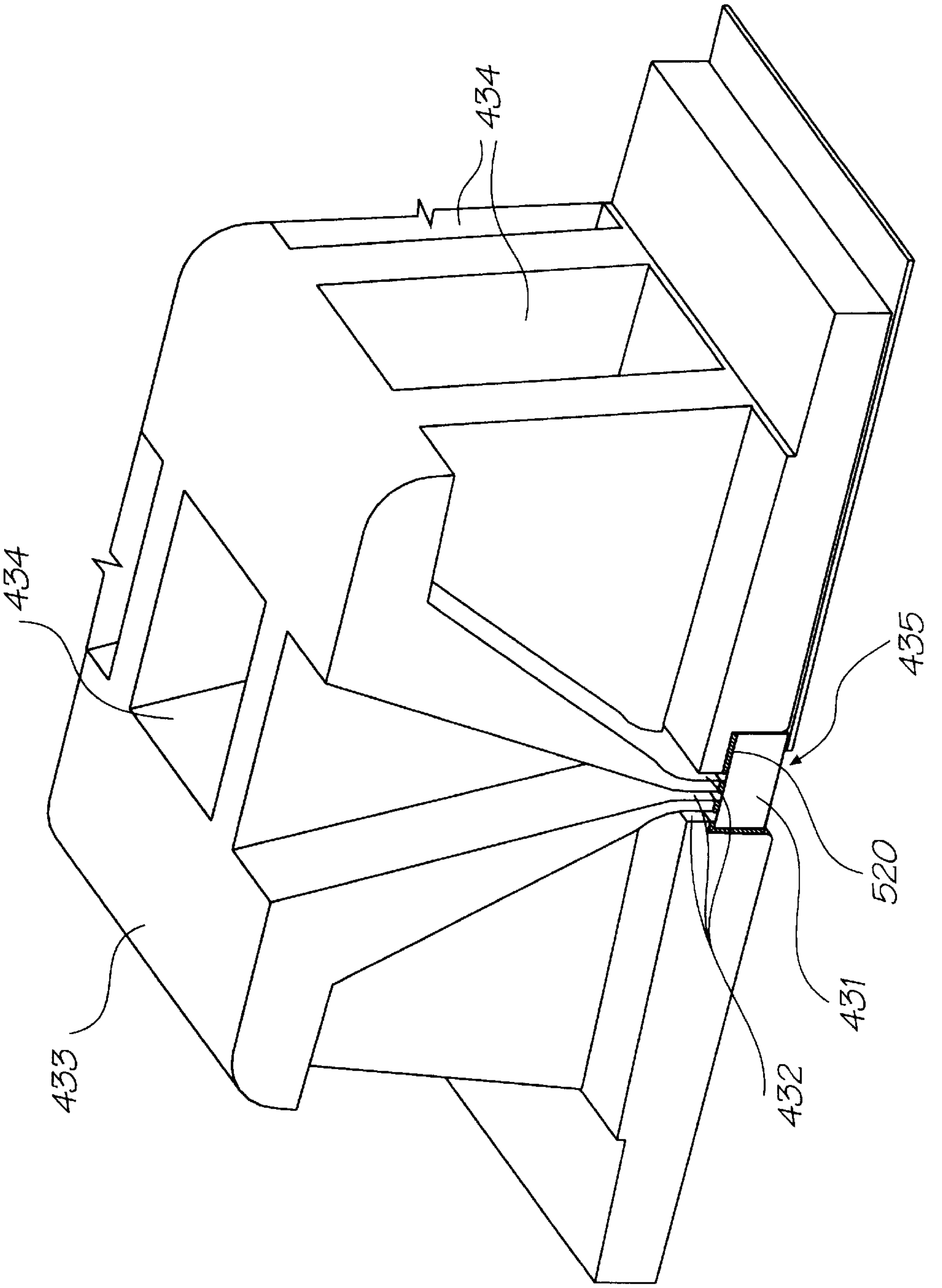
FIG. 101 is an enlarged perspective part view illustrating the attachment of a print head to an ink distribution manifold as shown in FIGS. 96 and 97.
Figure 102:
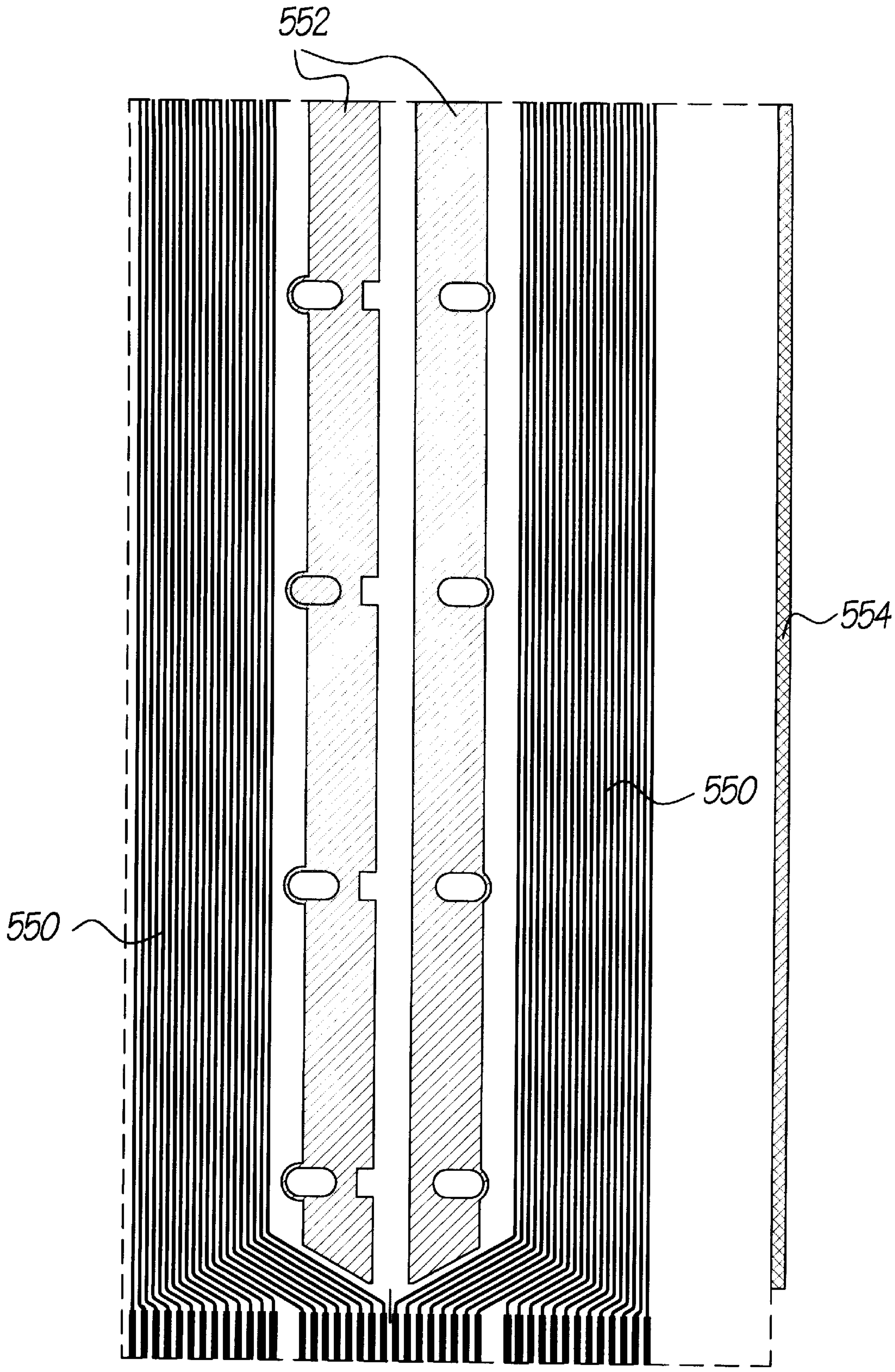
FIG. 102 illustrates an opened out plan view of the outermost side of the tape automated bonded film shown in FIG. 97.
Figure 103:
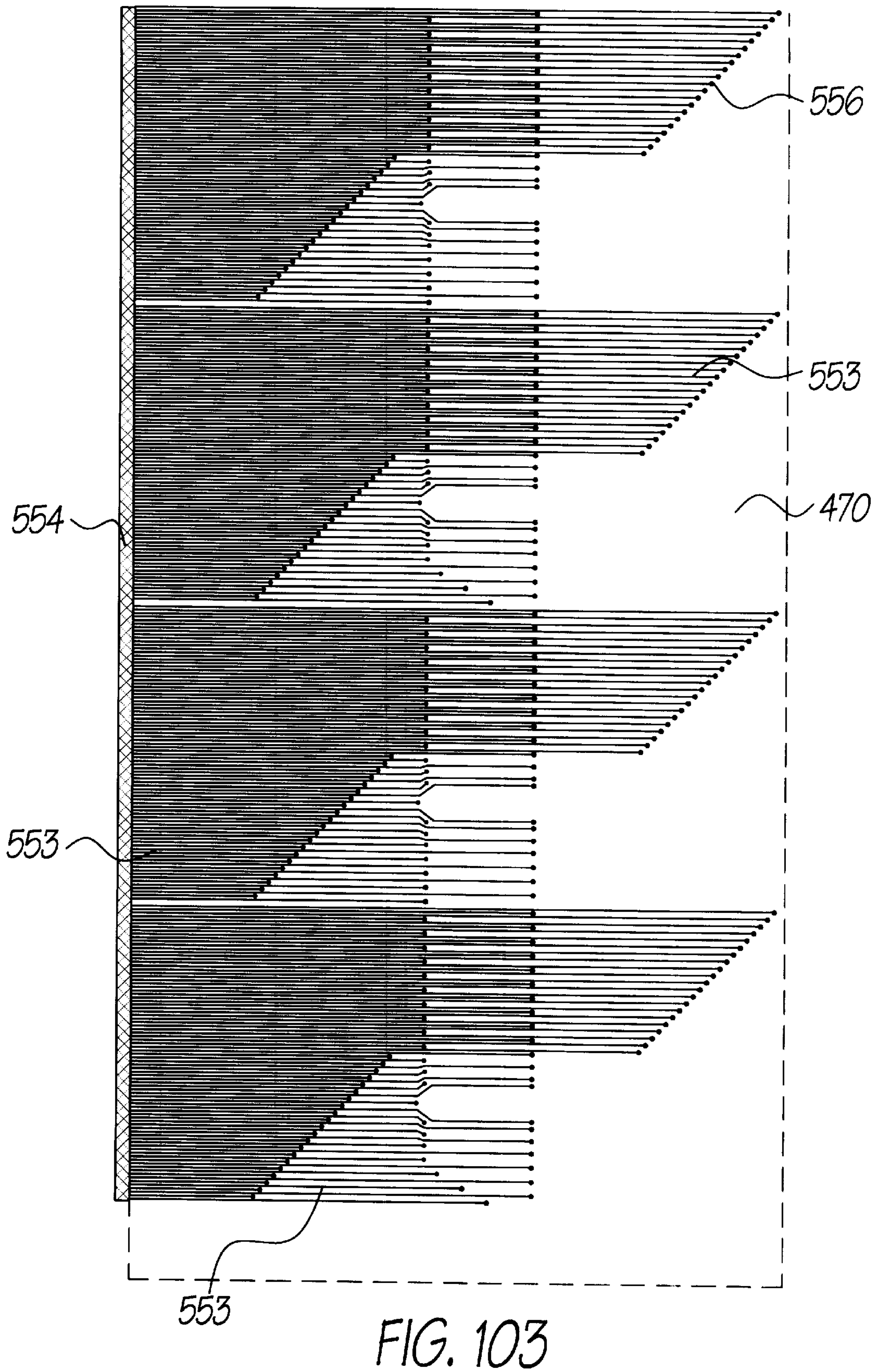
FIG. 103 illustrates the reverse side of the opened out tape automated bonded film shown in FIG. 102.

The ink ejection nozzles are grouped in two groups of 10 nozzles sharing a common ink channel through the wafer. Turning to FIG. 88, there is illustrated the back surface of the wafer which includes a series of ink supply channels 380 for supplying ink to a front surface.

Replication

The unit cell is replicated 19,200 times on the 4" print head, in the hierarchy as shown in the replication hierarchy table below. The layout grid is ½ 1 at 0.5 micron (0.125 micron). Many of the ideal transform distances fall exactly on a grid point. Where they do not, the distance is rounded to the nearest grid point. The rounded numbers are shown with an asterisk. The transforms are measured from the center of the corresponding nozzles in all cases. The transform of a group of five even nozzles into five odd nozzles also involves a 180° rotation. The translation for this step occurs from a position where all five pairs of nozzle centers are coincident.

I claim:

1. A method of fabricating an inkjet printhead, said method including the steps of:

fabricating electrical drive circuitry with layers of conductive, semi-conductive and non-conductive materials; and forming a plurality of nozzle chambers on the layers of conductive, semi-conductive and non-conductive materials by the deposition and subsequent etching of a suitable integrated circuit fabrication material so that each nozzle chamber has an ink ejection aperture in a wall thereof;

wherein the method includes the steps of forming moveable actuators on the layers of conductive, semi-conductive and non-conductive materials so that each moveable actuator is operatively positioned with respect to one nozzle chamber and utilizing portions of at least one of the layers of conductive, semi-conductive and non-conductive materials as a sacrificial material and removing said portions to release each moveable actuator.

2. A method as claimed in claim 1 wherein the step of forming the moveable actuators includes the step of forming a moveable ink ejection paddle within each nozzle chamber.

3. A method as claimed in claim 1 wherein said step of utilizing portions of the conductive layer as said sacrificial material comprises the step of utilizing a CMOS metal layer.

4. A method as claimed in claim 2 wherein the step of forming said movable actuators includes the step of forming thermal actuators.

5. A method as claimed in claim 2 wherein said actuator is formed to be located external to said nozzle chamber and to be interconnected to said ink ejection paddle through an actuation interconnection aperture formed in a second wall of said nozzle chamber.

6. A method of fabricating an ink jet printhead, the method including the steps of:

carrying out an integrated circuit fabrication technique on a silicon wafer to form layers that define a drive circuitry component and sacrificial material with at least one layer that defines both part of the drive circuitry component and the sacrificial material;

fabricating a plurality of moveable actuators on the drive circuitry component and the sacrificial material;

forming a plurality of nozzle chambers on the layers by depositing and subsequently etching an integrated circuit fabrication material so that each actuator corresponds with a respective nozzle chamber; and releasing each moveable actuator by etching away the sacrificial material.

* * * * *